United States Patent
Oota et al.

(10) Patent No.: US 10,908,335 B2
(45) Date of Patent: Feb. 2, 2021

(54) FILM, FILM FORMING METHOD, SOLID IMAGE PICKUP ELEMENT, AND INFRARED SENSOR

(71) Applicant: FUJIFILM Corporation, Tokyo (JP)

(72) Inventors: Kazuya Oota, Haibara-gun (JP); Kyohei Arayama, Haibara-gun (JP); Masahiro Mori, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 312 days.

(21) Appl. No.: 15/785,925

(22) Filed: Oct. 17, 2017

(65) Prior Publication Data
US 2018/0039171 A1 Feb. 8, 2018

Related U.S. Application Data

(63) Continuation of application No. PCT/JP2016/060885, filed on Apr. 1, 2016.

(30) Foreign Application Priority Data

May 1, 2015 (JP) .................................. 2015-094218

(51) Int. Cl.
 *G02B 5/22* (2006.01)
(52) U.S. Cl.
 CPC ............... *G02B 5/223* (2013.01); *G02B 5/22* (2013.01)
(58) Field of Classification Search
 None
 See application file for complete search history.

(56) References Cited

U.S. PATENT DOCUMENTS

| | | |
|---|---|---|
| 2001/0053034 A1 | 12/2001 | Ikuhara et al. |
| 2010/0243970 A1 | 9/2010 | Toshimitsu et al. |
| 2011/0012075 A1 | 1/2011 | Nii et al. |
| 2011/0195235 A1 | 8/2011 | Kato et al. |
| 2011/0294385 A1 | 12/2011 | Eichenberger et al. |

(Continued)

FOREIGN PATENT DOCUMENTS

| | | |
|---|---|---|
| CN | 101983200 A | 3/2011 |
| JP | 2001-194524 A | 7/2001 |

(Continued)

OTHER PUBLICATIONS

International Preliminary Report on Patentability and Written Opinion of the International Searching Authority (Forms PCT/IB/373 and PCT/ISA/237) for International Application No. PCT/JP2016/060885, dated Nov. 7, 2017, with an English translation of the Written Opinion.

(Continued)

*Primary Examiner* — Darryl J Collins
*Assistant Examiner* — Journey F Sumlar
(74) *Attorney, Agent, or Firm* — Birch, Stewart, Kolasch & Birch, LLP

(57) ABSTRACT

A film has a maximum light transmittance value of 20% or lower in a wavelength range of 450 to 650 nm in a film thickness direction, a light transmittance of 20% or lower at a wavelength of 835 nm in the film thickness direction, and a minimum light transmittance value of 70% or higher in a wavelength range of 1000 to 1300 nm in the film thickness direction. A method of forming the film includes forming a first spectrally selective layer and forming a second spectrally selective layer. A kit for forming the film includes a first composition and a second composition.

27 Claims, 2 Drawing Sheets

(56) References Cited

U.S. PATENT DOCUMENTS

2015/0260885 A1  9/2015  Takishita et al.
2017/0010528 A1  1/2017  Takishita et al.
2017/0012072 A1  1/2017  Tsuruta et al.

FOREIGN PATENT DOCUMENTS

| JP | 2002-107538 A | 4/2002 |
|---|---|---|
| JP | 2007-264116 A | 10/2007 |
| JP | 2009-69822 A | 4/2009 |
| JP | 2009-263614 A | 11/2009 |
| JP | 2010-222557 A | 10/2010 |
| JP | 2013-77009 A | 4/2013 |
| JP | 2014-130338 A | 7/2014 |
| TW | 201428422 A | 7/2014 |
| WO | WO 2014/084147 A1 | 6/2014 |
| WO | WO 2015/151999 A1 | 10/2015 |
| WO | WO 2015/166779 A1 | 11/2015 |

OTHER PUBLICATIONS

International Search Report (Form PCT/ISA/210) for International Application No. PCT/JP2016/060885, dated Jun. 28, 2016, with English translation.

Japanese Notification of Reasons for Refusal for corresponding Japanese Application No. 2017-516572, dated Sep. 4, 2018, with machine translation.

Taiwanese Office Action and Search Report dated May 28, 2019, for corresponding Taiwanese Application No. 105111569, with English translation.

Korean Notification of Reason for Refusal, dated Sep. 27, 2018, for corresponding Korean Application No. 10-2017-7030134, with English translation.

FILM, FILM FORMING METHOD, SOLID IMAGE PICKUP ELEMENT, AND INFRARED SENSOR

CROSS-REFERENCE TO RELATED APPLICATIONS

This application is a Continuation of PCT International Application No. PCT/JP2016/060885 filed on Apr. 1, 2016, which claims priority under 35 U.S.C § 119(a) to Japanese Patent Application No. 2015-094218 filed on May 1, 2015. Each of the above application(s) is hereby expressly incorporated by reference, in its entirety, into the present application.

BACKGROUND OF THE INVENTION

1. Field of the Invention

The present invention relates to a film, a film forming method, a solid image pickup element, and an infrared sensor. More specifically, the present invention relates to a film capable of allowing transmission of infrared light in a state where noise generated from visible light is small, a film forming method, a solid image pickup element, and an infrared sensor.

2. Description of the Related Art

A solid image pickup element is used as an optical sensor in various applications.

For example, infrared light is less likely to be scattered than visible light due to its longer wavelength and can be used in, for example, distance measurement or three-dimensional measurement. In addition, infrared light is invisible to humans or animals. Therefore, even in a case where an object is irradiated with infrared light using an infrared light source at night, the object cannot recognize the infrared light. Thus, infrared light can be used for imaging a nocturnal wild animal or imaging an object without provoking the object for a security reason. This way, an optical sensor (infrared sensor) that detects infrared light can be used in various applications, and the development of a film that can be used in an infrared sensor is desired.

JP2013-77009A describes a radiation-sensitive coloring composition for a color filter in which, in a case where a coloring composition layer having a spectral transmittance of 30% at a wavelength of 600 nm is formed, the coloring composition layer satisfies the following conditions: a spectral transmittance at a wavelength of 400 nm is 20% or lower; a spectral transmittance at a wavelength of 550 nm is 10% or lower; a spectral transmittance at a wavelength of 700 nm is 70% or higher; and a wavelength at which a spectral transmittance is 50% is in a range of 650 nm to 680 nm.

JP2009-69822A describes a resin black matrix in which a maximum light transmittance in a wavelength range of 400 to 700 nm is 1% or lower, and an average light transmittance in a wavelength range of 850 to 3000 nm is 60% or higher.

JP2014-130338A describes a composition in which, in a case where a film having a thickness of 1 µm is formed using the composition, a maximum value of a light transmittance of the film in a thickness direction in a wavelength range of 400 nm to 750 nm is 20% or lower, and a minimum value of a light transmittance of the film in the thickness direction in a wavelength range of 900 nm to 1300 nm is 90% or higher.

JP2009-263614A describes a near infrared absorbing compound which has an absorption in the near infrared range and is excellent in invisibility in a wavelength range of 400 to 700 nm without having an absorption in the wavelength range.

SUMMARY OF THE INVENTION

However, films which have been known until now have insufficient light shielding properties with respect to visible light on the long wavelength side. Therefore, it was found that, in a case where the films are applied to an optical sensor or the like in which infrared light having a longer wavelength, for example, infrared light having a wavelength of 900 nm or longer is used as a light source, noise is generated from visible light, which causes deterioration in the performance of the sensor.

In addition, it was found that, in a case where the techniques described in JP2013-77009A, JP2009-69822A, JP2014-130338A are applied to an optical sensor or the like in which infrared light having a wavelength of 900 nm or longer is used as a light source, noise is likely to be generated from visible light.

On the other hand, JP2009-263614A neither discloses nor implies a film capable of allowing transmission of infrared light in a state where noise generated from visible light is small.

Accordingly, an object of the present invention is to provide a film capable of allowing transmission of infrared light in a state where noise generated from visible light is small, a film forming method, a solid image pickup element, and an infrared sensor.

As a result of detailed investigation, the present inventors found that the object can be achieved using a film having a specific transmittance described below, thereby completing the present invention. That is, the present invention is as follows.

<1> A film
in which a maximum value of a light transmittance of the film in a thickness direction in a wavelength range of 450 to 650 nm is 20% or lower,
a light transmittance of the film in the thickness direction at a wavelength of 835 nm is 20% or lower, and
a minimum value of a light transmittance of the film in the thickness direction in a wavelength range of 1000 to 1300 nm is 70% or higher.

<2> The film according to <1> comprising a first spectrally selective layer and a second spectrally selective layer,
in which a maximum value of a light transmittance of the first spectrally selective layer in the thickness direction in a wavelength range of 450 to 650 nm is 20% or lower,
a minimum value of a light transmittance of the first spectrally selective layer in the thickness direction in a wavelength range of 1000 to 1300 nm is 70% or higher,
a light transmittance of the second spectrally selective layer in the thickness direction at a wavelength of 835 nm is 20% or lower, and
a minimum value of a light transmittance of the second spectrally selective layer in the thickness direction in a wavelength range of 1000 to 1300 nm is 70% or higher.

<3> The film according to <2>,
in which the first spectrally selective layer includes a visible light absorbing coloring material.

<4> The film according to <3>,
in which the visible light absorbing coloring material includes two or more chromatic colorants.

<5> The film according to <3>,
in which the visible light absorbing coloring material includes a black colorant.

<6> The film according to <2>,
in which the first spectrally selective layer includes two or more sublayers.

<7> The film according to <6>,
in which each of the sublayers includes one or more chromatic colorants, and the first spectrally selective layer includes two or more chromatic colorants as a whole.

<8> The film according to <6>,
in which at least one of the sublayers includes a black colorant.

<9> The film according to any one of <2> to <8>,
in which the second spectrally selective layer includes an infrared absorber having a maximal absorption in a wavelength range of 750 to 950 nm.

<10> The film according to any one of <2> to <9>,
in which the second spectrally selective layer includes a pyrrolopyrrole compound.

<11> The film according to <10>,
in which the pyrrolopyrrole compound is represented by the following Formula (1),

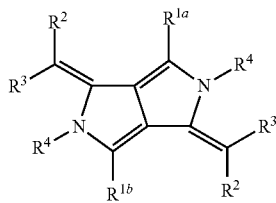

in Formula (1), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a hydrogen atom or a substituent.

<12> The film according to any one of <2> to <11>,
in which the first spectrally selective layer and the second spectrally selective layer are adjacent to each other in the thickness direction of the film.

<13> The film according to any one of <1> to <12>, which is an infrared transmitting filter.

<14> A film forming method comprising:
forming a first spectrally selective layer in which a maximum value of a light transmittance in the thickness direction in a wavelength range of 450 to 650 nm is 20% or lower and in which a minimum value of a light transmittance in the thickness direction in a wavelength range of 1000 to 1300 nm is 70% or higher; and
forming a second spectrally selective layer in which a light transmittance of the second spectrally selective layer in the thickness direction at a wavelength of 835 nm is 20% or lower and in which a minimum value of a light transmittance of the second spectrally selective layer in the thickness direction in a wavelength range of 1000 to 1300 nm is 70% or higher.

<15> The film forming method according to <14>, further comprising a patterning,
in which a patterning on the first spectrally selective layer and a patterning on the second spectrally selective layer are separately performed, or a patterning on a laminate of the first spectrally selective layer and the second spectrally selective layer is performed.

<16> The film forming method according to <15>,
in which the patterning is performed using at least one selected from the group consisting of a pattern forming method using photolithography and a pattern forming method using dry etching.

<17> The film forming method according to <15> or <16>,
in which the patterning is performed at a temperature of 150° C. or lower.

<18> A kit for forming a film in which a maximum value of a light transmittance of the film in a thickness direction in a wavelength range of 450 to 650 nm is 20% or lower, a light transmittance of the film in the thickness direction at a wavelength of 835 nm is 20% or lower, and a minimum value of a light transmittance of the film in the thickness direction in a wavelength range of 1000 to 1300 nm is 70% or higher, the kit comprising:
a first composition in which a ratio A/B of a minimum value A of an absorbance in a wavelength range of 450 to 650 nm to a maximum value B of an absorbance in a wavelength range of 1000 to 1300 nm is 4.5 or higher; and
a second composition that includes an infrared absorber having a maximal absorption in a wavelength range of 750 to 950 nm.

<19> The kit according to <18>,
in which the first composition and the second composition include a polymerizable compound and a photopolymerization initiator.

<20> A solid image pickup element, comprising the film according to any one of <1> to <13>.

<21> An infrared sensor comprising the film according to any one of <1> to <13>.

According to the present invention, a film capable of allowing transmission of infrared light in a state where noise generated from visible light is small, a film forming method, a solid image pickup element, and an infrared sensor can be provided.

DESCRIPTION OF THE PREFERRED EMBODIMENTS

Figure 1:
FIG. 1 is a schematic diagram showing an embodiment of a film according to the present invention.

In this specification, a total solid content denotes the total mass of components of a composition excluding a solvent. In addition, a solid content denotes a solid content at 25° C.

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, "radiation" denotes, for example, a bright light spectrum of a mercury lamp, a far ultraviolet ray represented by excimer laser, an extreme ultraviolet ray (EUV ray), an X-ray, or an electron beam. In addition, in the present invention, "light" denotes an actinic ray or radiation. In this specification, unless specified otherwise, "exposure" denotes not only exposure using a mercury lamp, a far ultraviolet ray represented by excimer laser, an X-ray, an EUV ray, or the like but also drawing using a corpuscular beam such as an electron beam or an ion beam.

In this specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In this specification, in a chemical formula, Me represents a methyl group, Et represents an ethyl group, Pr represents a propyl group, Bu represents a butyl group, and Ph represents a phenyl group.

In this specification, the term "step" denotes not only an individual step but also a step which is not clearly distinguishable from another step as long as an effect expected from the step can be achieved.

In this specification, a weight-average molecular weight and a number average molecular weight are defined as values in terms of polystyrene obtained by GPC. In this specification, an weight-average molecular weight (Mw) and a number average molecular weight (Mn) can be obtained by using HLC-8220 (manufactured by Tosoh Corporation), using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

A pigment described in the present invention denotes an insoluble colorant compound which is not likely to dissolve in a solvent. Typically, a pigment denotes a colorant compound which is present in a state of being dispersed as particles in a composition. As the solvent described herein, for example, an arbitrary solvent can be used, and examples thereof are described in "Solvent" described below. It is preferable that the pigment used in the present invention has a solubility of 0.1 g/100 g Solvent or lower at 25° C., for example, both in propylene glycol monomethyl ether acetate and in water.

<Film>

In a film according to the present invention, a maximum value of a light transmittance of the film in a thickness direction in a wavelength range of 450 to 650 nm is 20% or lower, a light transmittance of the film in the thickness direction at a wavelength of 835 nm is 20% or lower, and a minimum value of a light transmittance of the film in the thickness direction in a wavelength range of 1000 to 1300 nm is 70% or higher.

By adjusting spectral characteristics of the film to be in the above-described ranges, a film capable of allowing transmission of infrared light (preferably light having a wavelength of 900 nm or longer) in a state where noise generated from visible light is small can be formed. Therefore, the film according to the present invention is suitable as an infrared transmitting filter.

The maximum value of the light transmittance of the film according to the present invention in the thickness direction in a wavelength range of 450 to 650 nm is preferably 20% or lower and more preferably 10% or lower.

The maximum value of the light transmittance of the film according to the present invention in the thickness direction in a wavelength range of 650 to 835 nm is preferably 50% or lower and more preferably 30% or lower.

The light transmittance of the film according to the present invention in the thickness direction at a wavelength of 835 nm is preferably 20% or lower and more preferably 10% or lower.

The minimum value of the light transmittance of the film according to the present invention in the thickness direction in a wavelength range of 1000 to 1300 nm is preferably 70% or higher and more preferably 80% or higher.

The spectral characteristics of the film according to the present invention are values obtained by measuring the transmittance in a wavelength range of 300 to 1300 nm using a spectrophotometer of an ultraviolet-visible-near infrared spectrophotometer (U-4100, manufactured by Hitachi High-Technologies Corporation).

The thickness of the film according to the present invention is not particularly limited and is preferably 0.1 to 20 μm and more preferably 0.5 to 10 μm.

In the film according to the present invention, a one-layer film (single-layer film) may have the above-described spectral characteristics, or the above-described spectral characteristics may be satisfied using a multi-layer film (refer to FIGS. 1 and 2) including a combination of two or more layers.

<<Single-Layer Film>>

It is preferable that the single-layer film includes one or more infrared absorbers having a maximal absorption in a wavelength range of 750 to 950 nm and a visible light absorbing coloring material. It is preferable that the visible light absorbing coloring material included in the single-layer film satisfies a requirement (1) or (2) described below regarding a first spectrally selective layer, and it is more preferable that the visible light absorbing coloring material included in the single-layer film satisfies the requirement (1).

Examples of the infrared absorber and a chromatic colorant are the same as those described below in detail regarding the first spectrally selective layer and the second spectrally selective layer, and preferable ranges thereof are also the same.

The thickness of the single-layer film is not particularly limited and is preferably 0.1 to 20 μm and more preferably 0.5 to 10 μm.

<<Multi-Layer Film>>

In a case where the film according to the present invention satisfies the spectral characteristics using a multi-layer film, it is preferable that, for example, as shown in FIG. 1, the film includes: a first spectrally selective layer 201 in which a maximum value of a light transmittance in the thickness direction in a wavelength range of 450 to 650 nm is 20% or lower and in which a minimum value of a light transmittance in the thickness direction in a wavelength range of 1000 to 1300 nm is 70% or higher; and a second spectrally selective layer 202 in which a light transmittance in the thickness direction at a wavelength of 835 nm is 20% or lower and in which a minimum value of a light transmittance in the thickness direction in a wavelength range of 1000 to 1300 nm is 70% or higher. It is preferable that the first spectrally selective layer 201 and the second spectrally selective layer 202 are adjacent to each other in the thickness direction of the film (direction indicated by arrow d in FIG. 1).

Light having a wavelength of 450 to 650 nm can be shielded by the first spectrally selective layer, and light having a wavelength of 835 nm can be shielded by the second spectrally selective layer. Therefore, by including the first spectrally selective layer and the second spectrally selective layer, the film according to the present invention can achieve the spectral characteristics, and transmission of infrared light (preferably light having a wavelength of 900 nm or longer) is allowable in a state where noise generated from visible light is small.

In a case where the spectral characteristics are satisfied using a multi-layer film, for example, the concentration of a visible light absorbing coloring material or an infrared absorber in each layer can be increased, and the thickness of the film can be reduced as compared to the case of the single-layer film. In addition, the degree of freedom in material design can be increased.

The maximum value of the light transmittance of the first spectrally selective layer 201 in the thickness direction in a wavelength range of 450 to 650 nm is preferably 20% or lower and more preferably 10% or lower. The maximum value of the light transmittance of the first spectrally selective layer 201 in the thickness direction of the film in a wavelength range of 650 to 835 nm is preferably 50% or lower and more preferably 30% or lower. The minimum value of the light transmittance of the first spectrally selective layer 201 in the thickness direction in a wavelength range of 1000 to 1300 nm is preferably 70% or higher and more preferably 80% or higher. In addition, the minimum value of the light transmittance of the first spectrally selective layer 201 in the thickness direction in a wavelength range of 900 to 1300 nm is preferably 70% or higher and more preferably 80% or higher.

Figure 2:
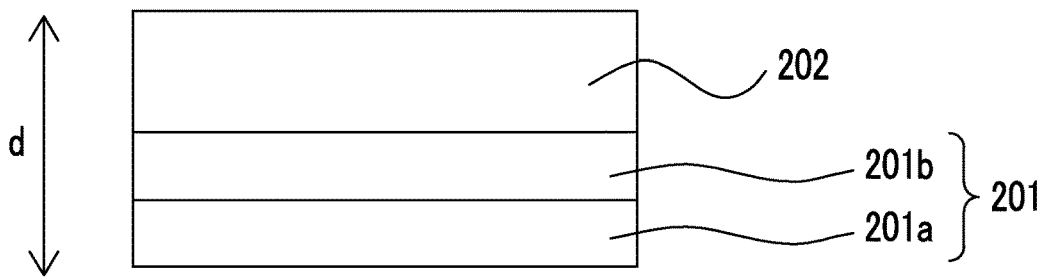
FIG. 2 is a schematic diagram showing another embodiment of the film according to the present invention.

The thickness of the first spectrally selective layer is preferably 0.1 to 10 μm and more preferably 0.2 to 5 μm. In the first spectrally selective layer, as shown in FIG. 2, in a case where the spectral characteristics are satisfied using a combination of a plurality of sublayers, it is preferable that the total thickness of the sublayers is in the above-described range.

The light transmittance of the second spectrally selective layer 202 in the thickness direction at a wavelength of 835 nm is preferably 20% or lower and more preferably 10% or lower. In addition, the minimum value of the light transmittance of the second spectrally selective layer 202 in the thickness direction in a wavelength range of 1000 to 1300 nm is preferably 70% or higher and more preferably 80% or higher. In addition, the minimum value of the light transmittance of the second spectrally selective layer 202 in the thickness direction in a wavelength range of 900 to 1300 nm is preferably 70% or higher and more preferably 80% or higher.

The thickness of the second spectrally selective layer is preferably 0.1 to 10 μm and more preferably 0.2 to 5 μm.

Two or more first spectrally selective layers 201 may be provided. In addition, two or more second spectrally selective layers 202 may be provided. In a case where two or more first spectrally selective layers 201 are provided, the two or more first spectrally selective layers 201 may be or may not be adjacent to each other. The second spectrally selective layer may be disposed between the first spectrally selective layers. The same shall be applied to a case where two or more second spectrally selective layers 202 are provided.

<<<First Spectrally Selective Layer>>>

The first spectrally selective layer 201 may satisfy the spectral characteristics as a single layer as shown in FIG. 1. In addition, as shown in FIG. 2, the first spectrally selective layer 201 may satisfy the spectral characteristics using a combination of two or more sublayers 201a and 201b. That is, the first spectrally selective layer 201 may satisfy the spectral characteristics using a combination of two or more sublayers in which a light transmittance in the thickness direction in a wavelength range of 450 to 650 nm is 20% or lower and in which a minimum value of a light transmittance in the thickness direction in a wavelength range of 1000 to 1300 nm is 70% or higher. FIG. 2 shows a configuration in which the first spectrally selective layer 201 includes two sublayers. However, the first spectrally selective layer 201 may include three or more sublayers.

In a case where the first spectrally selective layer includes a combination of two or more sublayers, it is preferable that the sublayers are adjacent to each other in the thickness direction of the film (direction indicated by arrow d in FIG. 2).

The first spectrally selective layer includes a visible light absorbing coloring material. In addition, it is preferable that black, gray, or a color similar to black or gray is exhibited using a single coloring material or a combination of a plurality of coloring materials. It is preferable that the visible light absorbing coloring material satisfies the following requirement (1) or (2), and it is more preferable that the visible light absorbing coloring material satisfies the requirement (1). According to this aspect, the first spectrally selective layer can satisfy the spectral characteristics as a single layer.

(1): An aspect in which the first spectrally selective layer includes two or more chromatic colorants (2): An aspect in which the first spectrally selective layer includes a black colorant In the aspect (1), it is preferable that black is exhibited using a combination of two or more chromatic colorants. In addition, in the aspect (1), the first spectrally selective layer may further include a black colorant.

In the aspect (2), the first spectrally selective layer may further include one or more chromatic colorants.

In addition, it is also preferable that the first spectrally selective layer includes two or more sublayers that include one or more chromatic colorants and the first spectrally selective layer includes two or more chromatic colorants as a whole. Even in this aspect, the first spectrally selective layer can satisfy the spectral characteristics.

In addition, even in an aspect where the first spectrally selective layer includes two or more sublayers and at least one of the sublayers includes a black colorant, the first spectrally selective layer can satisfy the spectral characteristics. In this aspect, from the viewpoint of spectral characteristics, it is preferable that the first spectrally selective layer includes: one or more sublayers that include a black colorant; and one or more sublayers that include a chromatic colorant.

The content of the visible light absorbing coloring material in the first spectrally selective layer is preferably 1 to 80 mass % and more preferably 5 to 70 mass %.

In addition, in a case where the first spectrally selective layer includes a combination of two or more sublayers, the content of the visible light absorbing coloring material in the sublayers is preferably 1 to 80 mass % and more preferably 5 to 70 mass %.

In the present invention, the chromatic colorant denotes a colorant other than a white colorant and a black colorant. It is preferable that the chromatic colorant is a colorant having a maximal absorption in a wavelength range of 400 to 700 nm. In addition, "having a maximal absorption in a wavelength range of 400 to 700 nm" denotes having a maximum absorbance in a wavelength range of 400 to 700 nm in an absorption spectrum. For example, in an absorption spectrum in a wavelength range of 350 to 1300 nm, it is preferable that the chromatic colorant has a maximum absorbance in a wavelength range of 400 to 700 nm.

In the present invention, the chromatic colorant may be a pigment or a dye. It is preferable that the chromatic colorant is a pigment.

It is preferable that an average particle size (r) of the pigment satisfies preferably 20 nm≤r≤300 nm, more preferably 25 nm≤r≤250 nm, and still more preferably 30 nm≤r≤200 nm. "Average particle size" described herein denotes the average particle size of secondary particles which are aggregates of primary particles of the pigment.

In addition, regarding a particle size distribution of the secondary particles of the pigment (hereinafter, simply referred to as "particle size distribution") which can be used, it is preferable that secondary particles having a particle size of (average particle size ±100) nm account for 70 mass % or higher, preferably, 80 mass % or higher in the pigment. The particle size distribution of the secondary particles can be measured using a scattering intensity distribution.

The pigment having a secondary particle size and a particle size distribution of secondary particles in the above-described ranges can be prepared by mixing and dispersing a pigment mixed solution while pulverizing the pigment mixed solution using a pulverizer such as a beads mill or a roll mill, the pigment mixed solution being obtained by mixing a commercially available pigment and another pigment (having an average particle size of secondary particles of more than 300 nm), which is optionally used, with a resin and an organic solvent. The pigment obtained as described above is typically in the form of a pigment dispersion.

The average particle size of primary particles can be obtained by observing a pigment with a scanning electron microscope (SEM) or a transmission electron microscope (TEM), measuring particle sizes of 100 particles in a region where particles do not aggregate, and obtaining an average value of the measured particle sizes.

The pigment is preferably an organic pigment, and examples thereof are as follows. However, the present invention is not limited to the examples.

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments); C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes for a color filter of the related art can be used without any particular limitation.

In terms of a chemical structure, a dye such as a pyrazole azo dye, an anilino azo dye, a triphenylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-34966A can also be used.

In addition, as the dye, an acid dye and/or a derivative thereof may be suitably used.

Furthermore, for example, a direct dye, a basic dye, a mordant dye, an acid mordant dye, an azoic dye, a dispersed dye, an oil-soluble dye, a food dye, and/or a derivative thereof can be suitably used.

Specific examples of the acid dye are shown below, but the present invention is not limited to these examples. For example, the following dyes and derivatives thereof can be used:

acid alizarin violet N;
acid blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243, and 324:1;
acid chrome violet K;
acid Fuchsin and acid green 1, 3, 5, 9, 16, 25, 27, and 50;
acid orange 6, 7, 8, 10, 12, 50, 51, 52, 56, 63, 74, and 95;
acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274;
acid violet 6B, 7, 9, 17, and 19;
acid yellow 1, 3, 7, 9, 11, 17, 23, 25, 29, 34, 36, 42, 54, 72, 73, 76, 79, 98, 99, 111, 112, 114, 116, 184, and 243; and
Food Yellow 3.

In addition to the above-described examples, an azo acid dye, a xanthene acid dye, and a phthalocyanine acid dye are preferably used, and acid dyes, such as C.I. Solvent Blue 44 and 38, C.I. Solvent Orange 45, Rhodamine B, and Rhodamine 110 and derivatives of the dyes are also preferably used.

Among these, it is preferable that the dye is a colorant selected from the group consisting of a triarylmethane dye, an anthraquinone dye, an azomethine dye, a benzylidene dye, an oxonol dye, a cyanine dye, a phenothiazine dye, a pyrrolopyrazole azo methine dye, a xanthene dye, a phthalocyanine dye, a benzopyran dye, an indigo dye, a pyrazole azo dye, an anilino azo dye, a pyrazolotriazole azo dye, a pyridone azo dye, an anthrapyridone dye, and a pyrromethene dye.

Further, a combination of a pigment and a dye may be used.

It is preferable that the first spectrally selective layer includes two or more chromatic colorants selected from the group consisting of a red colorant, a yellow colorant, a blue colorant, and a violet colorant. In addition, it is preferable that the first spectrally selective layer includes a blue colorant and at least one colorant selected from a red colorant, a yellow colorant, and a violet colorant.

Among these, any one of the following aspects (1) to (3) is preferable.

(1) An aspect in which the first spectrally selective layer includes a red colorant, a yellow colorant, a blue colorant, and a violet colorant (2) An aspect in which the first spectrally selective layer includes a red colorant, a yellow colorant, and a blue colorant (3) An aspect in which the first spectrally selective layer includes a yellow colorant, a blue colorant, and a violet colorant In a specific example of the aspect (1), the first spectrally selective layer includes C.I. Pigment Red 254 as a red pigment, C.I. Pigment Yellow 139 as a yellow pigment, C.I. Pigment Blue 15:6 as a blue pigment, and C.I. Pigment Violet 23 as a violet pigment.

In a specific example of the aspect (2), the first spectrally selective layer includes C.I. Pigment Red 254 as a red pigment, C.I. Pigment Yellow 139 as a yellow pigment, and C.I. Pigment Blue 15:6 as a blue pigment.

In a specific example of the aspect (3), the first spectrally selective layer includes C.I. Pigment Yellow 139 as a yellow pigment, C.I. Pigment Blue 15:6 as a blue pigment, and C.I. Pigment Violet 23 as a violet pigment.

In the present invention, a black colorant can be used as the visible light absorbing coloring material. It is preferable that the black colorant is an organic black colorant. In the present invention, the black colorant as the visible light absorbing coloring material denotes a material that absorbs visible light and allows at least a part of infrared light. Accordingly, in the present invention, examples of the black colorant as the visible light absorbing coloring material do not include carbon black and titanium black.

In the present invention, as the black colorant, for example, a bisbenzofuranone compound, an azomethine compound, a perylene compound, or an azo compound can also be used.

The bisbenzofuranone compound may be a pigment or a dye and is preferably a pigment.

Examples of the bisbenzofuranone compound include compounds disclosed in JP2010-534726A, JP2012-515233A, and JP2012-515234A. It is preferable that the bisbenzofuranone compound is one of the following compounds represented by the following formulae or a mixture thereof.

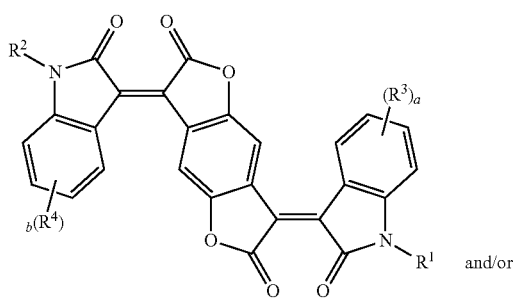

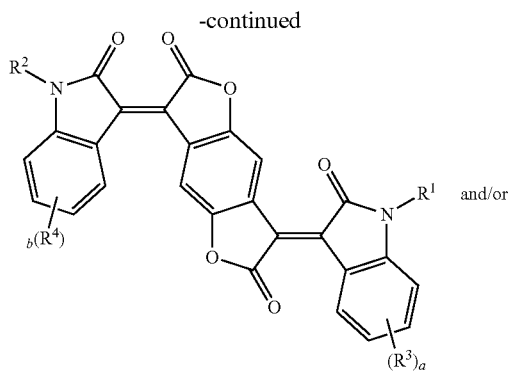

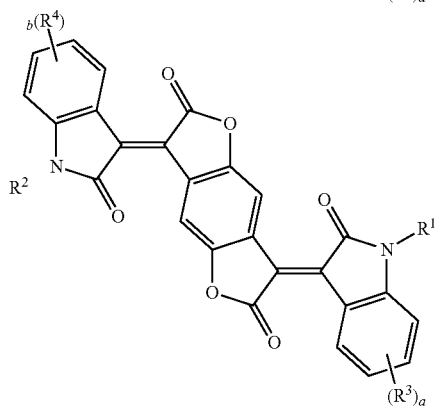

In the formulae, $R^1$ and $R^2$ each independently represent a hydrogen atom or a substituent, $R^3$ and $R^4$ each independently represent a substituent, a and b each independently represent an integer of 0 to 4, in a case where a is 2 or more, a plurality of $R^3$'s may be the same as or different from each other, a plurality of $R^3$'s may be bonded to each other to form a ring, in a case where b is 2 or more, a plurality of $R^4$'s may be the same as or different from each other, and a plurality of $R^4$'s may be bonded to each other to form a ring.

The substituent represented by $R^1$ to $R^4$ is a halogen atom, a cyano group, a nitro group, an alkyl group, an alkenyl group, an alkynyl group, an aralkyl group, an aryl group, a heteroaryl group, $-OR^{301}$, $-COR^{302}$, $-COOR^{33}$, $-OCOR^{304}$, $-R^{305}R^{306}$, $-NHCOR^{307}$, $-CONR^{308}R^{309}$, $-NHCONR^{310}R^{311}$, $-NHCOOR^{312}$, $-SR^{313}$, $-SO_2R^{314}$, $-SO_2OR^{315}$, $-NHSO_2R^{316}$ or $-SO_2NR^{317}R^{318}$. $R^{301}$ to $R^{318}$ each independently represent a hydrogen atom, an alkyl group, an alkenyl group, an alkynyl group, an aryl group, or a heteroaryl group.

Examples of the halogen atom include a fluorine atom, a chlorine atom, a bromine atom, and an iodine atom.

The number of carbon atoms in the alkyl group is preferably 1 to 12. The alkyl group may be linear, branched, or cyclic.

The number of carbon atoms in the alkenyl group is preferably 2 to 12. The alkenyl group may be linear, branched, or cyclic.

The number of carbon atoms in the alkynyl group is preferably 2 to 12. The alkynyl group may be linear, branched, or cyclic.

The number of carbon atoms in the aryl group is preferably 6 to 12.

The number of carbon atoms in the alkyl group is preferably 1 to 20, more preferably 1 to 12, and still more preferably 1 to 8. The alkyl group may be linear, branched, or cyclic.

The number of carbon atoms in the alkenyl group is preferably 2 to 20, more preferably 2 to 12, and still more preferably 2 to 8. The alkenyl group may be linear, branched, or cyclic.

The number of carbon atoms in the alkynyl group is preferably 2 to 20, more preferably 2 to 12, and still more preferably 2 to 8. The alkynyl group may be linear, branched, or cyclic.

The number of carbon atoms in the aryl group is preferably 6 to 25, more preferably 6 to 15, and still more preferably 6 to 12.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5- or 6-membered ring. The number of carbon atoms constituting the ring of the heteroaryl group is preferably 3 to 30, more preferably 3 to 18, and still more preferably 3 to 12.

The details of the bisbenzofuranone compound can be found in paragraphs "0014" to "0037" of JP2010-534726A, the content of which is incorporated herein by reference.

For example, "IRAGAPHOR BK" (manufactured by BASF SE) is available as the bisbenzofuranone compound.

Examples of the azomethine pigment include pigments described in JP1989-170601A (JP-H1-170601A) and JP1990-34664A (JP-H2-34664A). For example, "CHROMOFINE BLACK A1103" (manufactured by Dainichiseika Color & Chemicals Mfg. Co., Ltd.) is available. The azo dye is not particularly limited, and for example, a compound represented by the following Formula (A-1) can be suitably used.

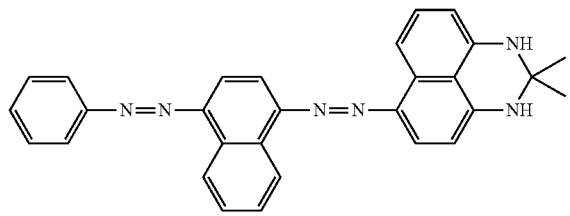

A-1

<<<Second Spectrally Selective Layer>>>

It is preferable that the second spectrally selective layer includes an infrared absorber having a maximal absorption in a wavelength range of 750 to 950 nm. In the present invention, "having a maximal absorption in a wavelength range of 750 to 950 nm" denotes having a maximum absorbance in a wavelength range of 750 to 950 nm in an absorption spectrum. For example, in an absorption spectrum in a wavelength range of 350 to 1300 nm, it is preferable that the infrared absorber has a maximum absorbance in a wavelength range of 750 to 950 nm.

The content of the infrared absorber in the second spectrally selective layer is preferably 1 to 80 mass % and more preferably 5 to 70 mass %.

As the infrared absorber, either a pigment or a dye may be used.

Examples of the infrared absorber include a pyrrolopyrrole compound, a copper compound, a cyanine compound, a phthalocyanine compound, an iminium compound, a thiol complex compound, a transition metal oxide compound, a squarylium compound, a naphthalocyanine compound, a quaterrylene compound, a dithiol metal complex compound, and a croconium compound.

Examples of the phthalocyanine compound include oxotitanyl phthalocyanine. Examples of the naphthalocyanine compound include oxovanadyl naphthalocyanine. As the phthalocyanine compound, the naphthalocyanine compound, the iminium compound, the cyanine compound, the squarylium compound, or the croconium compound, for example, one of compounds disclosed in paragraphs "0010" to "0081" of JP2010-111750A may be used, the content of which are incorporated in this specification. The cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference.

In addition, in the present invention, as the infrared absorber, a compound disclosed in paragraphs "0004" to "0016" of JP1995-164729A (JP-H7-164729A), a compound disclosed in paragraphs "0027" to "0062" of JP2002-146254A, or near infrared ray absorbing particles disclosed in paragraphs "0034" to "0067" of JP2011-164583A which are formed of crystallites of an oxide including Cu and/or P and have a number average aggregated particle size of 5 to 200 nm may be used, the content of which is incorporated herein by reference. In addition, for example, FD-25 (manufactured by Yamada Chemical Co., Ltd.) or IRA842 (naphthalocyanine compound, manufactured by Exiton, Inc.) may be used.

In the present invention, the infrared absorber is preferably at least one compound selected from the group consisting of a pyrrolopyrrole compound, a phthalocyanine compound, a naphthalocyanine compound, a squarylium compound, and a cyanine compound, more preferably at least one compound selected from the group consisting of a pyrrolopyrrole compound, a phthalocyanine compound, and a naphthalocyanine compound, and still more preferably a pyrrolopyrrole compound. By using a pyrrolopyrrole compound, the spectral characteristics of the second spectrally selective layer is likely to be adjusted to be in the above-described ranges. In addition, a film having excellent heat resistance can be formed.

(Pyrrolopyrrole Compound)

As the pyrrolopyrrole compound, a pigment or a dye may be used. It is preferable that an average particle size (r) of the pigment satisfies preferably 20 nm≤r≤300 nm, more preferably 25 nm≤r≤250 nm, and still more preferably 30 nm≤r≤200 nm. In addition, regarding a particle size distribution of the secondary particles of the pigment (hereinafter, simply referred to as "particle size distribution") which can be used, it is preferable that secondary particles having a particle size of (average particle size ±100) nm account for 70 mass % or higher, preferably, 80 mass % or higher in the pigment.

As the pyrrolopyrrole compound, a compound represented by the following Formula (1) is preferable. By using the compound represented by the following Formula (1), excellent spectral characteristics can be obtained Further, a film having excellent heat resistance can be formed.

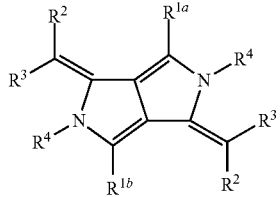

(1)

In Formula (1), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a hydrogen atom or a substituent.

The alkyl group represented by $R^{1a}$ or $R^{1b}$ in Formula (1) is an alkyl group having preferably 1 to 30 carbon atoms, more preferably 1 to 20 carbon atoms, and still more preferably 1 to 10 carbon atoms, and examples thereof include methyl, ethyl, iso-propyl, tert-butyl, n-octyl, n-decyl, n-hexadecyl, cyclopropyl, cyclopentyl, and cyclohexyl. The alkyl group may have a substituent or may be unsubstituted. Examples of the substituent include a substituent T described below and a group represented by Formula A described below.

The aryl group represented by $R^{1a}$ or $R^{1b}$ is an alkyl group having preferably 6 to 30 carbon atoms, more preferably 6 to 20 carbon atoms, and still more preferably 6 to 12 carbon atoms, and examples thereof include phenyl, o-methylphenyl, p-methylphenyl, biphenyl, naphtyl, anthranil, and phenanthryl. The aryl group may have a substituent or may be unsubstituted. Examples of the substituent include a substituent T described below and a group represented by Formula A described below.

It is preferable that the heteroaryl group represented by $R^{1a}$ or $R^{1b}$ is a 5- or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. Specific examples of the heteroaryl group include imidazolyl, pyridyl, quinolyl, furyl, thienyl, benzoxazolyl, benzimidazolyl, benzothiazolyl, naphthothiazolyl, m-carbazolyl, and azepinyl.

The heteroaryl group may have a substituent or may be unsubstituted. Examples of the substituent include a substituent T described below and a group represented by Formula A described below.

It is preferable that the group represented by $R^{1a}$ or $R^{1b}$ is an aryl group which has an alkoxy group having a branched alkyl group. The number of carbon atoms in the branched alkyl group is preferably 3 to 30 and more preferably 3 to 20.

In Formula (1), $R^{1a}$ and $R^{1b}$ may be the same as or different from each other.

$R^2$ and $R^3$ each independently represent a hydrogen atom or a substituent. $R^2$ and $R^3$ may be bonded to each other to form a ring. It is preferable that at least one of $R^2$ or $R^3$ represents an electron-withdrawing group. It is preferable that $R^2$ and $R^3$ each independently represent a cyano group or a heterocyclic group.

Examples of the substituent include substituents disclosed in paragraphs "0020" to "0022" of 2009-263614A, the content of which is incorporated herein by reference.

Examples of the substituent include the following substituent T.

(Substituent T)

Examples of the substituent T include an alkyl group (preferably having 1 to 30 carbon atoms; for example, a methyl group, an ethyl group, or a cyclohexyl group), an alkenyl group (preferably having 2 to 30 carbon atoms), an alkynyl group (preferably having 2 to 30 carbon atoms), an aryl group (preferably having 6 to 30 carbon atoms; for example, a phenyl group, a p-methylphenyl group, a biphenyl group, or a naphthyl group), an amino group (preferably having 0 to 30 carbon atoms), an alkoxy group (preferably having 1 to 30 carbon atoms; for example, a methoxy group or a 2-ethylhexyloxy group), an aryloxy group (preferably having 6 to 30 carbon atoms; for example, a phenyloxy group, an 1-naphthyloxy group, or 2-naphthyloxy group), a heteroaryloxy group (preferably having 1 to 30 carbon atoms; for example, a pyridyloxy group), an acyl group (preferably having 1 to 30 carbon atoms), an alkoxycarbonyl group (preferably having 2 to 30 carbon atoms), an aryloxycarbonyl group (preferably having 7 to 30 carbon atoms), an acyloxy group (preferably having 2 to 30 carbon atoms), an acylamino group (preferably having 2 to 30 carbon atoms), an alkoxycarbonylamino group (preferably having 2 to 30 carbon atoms), an aryloxycarbonylamino group (preferably having 7 to 30 carbon atoms), a sulfonylamino group (preferably having 1 to 30 carbon atoms), a sulfamoyl group (preferably having 0 to 30 carbon atoms), a carbamoyl group (preferably having 1 to 30 carbon atoms), an alkylthio group (preferably having 1 to 30 carbon atoms), an arylthio group (preferably having 6 to 30 carbon atoms), a heteroarylthio group (preferably having 1 to 30 carbon atoms), an alkylsulfinyl group (preferably having 1 to 30 carbon atoms), an arylsulfinyl group (preferably having 6 to 30 carbon atoms), a ureido group (preferably having 1 to 30 carbon atoms), a phosphoric amide group (preferably having 1 to 30 carbon atoms), a hydroxyl group, a mercapto group, a halogen atom (for example, a fluorine atom, a chlorine atom, a bromine atom, or an iodine atom), a cyano group, a sulfo group, a carboxyl group, a nitro group, a hydroxamic acid group, a sulfino group, a hydrazino group, an imino group, a heteroaryl group.

These groups may further have a substituent. Examples of the substituent include the groups exemplified as the substituent T and a group represented by the following Formula A.

-$L^1$-$X^1$     A:

In Formula A, $L^1$ represents a single bond or a divalent linking group, and $X^1$ represents a (meth)acryloyloxy group, an epoxy group, an oxetanyl group, an isocyanate group, a hydroxyl group, an amino group, a carboxyl group, a thiol group, an alkoxysilyl group, a methylol group, a vinyl group, a (meth)acrylamide group, a sulfo group, a styryl group, or a maleimide group.

In a case where $L^1$ represents a divalent linking group, it is preferable that $L^1$ represents an alkylene group having 1 to 20 carbon atoms, an arylene group having 6 to 18 carbon atoms, a heteroarylene group having 3 to 18 carbon atoms, —O—, —S—, —C(=O)—, or a group of a combination of the above-described groups.

It is more preferable that $X^1$ represents one or more groups selected from the group consisting of a (meth) acryloyloxy group, a vinyl group, an epoxy group, and an oxetanyl group, and it is still more preferable that $X^1$ represents a (meth)acryloyloxy group.

It is preferable that at least one of $R^2$ or $R^3$ represents an electron-withdrawing group. A substituent having a positive Hammett sigma para value (σp value) functions as an electron-withdrawing group.

In the present invention, a substituent having a Hammett σp value of 0.2 or higher can be used as an example of the electron-withdrawing group. The σp value is preferably 0.25 or higher, more preferably 0.3 or higher, and still more preferably 0.35 or higher. The upper limit is not particularly limited and is preferably 0.80.

Specific examples of the substituent having a Hammett σp value of 0.2 or higher include a cyano group (0.66), a carboxyl group (—COOH: 0.45), an alkoxycarbonyl group (—COOMe: 0.45), an aryloxycarbonyl group (—COOPh: 0.44), a carbamoyl group (—CONH$_2$: 0.36), an alkylcarbonyl group (—COMe: 0.50), an arylcarbonyl group (—COPh: 0.43), an alkylsulfonyl group (—SO$_2$Me: 0.72), and an arylsulfonyl group (for example, —SO$_2$Ph: 0.68). In particular, a cyano group is preferable. Here, Me represents a methyl group, and Ph represents a phenyl group.

The details of the Hammett substituent constant σ value can be found in paragraphs "0017" and "0018" of JP2011-68731A, the content of which is incorporated herein by reference.

In a case where $R^2$ and $R^3$ are bonded to each other to form a ring, it is preferable that the formed ring is a 5- to 7-membered (preferably 5- or 6-membered) ring which is typically used as an acid nucleus in a merocyanine colorant. Specific examples include a structure described in paragraph "0026" of JP2009-263614A, and the content of which is incorporated herein by reference.

The σp values of $R^2$ and $R^3$ which form the ring cannot be defined. However, in this present invention, assuming that each of $R^2$ and $R^3$ is substituted with a partial ring structure, the σp values of $R^2$ and $R^3$ which form the ring are defined. For example, in a case where $R^2$ and $R^3$ form a 1,3-indanedione ring, each of $R^2$ and $R^3$ is substituted with a benzoyl group.

It is preferable that the ring which is formed by $R^2$ and $R^3$ being bonded to each other is a 1,3-dicarbonyl nucleus, a pyrazolinone nucleus, a 2,4,6-triketohexahydropyrimidine nucleus (including a thioketone form), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus, or an indanone nucleus. It is more preferable that the ring which is formed by $R^2$ and $R^3$ being bonded to each other is a 1,3-dicarbonyl nucleus, a 2,4,6-triketohexahydropyrimidine nucleus (including a thioketone form), a 3,5-pyrazolidinedione nucleus, a benzothiophen-3-one nucleus, or an indanone nucleus.

It is more preferable that $R^3$ represents a heteroaryl group. It is preferable that the heteroaryl group is a 5- or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. The heteroaryl group is preferably a quinoline group, a benzothiazole group, or a naphthothiazol group, and is more preferably a benzothiazole group. The heteroaryl group may have a substituent or may be unsubstituted. Examples of the substituent include the above-described substituent T and the above-described group represented by Formula A.

In Formula (1), two $R^2$'s may be the same as or different from each other, and two $R^3$'s may be the same as or different from each other.

In a case where $R^4$ represents an alkyl group, an aryl group, or a heteroaryl group, the alkyl group, the aryl group, and the heteroaryl group represented by $R^4$ have the same definitions and the same preferable ranges as those described regarding $R^{1a}$ and $R^{1b}$ In a case where $R^4$ represents —BR$^{4A}$R$^{4B}$, R$^{4A}$ and R$^{4B}$ each independently represent a hydrogen atom or a substituent and may be bonded to each other to form a ring. Examples of the substituent represented by R$^{4A}$ and R$^{4B}$ include the above-described substituent T. In particular, a halogen atom, an alkyl group, an alkoxy group, an aryl group, or a heteroaryl group is preferable, an alkyl group, an aryl group, or a heteroaryl group is more preferable, and an aryl group is still more preferable. Specific examples of the group represented by —BR$^{4A}$R$^{4B}$ include difluoroboron, diphenylboron, dibutylboron, dinaphthylboron, and catecholboron. In particular, diphenylboron is preferable.

In a case where $R^4$ represents a metal atom, examples of the metal atom include magnesium, aluminum, calcium, barium, zinc, tin, vanadium, iron, cobalt, nickel, copper, palladium, iridium, platinum. In particular, aluminum, zinc, vanadium, iron, copper, palladium, iridium, or platinum is preferable.

$R^4$ may form a covalent bond or a coordinate bond with at least one selected from the group consisting of $R^{1a}$, $R^{1b}$, and $R^3$. In particular, it is preferable that $R^4$ and $R^3$ form a coordinate bond.

It is preferable that $R^4$ represents a hydrogen atom or a group (in particular, diphenylboron) represented by —BR$^{4A}$R$^{4B}$.

In Formula (1), two $R^4$'s may be the same as or different from each other.

It is preferable that the compound represented by Formula (1) is a compound represented by the following Formula (2), (3), or (4).

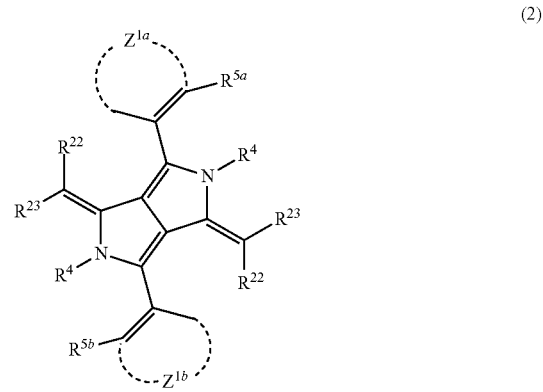

(2)

In Formula (2), $Z^{1a}$ and $Z^{1b}$ each independently represent an atomic group which forms an aryl ring or a heteroaryl ring. $R^{5a}$ and $R^{5b}$ each independently represent an aryl group having 6 to 20 carbon atoms, a heteroaryl group having 4 to 20 carbon atoms, an alkyl group having 1 to 20 carbon atoms, an alkoxy group having 1 to 20 carbon atoms, an alkoxycarbonyl group having 1 to 20 carbon atoms, a carboxyl group, a carbamoyl group having 1 to 20 carbon atoms, a halogen atom, or a cyano group, and $R^{5a}$ or $R^{5b}$ may be bonded to $Z^{1a}$ or $Z^{1b}$ to form a fused ring. $R^{22}$ and $R^{23}$ each independently represent a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, or a nitrogen-containing heteroaryl group having 3 to 20 carbon atoms. $R^{22}$ and $R^{23}$ may be bonded to each other to form a cyclic acid nucleus. $R^4$ represents a hydrogen atom, an alkyl group having 1 to 20 carbon atoms, an aryl group having 6 to 20 carbon atoms, a heteroaryl group having 4 to 20 carbon atoms, $-BR^{4A}R^{4B}$, or a metal atom, and may form a covalent bond or a coordinate bond with $R^{23}$. $R^{4A}$ and $R^{4B}$ each independently represent a hydrogen atom, a halogen atom, an alkyl group having 1 to 10 carbon atoms, an alkoxy group having 1 to 10 carbon atoms, an aryl group having 6 to 20 carbon atoms, or a heteroaryl group having 4 to 20 carbon atoms.

In Formula (2), $Z^{1a}$ and $Z^{1b}$ each independently represent an atomic group which forms an aryl ring or a heteroaryl ring. The formed aryl ring and the formed heteroaryl ring have the same definitions and the same preferable ranges as those of the aryl group and the heteroaryl group described as the substituent of $R^2$ and $R^3$ in Formula (1). It is preferable that $Z^{1a}$ and $Z^{1b}$ are the same as each other.

$R^{5a}$ and $R^{5b}$ have the same definitions and the same preferable ranges as those of the examples described regarding $R^2$ and $R^3$ in Formula (1). It is preferable that $R^{5a}$ and $R^{5b}$ are the same as each other.

$R^{5a}$ or $R^{5b}$ may be bonded to $Z^{1a}$ or $Z^{1b}$ to form a fused ring, and examples of the fused ring include a naphtyl ring and a quinoline ring. By introducing the group represented by $R^{5a}$ or $R^{5b}$ into the aryl ring or the heteroaryl ring which is formed by $Z^{1a}$ or $Z^{1b}$, invisibility can be significantly improved.

$R^{22}$ and $R^{23}$ have the same definitions and the same preferable ranges as those of the examples described regarding $R^2$ and $R^3$ in Formula (1).

$R^4$ has the same definition and the same preferable range as $R^4$ in Formula (1). $R^4$ may form a covalent bond or a coordinate bond with $R^{23}$.

The compound represented by Formula (2) may further have a substituent, and this substituent has the same definition and the same preferable range as those of the substituent of $R^2$ and $R^3$.

In a preferable combination in Formula (2), $Z^{1a}$ and $Z^{1b}$ each independently form a benzene ring or a pyridine ring, $R^{5a}$ and $R^{5b}$ each independently represent an alkyl group, an alkoxy group, a halogen atom, or a cyano group, $R^{22}$ and $R^{23}$ each independently represent a heteroaryl group, a cyano group, an acyl group, an alkoxycarbonyl group, or a cyclic acid nucleus which is formed by $R^{22}$ and $R^{23}$ being bonded to each other, and $R^4$ represents a hydrogen atom, $-BR^{4A}R^{4B}$, a transition metal atom, magnesium, aluminum, calcium, barium, zinc, or tin. In a more preferable combination, both $Z^{1a}$ and $Z^{1b}$ form a benzene ring, both $R^{5a}$ and $R^{5b}$ represent an alkyl group, a halogen atom, or a cyano group, $R^{22}$ and $R^{23}$ each independently represent a combination of a nitrogen-containing heteroaryl group with a cyano group or an alkoxycarbonyl group or are bonded to each other to form a cyclic acid nucleus, and $R^4$ represents a hydrogen atom, $-BR^{4A}R^{4B}$, aluminum, zinc, vanadium iron, copper, palladium, iridium, or platinum.

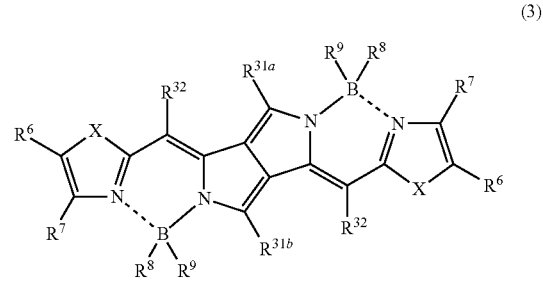

(3)

In Formula (3), $R^{31a}$ and $R^{31b}$ each independently represent an alkyl group having 1 to 20 carbon atoms, an aryl group having 6 to 20 carbon atoms, or a heteroaryl group having 3 to 20 carbon atoms. $R^{32}$ represents a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, or a nitrogen-containing heteroaryl group having 3 to 10 carbon atoms. $R^6$ and $R^7$ each independently represent a hydrogen atom, an alkyl group having 1 to 10 carbon atoms, an aryl group having 6 to 10 carbon atoms, or a heteroaryl group having 4 to 10 carbon atoms. $R^6$ and $R^7$ may be bonded to each other to form a fused ring, and the formed ring is preferably an alicyclic ring having 5 to 10 carbon atoms, an aryl ring having 6 to 10 carbon atoms, or a heteroaryl ring having 3 to 10 carbon atoms. $R^8$ and $R^9$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms. X represents an oxygen atom, a sulfur atom, $-NR-$, or $-CRR'-$, and R and R' represent a hydrogen atom, an alkyl group having 1 to 10 carbon atoms, or an aryl group having 6 to 10 carbon atoms.

In Formula (3), $R^{31a}$ and $R^{31b}$ have the same definitions and the same preferable ranges as those of the examples described regarding $R^{1a}$ and $R^{1b}$ in Formula (1). It is preferable that $R^{31a}$ and $R^{31b}$ are the same as each other.

$R^{32}$ has the same definition and the same preferable range as those of the example of $R^2$ in Formula (1).

$R^6$ and $R^7$ have the same definition and the same preferable range as those of the examples of the substituent of $R^2$ and $R^3$ in Formula (1). In addition, $R^6$ and $R^7$ may be bonded to each other to form a ring, and the formed ring is an alicyclic ring having 5 to 10 carbon atoms, an aryl ring having 6 to 10 carbon atoms, or a heteroaryl ring having 3 to 10 carbon atoms, and preferable examples thereof include a benzene ring, a naphthalene ring, and a pyridine ring. In a case where $R^6$ and $R^7$ represent a boron complex obtained by introducing a substituted 5-membered nitrogen-containing heteroaryl ring, an infrared absorbing colorant having high fastness and high invisibility at the same time can be realized.

$R^8$ and $R^9$ have the same definitions and the same preferable ranges as those of the examples of the substituent of $R^2$ and $R^3$ in Formula (1).

X represents an oxygen atom, a sulfur atom, $-NR-$, or $-CRR'-$. R and R' each independently represent a hydrogen atom, an alkyl group having 1 to 10 carbon atoms, or an aryl group having 6 to 10 carbon atoms, and preferably represents a hydrogen atom, an alkyl group having 1 to 6 carbon atoms, or a phenyl group.

In a preferable combination in Formula (3), $R^{31a}$ and $R^{31b}$ each independently represent an alkyl group having 1 to 10 carbon atoms, a benzene ring, or a pyridine ring, $R^{32}$ represents a cyano group or an alkoxycarbonyl group, $R^6$ and $R^7$ are bonded to each other to form a benzene ring, a pyridine ring, a pyrazine ring, or a pyrimidine ring, $R^8$ and $R^9$ each independently represent an alkyl group having 1 to 6 carbon atoms, a phenyl group, or a naphthyl group, X represents an oxygen atom, a sulfur atom, —NR—, or —CRR'—, and R and R' each independently represent a hydrogen atom, an alkyl group having 1 to 6 carbon atoms, or a phenyl group. In a more preferable combination, both $R^{31a}$ and $R^{31b}$ represent an alkyl group having 1 to 10 carbon atoms or a benzene ring, $R^{32}$ represents a cyano group, $R^6$ and $R^7$ are bonded to each other to form a benzene ring or a pyridine ring, $R^8$ and $R^9$ each independently represent an alkyl group having 1 to 6 carbon atoms, a phenyl group, or a naphthyl group, and X represents an oxygen atom or a sulfur atom.

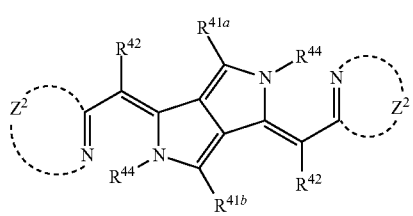

(4)

In Formula (4), $R^{41a}$ and $R^{41b}$ represent groups which are different from each other and represent an alkyl group having 1 to 20 carbon atoms, an aryl group having 6 to 20 carbon atoms, or a heteroaryl group having 3 to 20 carbon atoms. $R^{42}$ represents a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, or a nitrogen-containing heteroaryl group having 3 to 10 carbon atoms. $Z^2$ represents an atomic group which forms a nitrogen-containing 5- or 6-membered heterocycle with —C=N—, and examples of the nitrogen-containing heteroaryl ring include a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, a benzo fused ring or a naphtho fused ring thereof, or a fused ring complex thereof. $R^{44}$ represents a hydrogen atom, an alkyl group having 1 to 20 carbon atoms, an aryl group having 6 to 20 carbon atoms, a heteroaryl group having 4 to 20 carbon atoms, —$BR^{44A}R^{44B}$, or a metal atom, $R^{44}$ may form a covalent bond or a coordinate bond with a nitrogen-containing heterocycle formed by $Z^2$, and $R^{44A}$ and $R^{44B}$ each independently represent a hydrogen atom, a halogen atom, an alkyl group having 1 to 10 carbon atoms, an aryl group having 6 to 20 carbon atoms, or a heteroaryl group having 4 to 20 carbon atoms.

In Formula (4), $R^{41a}$ and $R^{41b}$ have the same definitions and the same preferable ranges as those of the examples described regarding $R^{1a}$ and $R^{1b}$ in Formula (1). In this case, $R^{41a}$ and $R^{41b}$ represent groups which are different from each other.

$R^{42}$ has the same definition and the same preferable range as $R^2$ in Formula (1).

$Z^2$ represents an atomic group which forms a nitrogen-containing 5- or 6-membered heterocycle with —C=N—, and examples of the nitrogen-containing heteroaryl ring include a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, a benzo fused ring or a naphtho fused ring thereof, or a fused ring complex thereof.

$R^{44}$ represents a hydrogen atom, an alkyl group having 1 to 20 carbon atoms, an aryl group having 6 to 20 carbon atoms, a heteroaryl group having 4 to 20 carbon atoms, a metal atom, or a substituent such as a halogen atom, an alkyl group having 1 to 10 carbon atoms, an aryl group having 6 to 20 carbon atoms, —$BR^{44A}R^{44B}$, or a metal atom, $R^{44}$ may form a covalent bond or a coordinate bond with a nitrogen-containing heterocycle formed by $Z^2$, and $R^{44A}$ and $R^{44B}$ each independently represent a hydrogen atom, a halogen atom, an alkyl group having 1 to 10 carbon atoms, an aryl group having 6 to 20 carbon atoms, or a heteroaryl group having 4 to 20 carbon atoms.

By introducing the groups represented by the $R^{41a}$ and $R^{41b}$ which are different from each other and introducing the nitrogen-containing 5- or 6-membered heterocycle which is formed by $Z^2$ and —C=N—, high fastness, high invisibility, excellent dispersibility, and high solubility in an organic solvent can be imparted.

In a preferable combination in Formula (4), $R^{41a}$ and $R^{41b}$ each independently represent an alkyl group having 1 to 10 carbon atoms, a benzene ring, or a pyridine ring, $R^{42}$ represents a cyano group, an alkyl or arylsulfinyl group having 1 to 10 carbon atoms, or an alkoxycarbonyl group, $Z^2$ and —C=N— form a thiazole ring, an oxazole ring, an imidazole ring, a thiadiazole ring, a triazole ring, a pyridine ring, a pyrimidine ring, a pyrazine ring, or a benzo fused ring or a naphtho fused ring thereof, $R^{44}$ represents a hydrogen atom, —$BR^{44A}R^{44B}$, a transition metal atom, magnesium, aluminum, calcium, barium, zinc, or tin. In a particularly preferable combination, $R^{41a}$ and $R^{41b}$ each independently represent an alkyl group having 1 to 10 carbon atoms or a benzene ring, $R^{42}$ represents a cyano group, $Z^2$ and —C=N— form a thiazole ring, an oxazole ring, an imidazole ring, a triazole ring, a pyridine ring, a pyrimidine ring, or a benzo fused ring or a naphtho fused ring thereof, and $R^{44}$ represents a hydrogen atom, —$BR^{44A}R^{44B}$(wherein $R^{44A}$ and $R^{44B}$ each independently represent an alkyl group having 1 to 10 carbon atoms, a benzene ring, a pyridine ring, or a thiophene ring), aluminum, zinc, vanadium, iron, copper, palladium, iridium, or platinum.

As the pyrrolopyrrole compound, a compound represented by the following Formula (5) is more preferable.

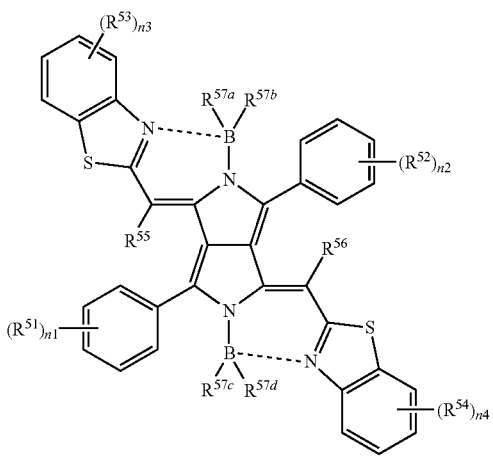

(5)

In Formula (5), $R^{51}$ to $R^{54}$ each independently represent a substituent.

$R^{55}$ and $R^{56}$ each independently represent a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, or a nitrogen-containing heteroaryl group having 3 to 10 carbon atoms.

$R^{57a}$ to $R^{57d}$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms.

n1 and n2 each independently represent an integer of 0 to 5.

n3 and n4 each independently represent an integer of 0 to 4.

Examples of the substituent represented by $R^{51}$ and $R^{52}$ include the substituents described above regarding the substituent T.

$R^{51}$ and $R^{52}$ each independently represent preferably an alkyl group, an aryl group, an alkoxy group, an aryloxy group, a heteroaryloxy group, a halogen atom, or a cyano group, more preferably an alkoxy group or an aryloxy group, and still more preferably an alkoxy group.

The number of carbon atoms in the alkyl group is preferably 1 to 30 and more preferably 1 to 20. The alkyl group may be linear, branched, or cyclic and is preferably linear or branched.

The number of carbon atoms in the aryl group or the aryloxy group is preferably 6 to 30 and more preferably 6 to 20.

The number of carbon atoms in the alkoxy group is preferably 1 to 30 and more preferably 1 to 20. The alkoxy group is preferably linear or branched and more preferably branched.

A heteroaryl ring included in the heteroaryloxy group is preferably a 5- or 6-membered ring. In addition, the heteroaryl ring is preferably a monocycle or a fused ring, more preferably, a monocycle or a fused ring composed of 2 to 8 rings, and still more preferably a monocycle or a fused ring composed of 2 to 4 rings. The number of heteroatoms constituting the heteroaryl ring is preferably 1 to 3 and more preferably 1 or 2. Examples of the heteroatom include a nitrogen atom, an oxygen atom, and a sulfur atom.

Examples of the substituent represented by $R^{53}$ and $R^{54}$ include the substituents described above regarding the substituent T.

$R^{53}$ and $R^{54}$ each independently represent preferably an alkyl group, an aryl group, an alkoxy group, an aryloxy group, a heteroaryloxy group, a halogen atom, or a cyano group.

$R^{55}$ and $R^{56}$ each independently represent preferably a cyano group, an acyl group having 1 to 6 carbon atoms, an alkoxycarbonyl group having 1 to 6 carbon atoms, an alkylsulfinyl group having 1 to 10 carbon atoms, an arylsulfinyl group having 6 to 10 carbon atoms, a nitrogen-containing heteroaryl group having 3 to 10 carbon atoms, or a cyano group.

$R^{57a}$ to $R^{57d}$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms, preferably an alkyl group having 1 to 10 carbon atoms or an aryl group having 6 to 20 carbon atoms, more preferably an aryl group having 6 to 20 carbon atoms, and still more preferably a phenyl group.

n1 and n2 each independently represent an integer of 0 to 5, preferably 0 to 3, more preferably 0 to 2, and still more preferably 1. In a more preferable combination, n1 and n2 represent 1, and $R^{51}$ and $R^{52}$ represent an alkoxy group.

n3 and n4 each independently represent an integer of 0 to 4 and preferably 0 to 2.

Specific examples of the compound represented by Formula (1) include the following compounds. In addition, other specific examples of the compound represented by Formula (1) include compounds described in paragraphs "0049" to "0058" of JP2009-263614A.

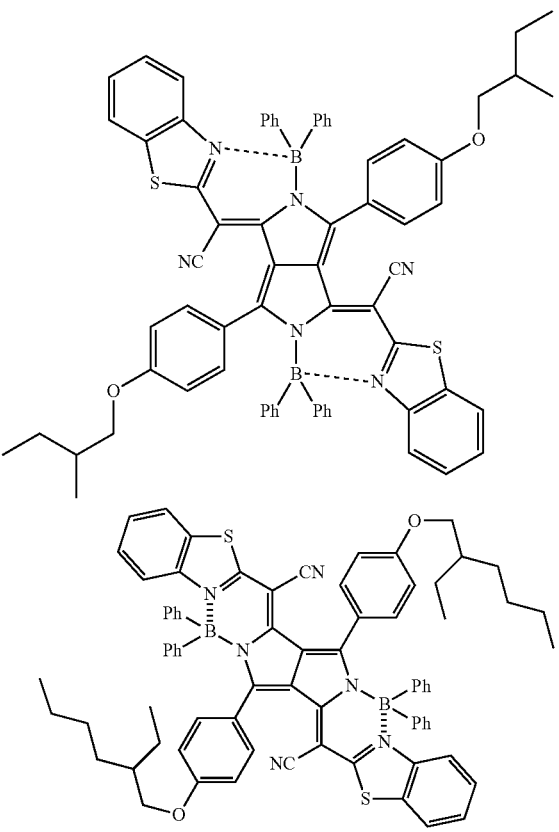

-continued

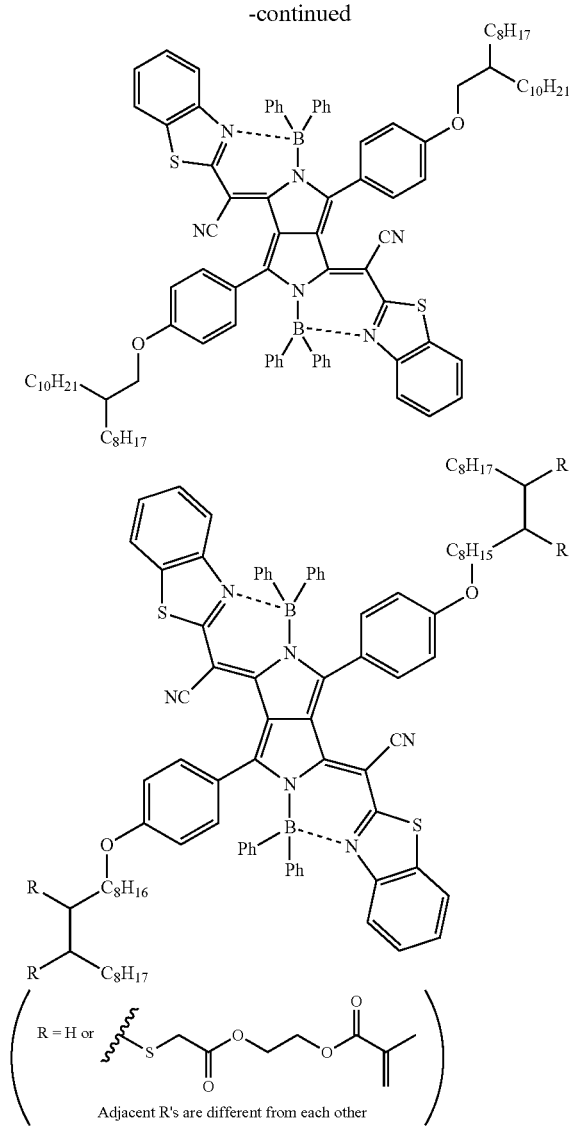

<<Composition for Forming Film Having Spectral Characteristics as Single-Layer Film>>

The single-layer film having the spectral characteristics can be formed using, for example, a composition that includes a visible light absorbing coloring material, an infrared absorber, and a resin and in which a ratio A/B of a minimum value A of an absorbance in a wavelength range of 400 to 830 nm to a maximum value B of an absorbance in a wavelength range of 1000 to 1300 nm is 4.5 or higher. The above-described ratio A/B is preferably 10 or higher, more preferably 15 or higher, and still more preferably 30 or higher.

The absorbance conditions may be satisfied using any means. For example, by adjusting the kinds and contents of the visible light absorbing coloring material and the infrared absorber, the conditions of the can be suitably satisfied.

An absorbance $A\lambda$ at a wavelength $\lambda$ is defined by the following Expression (1).

$$A\lambda = -\log(T\lambda) \quad (1)$$

$A\lambda$ represents the absorbance at the wavelength $\lambda$, and $T\lambda$ represents a transmittance at the wavelength $\lambda$.

In the present invention, a value of the absorbance may be a value measured in the form of a solution or a value of a film which is formed using the composition. In a case where the absorbance is measured in the form of the film, it is preferable that the film is formed by applying the composition to a glass substrate using a method such as spin coating such that the thickness of the dried film is a predetermined value, and drying the applied composition on a hot plate at 100° C. for 120 seconds. The thickness of the film can be obtained by measuring the thickness of the substrate including the film using a stylus surface profilometer (DEKTAK 150, manufactured by ULVAC Inc.).

In addition, the absorbance can be measured using a well-known spectrophotometer of the related art. Measurement conditions of the absorbance are not particularly limited. It is preferable that the maximum value B of the absorbance in a wavelength range of 1000 to 1300 nm is measured under conditions which are adjusted such that the minimum value A of the absorbance in a wavelength range of 400 to 830 nm is 0.1 to 3.0. By measuring the absorbance under the above-described conditions, a measurement error can be further reduced. A method of adjusting the minimum value A of the absorbance in a wavelength range of 400 to 830 nm to be 0.1 to 3.0 is not particularly limited. For example, in a case where the absorbance is measured in the form of the composition, for example, a method of adjusting the optical path length of a sample cell can be used. In addition, in a case where the absorbance is measured in the form of the film, for example, a method of adjusting the thickness of the film can be used.

A method of measuring the spectral characteristics and the thickness of the film is as follows.

The composition is applied to a glass substrate using a method such as spin coating such that the thickness of the dried film is a predetermined value and then is dried on a hot plate at 100° C. for 120 seconds.

The thickness of the film is obtained by measuring the thickness of the dried substrate including the film using a stylus surface profilometer (DEKTAK 150, manufactured by ULVAC Inc.).

The transmittance of the dried substrate including the film is measured in a wavelength range of 300 to 1300 nm using a spectrophotometer of an ultraviolet-visible-near infrared spectrophotometer (U-4100, manufactured by Hitachi High-Technologies Corporation).

<<<Visible Light Absorbing Coloring Material, Infrared Absorber>>>

It is preferable that the composition includes a visible light absorbing coloring material and an infrared absorber having a maximal absorption in a wavelength range of 750 to 950 nm.

Examples of the infrared absorber and a chromatic colorant include the colorants described regarding the first spectrally selective layer and the second spectrally selective layer, and preferable ranges thereof are also the same.

In particular, it is preferable that the visible light absorbing coloring material includes two or more chromatic colorants. In addition, the infrared absorber is preferably a pyrrolopyrrole compound and more preferably the compound represented by Formula (1).

The content of the infrared absorber is preferably 10 to 200 parts by mass, more preferably 20 to 150 parts by mass, and still more preferably 30 to 80 parts by mass with respect to 100 parts by mass of the visible light absorbing coloring material. As a result, the absorbance conditions of the composition can be suitably achieved.

The content of the infrared absorber in the composition is preferably 1 to 60 mass % and more preferably 10 to 40 mass % with respect to the total solid content of the composition.

In addition, in a case where the composition includes two or more chromatic colorants as the visible light absorbing coloring material, it is preferable that composition includes two or more chromatic colorants selected from the group consisting of a red colorant, a yellow colorant, a blue colorant, and a violet colorant. In addition, it is preferable that the composition includes a blue colorant and at least one colorant selected from a red colorant, a yellow colorant, and a violet colorant.

Among these, any one of the following aspects (1) to (3) is preferable.

(1) An aspect in which the composition includes a red colorant, a yellow colorant, a blue colorant, and a violet colorant (2) An aspect in which the composition includes a red colorant, a yellow colorant, and a blue colorant (3) An aspect in which the composition includes a yellow colorant, a blue colorant, and a violet colorant In a specific example of the aspect (1), the composition includes C.I. Pigment Red 254 as a red pigment, C.I. Pigment Yellow 139 as a yellow pigment, C.I. Pigment Blue 15:6 as a blue pigment, and C.I. Pigment Violet 23 as a violet pigment.

In a specific example of the aspect (2), the composition includes C.I. Pigment Red 254 as a red pigment, C.I. Pigment Yellow 139 as a yellow pigment, and C.I. Pigment Blue 15:6 as a blue pigment.

In a specific example of the aspect (3), the composition includes C.I. Pigment Yellow 139 as a yellow pigment, C.I. Pigment Blue 15:6 as a blue pigment, and C.I. Pigment Violet 23 as a violet pigment.

In a case where the composition includes a red colorant, a yellow colorant, a blue colorant, and a violet colorant as the chromatic colorants, it is preferable that a ratio of the mass of the red colorant is 0.1 to 0.6, a ratio of the mass of the yellow colorant is 0.1 to 0.4, a ratio of the mass of the blue colorant is 0.1 to 0.6, and a ratio of the mass of the violet colorant is 0.01 to 0.3 with respect to the total mass of the chromatic colorants. It is more preferable that a ratio of the mass of the red colorant is 0.2 to 0.5, a ratio of the mass of the yellow colorant is 0.1 to 0.3, a ratio of the mass of the blue colorant is 0.2 to 0.5, and a ratio of the mass of the violet colorant is 0.05 to 0.25 with respect to the total mass of the chromatic colorants.

In a case where the composition includes a red colorant, a yellow colorant, and a blue colorant as the chromatic colorants, it is preferable that a ratio of the mass of the red colorant is 0.2 to 0.7, a ratio of the mass of the yellow colorant is 0.1 to 0.4, and a ratio of the mass of the blue colorant is 0.1 to 0.6 with respect to the total mass of the chromatic colorants. It is more preferable that a ratio of the mass of the red colorant is 0.3 to 0.6, a ratio of the mass of the yellow colorant is 0.1 to 0.3, and a ratio of the mass of the blue colorant is 0.2 to 0.5 with respect to the total mass of the chromatic colorants.

In a case where the composition includes a yellow colorant, a blue colorant, and a violet colorant as the chromatic colorants, it is preferable that a ratio of the mass of the yellow colorant is 0.1 to 0.4, a ratio of the mass of the blue colorant is 0.1 to 0.6, and a ratio of the mass of the violet colorant is 0.2 to 0.7 with respect to the total mass of the chromatic colorants. It is more preferable that a ratio of the mass of the yellow colorant is 0.1 to 0.3, a ratio of the mass of the blue colorant is 0.2 to 0.5, and a ratio of the mass of the violet colorant is 0.3 to 0.6 with respect to the total mass of the chromatic colorants.

<<<Resin>>>

The composition may include a resin. The resin is mixed, for example, in order to disperse the visible light absorbing coloring material, the infrared absorber, and the like in the composition and to be used as a binder. The resin which is mainly used to disperse the visible light absorbing coloring material, the infrared absorber, and the like will also be called a dispersant. However, the above-described uses of the resin are merely exemplary, and the resin can be used for purposes other than the uses.

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher.

The content of the resin is preferably 10 to 80 mass % and more preferably 20 to 60 mass % with respect to the total solid content of the composition. The composition may include one resin or two or more resins. In a case where the composition includes two or more resins, it is preferable that the total content of the two or more resins is in the above-described range.

(Dispersant)

The composition may include a dispersant as a resin.

Examples of the dispersant include: a polymer dispersant such as a resin having an amine group (polyamideamine or a salt thereof), an oligo imine resin, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin condensate;

In terms of a structure, the polymer dispersant can be further classified into a linear polymer, a terminal-modified polymer, a graft polymer, and a block polymer.

In addition, as the polymeric dispersant, a resin having an acid value of 60 mgKOH/g or higher (more preferably 60 mgKOH/g or higher and 300 mgKOH/g or lower) can be preferably used.

Examples of the terminal-modified polymer include a polymer having a phosphate group at a terminal thereof described in JP1991-112992A (JP-H3-112992A) or JP2003-533455A, a polymer having a sulfonate group at a terminal thereof described in JP2002-273191A, and a polymer having a partial skeleton or a heterocycle of an organic colorant described in JP1997-77994A (JP-H9-77994A). In addition, polymers described in JP2007-277514A in which two or more anchor sites (for example, an acid group, a basic group, a partial skeleton or a heterocycle of an organic colorant) to a pigment surface are introduced into a terminal thereof are also preferable due to its dispersion stability.

Examples of the graft polymer include a reaction product of poly(low-alkylene imine) and polyester described in JP1979-37082A (JP-S54-37082A), JP1996-507960A (JP-H8-507960A), or JP2009-258668A, a reaction product of polyallylamine and polyester described in JP1997-169821A (JP-H9-169821A), a copolymer of a macromonomer and a nitrogen-containing monomer described in JP1998-339949A (JP-H10-339949A) or JP2004-37986A, a graft polymer having a partial skeleton or a heterocycle of an organic colorant described in JP2003-238837A, JP2008-9426A, or JP2008-81732A, and a copolymer of a macromonomer and an acid group-containing monomer described in JP2010-106268A.

As the macromonomer used for manufacturing the graft polymer by radical polymerization, a well-known macromonomer can be used, and examples thereof include macromonomers manufactured by Toagosei Co., Ltd. such as AA-6 (polymethyl methacrylate having a methacryloyl group as a terminal group), AS-6 (polystyrene having a methacryloyl group as a terminal group), AN-6S (a copolymer of styrene and acrylonitrile having a methacryloyl group as a terminal group), and AB-6 (polybutyl acrylate having a methacryloyl group as a terminal group); macromonomers manufactured by Daicel Corporation such as PLACCEL FM5 (an adduct of 2-hydroxyethyl methacrylate and 5 molar equivalents of ε-caprolactone) and FA10L (an adduct of 2-hydroxyethyl acrylate and 10 molar equivalents of ε-caprolactone); and a polyester macromonomer described in JP1990-272009A (JP-H2-272009A). Among these, from the viewpoint of the dispersibility and dispersion stability of the pigment dispersion and the developability of the composition in which the pigment dispersion is used, a polyester macromonomer having excellent flexibility and solvent compatibility is more preferable, and the polyester macromonomer described in JP1990-272009A (JP-H2-272009A) is most preferable.

As the block polymer, a block polymer described in JP2003-49110A or JP2009-52010A is preferable.

As the resin, a graft copolymer including a structural unit represented by any one of the following Formulae (1) to (4) can also be used.

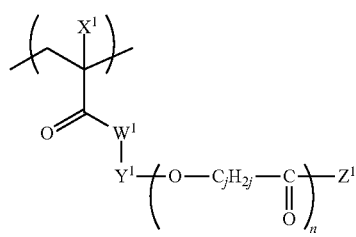

(1)

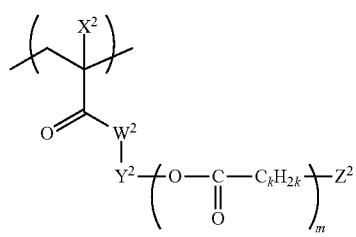

(2)

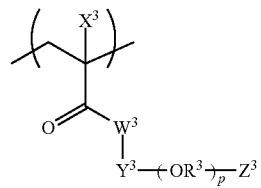

(3)

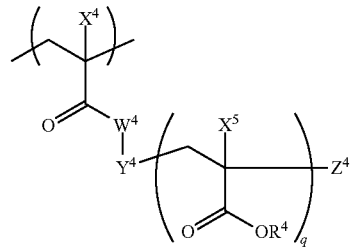

(4)

$X^1$, $X^2$, $X^3$, $X^4$, and $X^5$ each independently represent a hydrogen atom or a monovalent organic group, preferably a hydrogen atom or an alkyl group having 1 to 12 carbon atoms, more preferably a hydrogen atom or a methyl group, and still more preferably a methyl group.

$W^1$, $W^2$, $W^3$, and $W^4$ each independently represent an oxygen atom or NH and preferably an oxygen atom.

$R^3$ represents a branched or linear alkylene group (having preferably 1 to 10 carbon atoms and more preferably 2 or 3 carbon atoms). From the viewpoint of dispersion stability, it is preferable that $R^3$ represents a group represented by —$CH_2$—$CH(CH_3)$— or a group represented by —$CH(CH_3)$—$CH_2$—.

$Y^1$, $Y^2$, $Y^3$, and $Y^4$ each independently represent a divalent linking group, and a structure thereof is not particularly limited.

The graft copolymer can be found in the description of paragraphs "0025" to "0069 of JP2012-255128A, the content of which is incorporated herein by reference.

Specific examples of the graft copolymer are as follows. In addition, a resin described in paragraphs "0072" to "0094" of JP2012-255128A can be used.

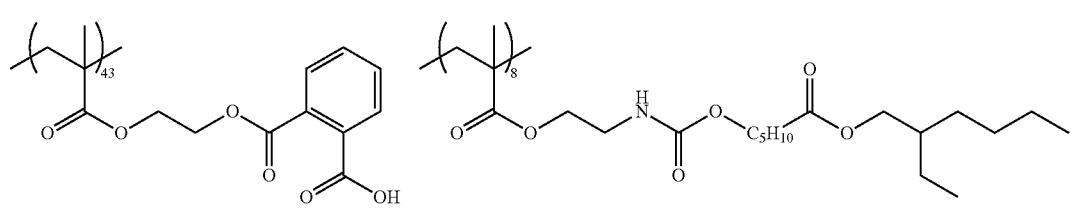

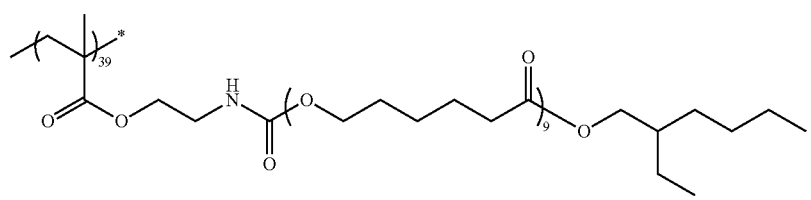

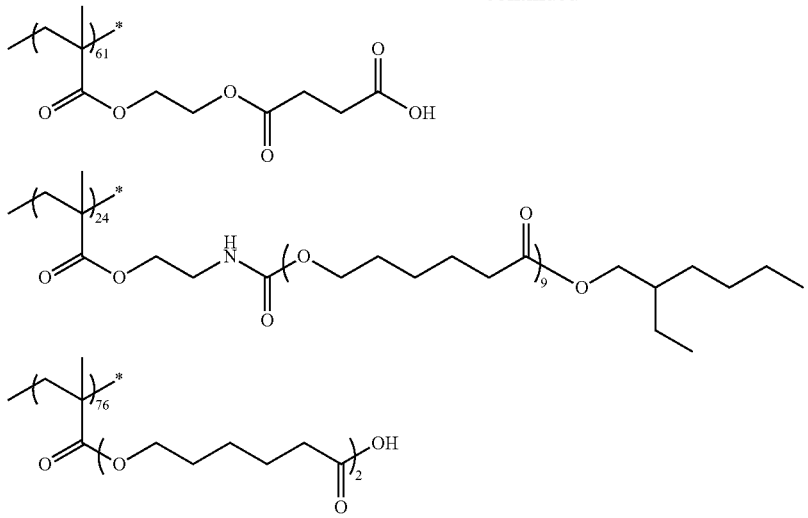

In addition, as the resin, an oligoimine dispersant having a nitrogen atom at at least either a main chain or a side chain can be used. As the oligoimine dispersant, a resin, which includes a structural unit having a partial structure X with a functional group (pKa: 14 or lower) and a side chain Y having 40 to 10000 atoms and has a basic nitrogen atom at at least either a main chain or a side chain, is preferable. The basic nitrogen atom is not particularly limited as long as it is a nitrogen atom exhibiting basicity.

Examples of the oligoimine dispersant include a dispersant including a structural unit represented by the following Formula (I-1), a structural unit represented by the following Formula (I-2), and/or a structural unit represented by the following Formula (I-2a).

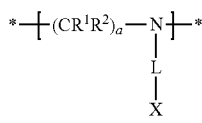  (I-1)

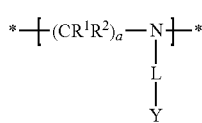  (I-2)

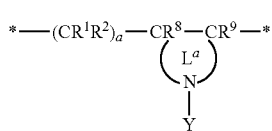  (I-2a)

$R^1$ and $R^2$ each independently represent a hydrogen atom, a halogen atom, or an alkyl group (having preferably 1 to 6 carbon atoms). a's each independently represent an integer of 1 to 5. * represents a linking portion between structural units.

$R^8$ and $R^9$ represent the same group as that of $R^1$.

L represents a single bond, an alkylene group (having preferably 1 to 6 carbon atoms), an alkenylene group (having preferably 2 to 6 carbon atoms), an arylene group (having preferably 6 to 24 carbon atoms), an heteroarylene group (having preferably 1 to 6 carbon atoms), an imino group (having preferably 0 to 6 carbon atoms), an ether group, a thioether group, a carbonyl group, or a linking group of a combination of the above-described groups. Among these, a single bond or —$CR^5R^6$—$NR^7$— (an imino group is present at the X or Y site) is preferable. Here, $R^5$ and $R^6$ each independently represent a hydrogen atom, a halogen atom, or an alkyl group (having preferably 1 to 6 carbon atoms). $R^7$ represents a hydrogen atom or an alkyl group having 1 to 6 carbon atoms.

$L^a$ is structural unit which forms a ring structure with $CR^8CR^9$ and N, preferably a structural unit which forms a nonaromatic heterocycle having 3 to 7 carbon atoms with $CR^8CR^9$ and a carbon atom, more preferably a structural unit which forms a nonaromatic 5- to 7-membered heterocycle with $CR^8CR^9$ and N (nitrogen atom), still more preferably a structural unit which forms a nonaromatic 5-membered heterocycle with $CR^8CR^9$ and N, and even still more preferably a structural unit which forms pyrrolidine with $CR^8CR^9$ and N. This structural unit may have a substituent such as an alkyl group.

X represents a group having a functional group (pKa: 14 or lower).

Y represents a side chain having 40 to 10000 atoms.

The dispersant (oligoimine dispersant) may further include one or more copolymerization components selected from the group consisting of the structural units represented by Formulae (I-3), (I-4), and (I-5). By the dispersant including the above-described structural units, the dispersion performance can be further improved.

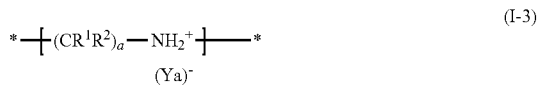  (I-3)

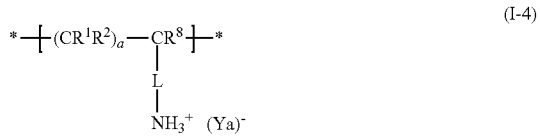  (I-4)

-continued

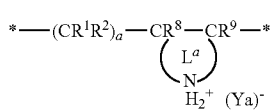
(I-5)

$R^1$, $R^2$, $R^8$, $R^9$, L, La, a, and * have the same definitions as those in Formulae (I-1), (I-2), and (I-2a).

Ya represents a side chain having 40 to 10000 atoms which has an anionic group. The structural unit represented by Formula (I-3) can be formed by adding an oligomer or a polymer having a group, which reacts with amine to form a salt, to a resin having a primary or secondary amino group at a main chain such that they react with each other.

The oligoimine dispersant can be found in the description of paragraphs "0102" to "0166" of JP2012-255128A, the content of which is incorporated herein by reference.

Specific examples of the oligoimine dispersant are as follows. In addition, a resin described in paragraphs "0168" to "0174" of JP2012-255128A can be used.

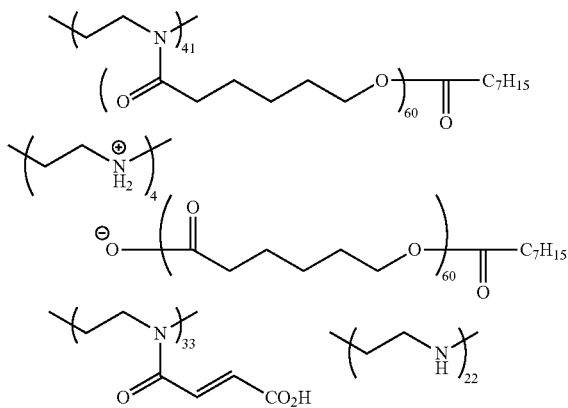

As the resin, a resin including a structural unit represented by the following Formula (P1) can be used. By using the following resin, the dispersibility of the infrared absorber (in particular, the pyrrolopyrrole compound represented by Formula (1)) can be further improved.

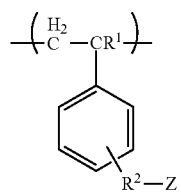
(P1)

In Formula (P1), $R^1$ represents a hydrogen atom or a methyl group, $R^2$ represents an alkylene group, and Z represents a nitrogen-containing heterocyclic structure.

The alkylene group represented by $R^2$ is not particularly limited, and examples thereof include a methylene group, an ethylene group, a trimethylene group, a tetramethylene group, a hexamethylene group, a 2-hydroxypropylene group, a methyleneoxy group, an ethyleneoxy group, a methyleneoxycarbonyl group, and a methylenethio group. Among these, a methylene group, a methyleneoxy group, a methyleneoxycarbonyl group, or a methylenethio group is more preferable.

Examples of the nitrogen-containing heterocyclic structure represented by Z include a structure including a pyridine ring, a pyrazine ring, a pyrimidine ring, a pyrrole ring, an imidazole ring, a triazole ring, a tetrazole ring, an indole ring, a quinoline ring, an acridine ring, a phenothiazine ring, a phenoxazine ring, an acridone ring, an anthraquinone ring, a benzimidazole structure, a benzotriazole structure, a benzothiazole structure, a cyclic amide structure, a cyclic urea structure, or a cyclic imide structure. Among these, as the nitrogen-containing heterocyclic structure represented by Z, a structure represented by the following Formula (P2) or (P3) is preferable.

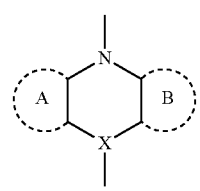
(P2)

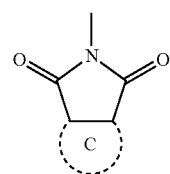
(P3)

In Formula (P2), X represents one selected from the group consisting of a single bond, an alkylene group (for example, a methylene group, an ethylene group, a propylene group, a trimethylene group, or a tetramethylene group) —O—, —S—, —NR—, and —C(=O)—. Here, R represents a hydrogen atom or an alkyl group. Examples of the alkyl group represented by R include a methyl group, an ethyl group, a n-propyl group, an i-propyl group, a n-butyl group, a t-butyl group, a n-hexyl group, a n-octyl group, a 2-ethylhexyl group, and a n-octadecyl group.

Among these, X represents preferably a single bond, a methylene group, —O—, or —C(=O)— and more preferably —C(=O)—.

In Formulae (P2) and (P3), ring A, ring B, and ring C each independently represent an aromatic ring. Examples of the aromatic ring include a benzene ring, a naphthalene ring, an indene ring, an azulene ring, a fluorene ring, an anthracene ring, a pyridine ring, a pyrazine ring, a pyrimidine ring, a pyrrole ring, an imidazole ring, an indole ring, a quinoline ring, an acridine ring, a phenothiazine ring, a phenoxazine ring, an acridone ring, and an anthraquinone ring. Among these, a benzene ring, a naphthalene ring, an anthracene ring, a pyridine ring, a phenoxazine ring, an acridine ring, a phenothiazine ring, an acridone ring, or an anthraquinone ring is preferable, and a benzene ring, a naphthalene ring, or a pyridine ring is more preferable.

Specific examples of the structural unit represented by Formula (P1) are as follows. In addition, specific examples of the structural unit can be found in paragraph "0023" of JP2008-009426A, the content of which is incorporated herein by reference.

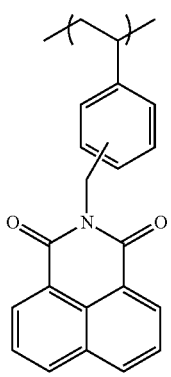

The resin including the structural unit represented by Formula (P1) may further include the structural unit represented by any one of Formulae (1) to (4) of the resin. In addition, the resin including the structural unit represented by Formula (P1) may further the structural unit represented by any one of Formulae (I-1), (I-2), (I-2a), (I-3), (I-4), and (I-5) of the resin.

Specific examples of the resin including the structural unit represented by Formula (P1) are as follows.

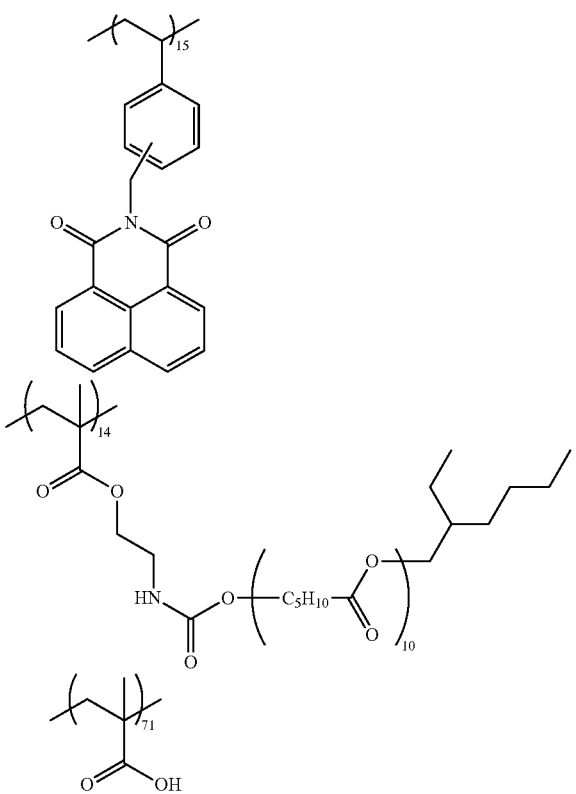

The resin is available as a commercially available product, and specific examples thereof include: "Disperbyk-101 (polyamideamine phosphate), 107 (carboxylate), 110, 111 (copolymer containing an acid group), 130 (polyamide), 161, 162, 163, 164, 165, 166, and 170 (high molecular weight copolymer)" and "BYK-P104, P105 (high molecular weight unsaturated polycarboxylic acid)" all of which are manufactured by BYK Chemie; "EFKA 4047, 4050 to 4010 to 4165 (polyurethane compound), EFKA 4330 to 4340 (block copolymer), 4400 to 4402 (modified polyacrylate), 5010 (polyester amide), 5765 (high molecular weight polycarboxylate), 6220 (fatty acid polyester), 6745 (phthalocyanine derivative), and 6750 (azo pigment derivative)" all of which are manufactured by EFKA; "AJISPER PB821, PB822, PB880, and PB881" all of which are manufactured by Ajinomoto Fine Techno Co., Inc.; "FLOWLEN TG-710 (urethane oligomer)" and "POLYFLOW No. 50E and No. 300 (acrylate copolymer)" all of which are manufactured by Kyoeisha Chemical Co., Ltd.; "DISPARLON KS-860, 873SN, 874, #2150 (aliphatic polycarboxylic acid), #7004 (polyether ester), DA-703-50, DA-705, and DA-725" all of which are manufactured by Kusumoto Chemicals Ltd.; "DEMOL RN, N (naphthalene sulfonic acid formalin polycondensate), MS, C, and SN-B (aromatic sulfonic acid formalin polycondensate)", "HOMOGENOL L-18 (high molecular polycarboxylic acid)", "EMULGEN 920, 930, 935, and 985 (polyoxyethylene nonylphenyl ether)", and "ACETAMIN 86 (stearylamine acetate)" all of which are manufactured by Kao Corporation; "SOLSPERSE 5000 (phthalocyanine derivative), 22000 (azo pigment derivative), 13240 (polyester amine), 3000, 17000, 27000 (polymer having a functional group at a terminal thereof), 24000, 28000, 32000, and 38500 (graft polymer)" all of which are manufactured by Lubrizol Corporation; "NIKKOL T106 (polyoxyethylene sorbitan monooleate) and MYS-IEX (polyoxyethylene monostearate)" all of which manufactured by Nikko Chemicals Co., Ltd.; "HINOACT T-8000E" manufactured by Kawaken Fine Chemicals Co., Ltd.; "organosiloxane polymer KP-341" manufactured by Shin-Etsu Chemical Co., Ltd.; "W001: cationic surfactant" manufactured by Yusho Co., Ltd.; nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters; anionic surfactants such as "W004, W005, and W017" all of which are manufactured by Yusho Co. Ltd.; polymeric dispersants such as "EFKA-46, EFKA-47, EFKA-47EA, EFKA POLYMER 100, EFKA POLYMER 400, EFKA POLYMER 401, and EFKA POLYMER 450" all of which are manufactured by Morishita Co., Ltd. and a polymer dispersant such as "DISPERSE AID 6, DISPERSE AID 8, DISPERSE AID 15, and DISPERSE AID 9100" all of which are manufactured by San Nopco Limited; "ADEKA PLURONIC L31, F38, L42, L44, L61, L64, F68, L72, P95, F77, P84, F87, P94, L101, P103, F108, L121, and P-123" all of which are manufactured by Adeka Corporation; and "IONET S-20" manufactured by Sanyo Chemical Industries Ltd.

Among these resins, one kind may be used alone, or two or more kinds may be used in combination. In the present invention, in particular, it is preferable that the pigment derivative described below and a polymeric dispersant are used in combination. In addition, regarding the resin, the terminal-modified polymer, the graft polymer, or the block polymer having an anchor site to a pigment surface may be used in combination with an alkali-soluble resin described below. Examples of the alkali-soluble resin include a (meth) acrylic acid copolymer, an itaconic acid copolymer, a crotonic acid copolymer, a maleic acid copolymer, a partially esterified maleic acid copolymer, an acidic cellulose derivative having a carboxylic acid at a side chain thereof, and a resin obtained by modifying a polymer having a hydroxyl group with an acid anhydride. Among these, a (meth)acrylic acid copolymer is preferable. In addition, an N-position-substituted maleimide monomer copolymer described in JP1998-300922A (JP-H10-300922A), an ether dimer copolymer described in JP2004-300204A, or an alkali-soluble resin having a polymerizable group described in JP1995-319161A (JP-H7-319161A) is also preferable.

The content of the dispersant is preferably 1 to 80 parts by mass, more preferably 5 to 70 parts by mass, and still more preferably 10 to 60 parts by mass with respect to 100 parts by mass of the pigment.

(Alkali-Soluble Resin)

It is preferable that the composition includes an alkali-soluble resin as the resin. By the composition including the alkali-soluble resin, developability and pattern formability is improved. The alkali-soluble resin can also be used as the dispersant or the binder.

The molecular weight of the alkali-soluble resin is not particularly limited, and the weight-average molecular weight (Mw) thereof is preferably 5000 to 100000. In addition, the number average molecular weight (Mn) of the alkali-soluble resin is preferably 1000 to 20000.

The alkali-soluble resin may be a linear organic polymer and can be appropriately selected from alkali-soluble resins having at least one group for promoting alkali solubility in a molecule (preferably a molecule having an acrylic copolymer or a styrene copolymer as a main chain).

As the alkali-soluble resin, from the viewpoint of heat resistance, a polyhydroxystyrene resin, a polysiloxane resin, an acrylic resin, an acrylamide resin, or an acryl/acrylamide copolymer resin is preferable, and from the viewpoint of controlling developability, an acrylic resin, an acrylamide resin, or an acryl/acrylamide copolymer resin is preferable.

Examples of the group for promoting alkali solubility (hereinafter, also referred to as an acid group) include a carboxyl group, a phosphate group, a sulfonate group, and a phenolic hydroxyl group. A group that is soluble in an organic solvent and is developable with a weakly alkaline aqueous solution is preferable, and (meth)acrylic acid is more preferable. Among these acid groups, one kind may be used alone, or two or more kinds may be used in combination.

During the preparation of the alkali-soluble resin, for example, a well-known radical polymerization method can be used. Polymerization conditions under which the alkali-soluble resin is prepared using a radical polymerization method, for example, the temperature, the pressure, the kind and amount of a radical initiator, and the kind of a solvent can be easily set by those skilled in the art and can also be experimentally set.

As the alkali-soluble resin, a polymer having a carboxylic acid at a side chain thereof is preferable, and examples thereof include: an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac type resin; an acidic cellulose derivative having a carboxyl group at a side chain thereof; and a resin obtained by adding an acid anhydride to a polymer having a hydroxyl group. In particular, a copolymer of (meth)acrylic acid and another monomer which is copolymerizable with the (meth)acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer copolymer described in JP1998-300922A (JP-H10-300922A) include N-phenylmaleimide and N-cyclohexylmaleimide. Among these monomers which are copolymerizable with the (meth)acrylic acid, one kind may be used alone, or two or more kinds may be used in combination.

In addition, in order to improve a crosslinking effect of the film, an alkali-soluble resin having a polymerizable group may be used. Examples of the polymerizable group include a meth(allyl) group and a (meth)acryloyl group. As the alkali-soluble resin having a polymerizable group, an alkali-soluble resin having a polymerizable group at a side chain thereof is preferable.

Examples of the alkali-soluble resin having a polymerizable group include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), BISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), EBECRYL 3800 (manufactured by Daicel-UCB Co., Ltd.), and ACRY-CURE RD-F8 (manufactured by Nippon Shokubai Co., Ltd.).

As the alkali-soluble resin, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxyethyl methacrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

In addition, as a commercially available product, for example, FF-426 (manufactured by Fujikura Kasei Co., Ltd.) can also be used.

As the alkali-soluble resin, a polymer (a) obtained by copolymerization of monomer components including a compound represented by the following Formula (ED1) and/or a compound represented by the following Formula (ED2) (hereinafter, these compounds will also be referred to as "ether dimer") is also preferable.

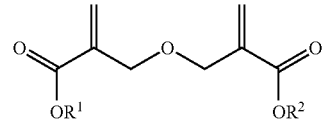

(ED1)

In Formula (ED1), $R^1$ and $R^2$ each independently represent a hydrogen atom or a hydrocarbon group having 1 to 25 carbon atoms which may have a substituent.

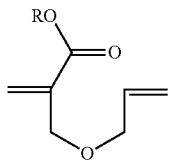

(ED2)

In Formula (ED2), R represents a hydrogen atom or an organic group having 1 to 30 carbon atoms. Specific examples of Formula (ED2) can be found in the description of JP2010-168539A The hydrocarbon group having 1 to 25 carbon atoms represented by $R^1$ and $R^2$ in Formula (ED1) which may have a substituent is not particularly limited, and examples thereof include a linear or branched alkyl group such as methyl, ethyl, n-propyl, isopropyl, n-butyl, isobutyl, tert-butyl, tert-amyl, stearyl, lauryl, or 2-ethylhexyl; an aryl group such as phenyl; an alicyclic group such as cyclohexyl, tert-butylcyclohexyl, dicyclopentadienyl, tricyclodecanyl, isobornyl, adamantyl, or 2-methyl-2-adamantyl; an alkyl group substituted with alkoxy such as 1-methoxyethyl or 1-ethoxyethyl; and an alkyl group substituted with an aryl group such as benzyl. Among these, a primary or secondary carbon substituent which is not likely to leave due to an acid or heat, for example, methyl, ethyl, cyclohexyl, or benzyl is preferable from the viewpoint of heat resistance.

Examples of the ether dimer can be found in paragraph "0317" of JP2013-29760A, the content of which is incorporated herein by reference. Among these ether dimers, one kind may be used alone, or two or more kinds may be used in combination. A structure derived from the compound represented by Formula (ED1) and/or Formula (ED2) may be copolymerized with other monomers.

The alkali-soluble resin may include a structural unit which is derived from a compound represented by the following Formula (X).

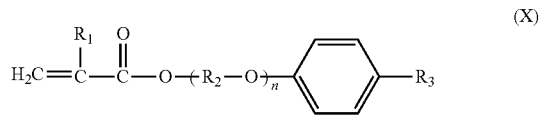

(X)

(In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms which may have a benzene ring, and n represents an integer of 1 to 15.)

In Formula (X), the number of carbon atoms in the alkylene group of $R_2$ is preferably 2 to 3. In addition, the number of carbon atoms in the alkyl group of $R_3$ is preferably 1 to 20 and more preferably 1 to 10, and the alkyl group of $R_3$ may have a benzene ring. Examples of the alkyl group having a benzene ring represented by $R_3$ include a benzyl group and a 2-phenyl(iso)propyl group.

Specific examples of the alkali-soluble resin are as follows.

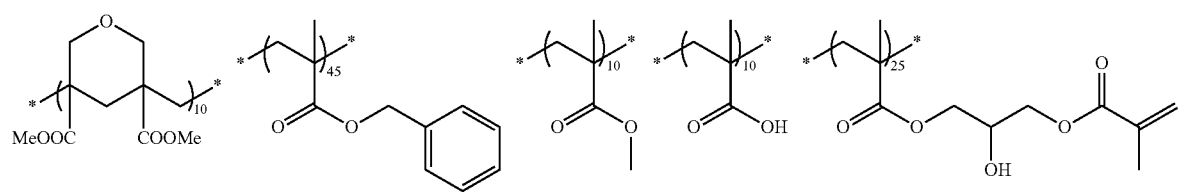

Mw = 12000

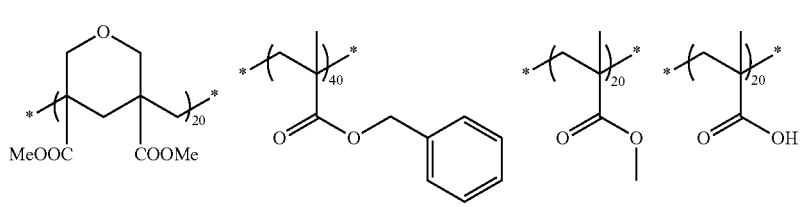

Mw = 17000

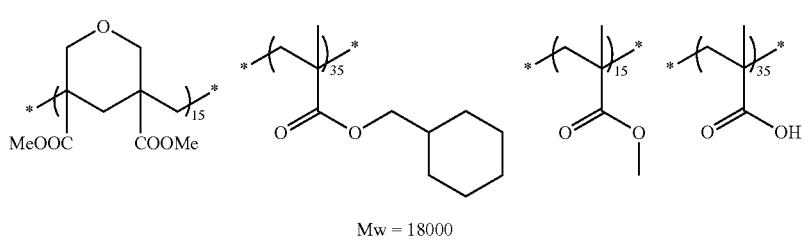

Mw = 18000

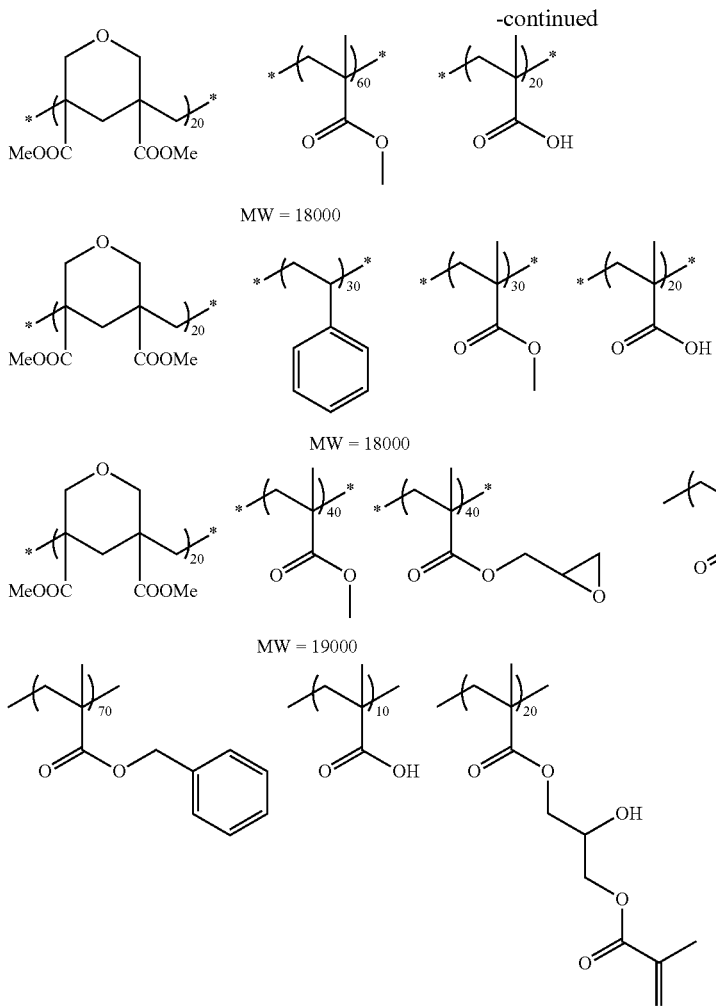

The details of the alkali-soluble resin can be found in paragraphs "0558" to "0571" of JP2012-208494A (corresponding to paragraphs "0685" to "0700" of US2012/0235099A), the content of which is incorporated herein by reference.

Further, a copolymer (B) described in paragraphs "0029" to "0063" and an alkali-soluble resin used in Examples of JP2012-32767A, a binder resin described in paragraphs "0088" to "0098" and a binder resin used in Examples of JP2012-208474A, a binder resin described in paragraphs "0022" to "0032 and a binder resin used in Examples of JP2012-137531A, a binder resin described in paragraphs "0132" to "0143" and a binder resin used in Examples of JP2013-024934A, a binder resin described in paragraphs "0092" to "0098" and Examples of JP2011-242752A, or a binder resin described in paragraphs "0030" to "0072" of JP2012-032770A can also be used. The contents of which are incorporated herein by reference.

The acid value of the alkali-soluble resin is preferably 30 to 500 mgKOH/g. The lower limit is more preferably 50 mgKOH/g or higher and still more preferably 70 mgKOH/g or higher. The upper limit is more preferably 400 mgKOH/g or lower, still more preferably 200 mgKOH/g or lower, even still more preferably 150 mgKOH/g or lower, and even yet still more preferably 120 mgKOH/g or lower.

The content of the alkali-soluble resin is preferably 0.1 to 50 mass % with respect to the total solid content of the composition. The lower limit is preferably 0.5 mass %% or higher, more preferably 1 mass % or higher, still more preferably 2 mass % or higher, and even still more preferably 3 mass % or higher. The upper limit is more preferably 30 mass % or lower, and still more preferably 10 mass % or lower. The composition according to the present invention may include one alkali-soluble resin or two or more alkali-soluble resins. In a case where the composition includes two or more alkali-soluble resins, it is preferable that the total content of the two or more resins is in the above-described range.

<<<Pigment Derivative>>>

The composition may include a pigment derivative. Examples of the pigment derivative include a compound having a structure in which a portion of a pigment is substituted with an acidic group, a basic group, or a phthalimidomethyl group. It is preferable that the pigment derivative has an acidic group or a basic group from the viewpoints of dispersibility and dispersion stability.

Examples of an organic pigment for forming the pigment derivative include a pyrrolopyrrole pigment, a diketo pyrrolopyrrole pigment, an azo pigment, a phthalocyanine pigment, an anthraquinone pigment, a quinacridone pigment, a dioxazine pigment, a perinone pigment, a perylene pigment, a thioindigo pigment, an isoindoline pigment, an isoindolinone pigment, a quinophthalone pigment, a threne pigment, and a metal complex pigment.

In addition, as the acidic group included in the pigment derivative, a sulfonic acid, a carboxylic acid, or a quaternary ammonium salt thereof is preferable, a carboxylate group or a sulfonate group is more preferable, and a sulfonate group is still more preferable. As the basic group included in the pigment derivative, an amino group is preferable, and a tertiary amino group is more preferable.

As the pigment derivative, a pyrrolopyrrole pigment derivative, a quinoline pigment derivative, a benzimidazolone pigment derivative, or an isoindoline pigment derivative, is preferable, and a pyrrolopyrrole pigment derivative is more preferable.

Specific examples of the pigment derivative are as follows.

In the present invention, the curable compound is preferably a polymerizable compound and more preferably a radically polymerizable compound.

(Polymerizable Compound)

In the present invention, the polymerizable compound may have any chemical form such as a monomer, a prepolymer, that is, a dimer, a trimer, or an oligomer, or a mixture or polymer thereof. Among these, a monomer is preferable.

The molecular weight of the polymerizable compound is preferably 100 to 3000. The upper limit is preferably 2000 or lower and more preferably 1500 or lower. The lower limit is 150 or higher and 250 or higher.

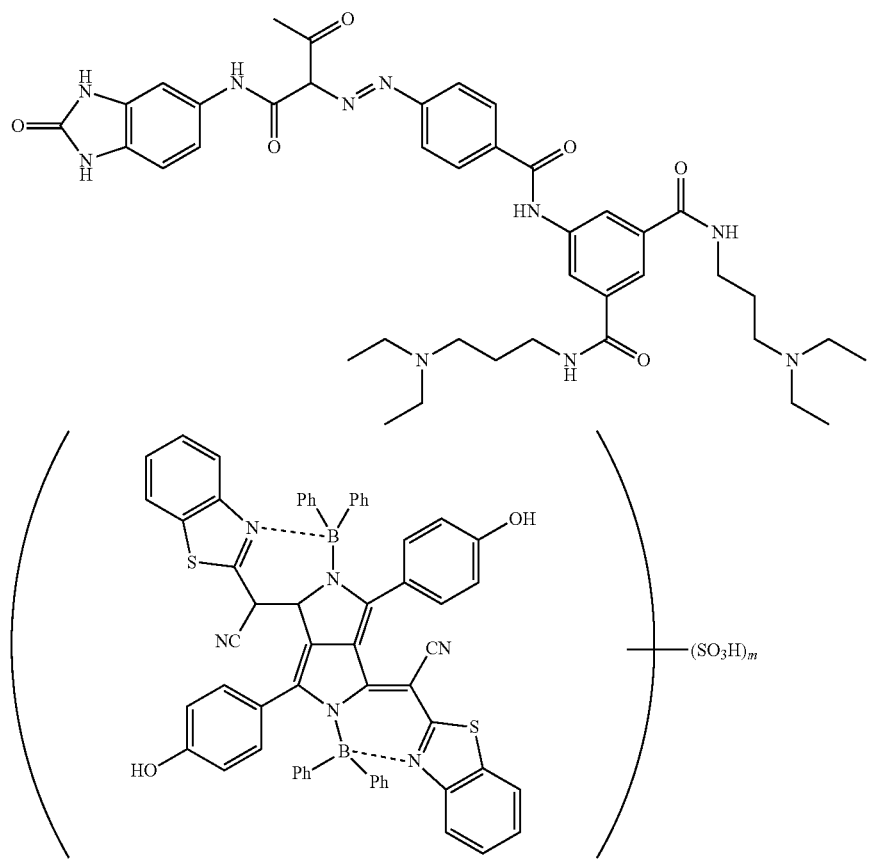

The content of the pigment derivative is preferably 1 to 50 mass % and more preferably 3 to 30 mass % with respect to the total mass of the pigments. Among these pigment derivatives, one kind may be used alone, or two or more kinds may be used in combination.

<<<Curable Compound>>>

It is preferable that the composition includes a curable compound. As the curable compound, a well-known compound which is crosslinkable by a radical, an acid, or heat can be used. Examples of the compound include a compound having a group having an ethylenically unsaturated bond, a cyclic ether (epoxy, oxetane) group, or a methylol group.

Examples of the group having an ethylenically unsaturated bond include a vinyl group, a meth(allyl) group, and a (meth)acryloyl group.

The polymerizable compound is preferably a (meth)acrylate compound having 3 to 15 functional groups and more preferably a (meth)acrylate compound having 3 to 6 functional groups.

Examples of the monomer and the prepolymer include an unsaturated carboxylic acid (for example, acrylic acid, methacrylic acid, itaconic acid, crotonic acid, isocrotonic acid, or maleic acid), an ester or amide of an unsaturated carboxylic acid, and a polymer thereof. Among these, an ester of an unsaturated carboxylic acid and an aliphatic polyhydric alcohol compound, an amide of an unsaturated carboxylic acid and an aliphatic polyamine compound, or a polymer thereof is preferable. In addition, for example, an adduct of an unsaturated carboxylic acid ester or amide having a nucleophilic substituent, such as a hydroxyl group, an amino group, or a mercapto group, with a monofunctional or polyfunctional isocyanate or epoxy, or a dehydrated condensate of an unsaturated carboxylic acid ester or amide having a nucleophilic substituent with a monofunctional or polyfunctional carboxylic acid is also preferably used. In addition, a reactant of an unsaturated carboxylic acid ester or amide having an electrophilic substituent such as an isocyanate group or an epoxy group with a monofunctional or polyfunctional alcohol, amine, or thiol, or a reactant of an unsaturated carboxylic acid ester or amide having a leaving substituent such as a halogen group or a tosyloxy group with a monofunctional or polyfunctional alcohol, amine, or thiol is also preferable. In addition, a group of compounds in which the unsaturated carboxylic acid is substituted with, for example, an unsaturated phosphonic acid, a vinylbenzene derivative such as styrene, vinyl ether, or allyl ether can also be used.

As specific examples of the compounds, compounds described in paragraphs "0095" to "0108" of JP2009-288705A can be preferably used in the present invention.

In the present invention, as the polymerizable compound, a compound having one or more ethylenically unsaturated groups and having a boiling point of 100° C. or higher under normal pressure is also preferable. Examples of the compound include compounds described in paragraph "0227" of JP2013-29760 and paragraphs "0254" to "0257" of JP2008-292970A, the content of which is incorporated herein by reference.

As the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E as a commercially available product; manufactured by Shin-Nakamura Chemical Co., Ltd.), and a structure (for example, SR454 or SR499; manufactured by Sartomer) in which these (meth)acryloyl group is bonded through an ethylene glycol or a propylene glycol residue is preferable. Oligomers of the above-described examples can be used. In addition, KAYARAD RP-1040 or DPCA-20 (manufactured by Nippon Kayaku Co., Ltd.) can also be used.

Hereinafter, a preferable aspect of the polymerizable compound will be described.

The polymerizable compound may have an acid group such as a carboxyl group, a sulfonate group, or a phosphate group. As the polymerizable compound having an acid group, an ester of an aliphatic polyhydroxy compound and an unsaturated carboxylic acid is preferable. A polymerizable compound having an acid group obtained by causing a nonaromatic carboxylic anhydride to react with an unreacted hydroxyl group of an aliphatic polyhydroxy compound is more preferable. In particular, it is still more preferable that, in this ester, the aliphatic polyhydroxy compound is pentaerythritol and/or dipentaerythritol. Examples of a commercially available product of the monomer having an acid group include M-305, M-510, and M-520 as polybasic acid-modified acrylic oligomer (manufactured by Toagosei Co., Ltd.).

The acid value of the polymerizable compound having an acid group is preferably 0.1 to 40 mgKOH/g and more preferably 5 to 30 mgKOH/g. In a case where the acid value of the polymerizable compound is 0.1 mgKOH/g or higher, development solubility is excellent. In a case where the acid value of the polymerizable compound is 40 mgKOH/g or lower, there are advantageous effects in manufacturing and handleability. Further, photopolymerization performance is excellent, and curing properties are excellent.

In addition, a compound having a caprolactone structure is also preferable as the polymerizable compound.

The compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. In particular, a compound having a caprolactone structure represented by the following Formula (Z-1) is preferable.

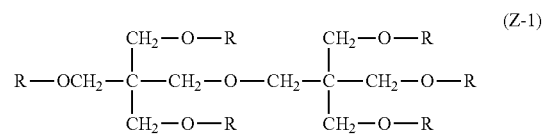

In Formula (Z-1), all of six R's represent a group represented by the following Formula (Z-2), or one to five R's among the six R's represent a group represented by the following Formula (Z-2) and the remaining R's represent a group represented by the following Formula (Z-3).

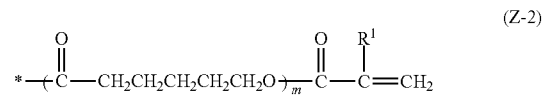

In Formula (Z-2), $R^1$ represents a hydrogen atom or a methyl group, m represents 1 or 2, and "*" represents a bonded site.

In Formula (Z-3), $R^1$ represents a hydrogen atom or a methyl group, and "*" represents a bonded site.

The polymerizable compound having a caprolactone structure is commercially available as for example, KAYARAD DPCA series (manufactured by Nippon Kayaku Co., Ltd.), and examples thereof include DPCA-20 (a compound in which m=1 in Formulae (Z-1) to (Z-3), the number of groups represented by Formula (Z-2)=2, and all of $R^1$'s represent a hydrogen atom), DPCA-30 (a compound in which m=1 in Formulae (Z-1) to (Z-3), the number of groups represented by Formula (Z-2)=3, and all of $R^1$'s represent a hydrogen atom), DPCA-60 (a compound in which m=1 in Formulae (Z-1) to (Z-3), the number of groups represented by Formula (Z-2)=6, and all of R's represent a hydrogen atom), and DPCA-120 (a compound in which m=2 in Formulae (Z-1) to (Z-3), the number of groups represented by Formula (Z-2)=6, and all of R's represent a hydrogen atom).

As the polymerizable compound, a compound represented by Formula (Z-4) or (Z-5) can be used.

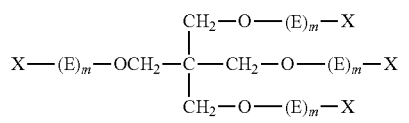
(Z-4)

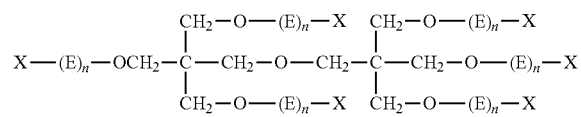
(Z-5)

In Formulae (Z-4) and (Z-5), E's each independently represent $-((CH_2)_yCH_2O)-$ or $-((CH_2)_yCH(CH_3)O)-$, y's each independently represent an integer of 0 to 10, and X's each independently represent a (meth)acryloyl group, a hydrogen atom, or a carboxyl group.

In Formula (Z-4), the total number of (meth)acryloyl groups is 3 or 4, m's each independently represent an integer of 0 to 10, and the sum of m's is an integer of 0 to 40.

In Formula (Z-5), the total number of (meth)acryloyl groups is 5 or 6, n's each independently represent an integer of 0 to 10, and the sum of n's is an integer of 0 to 60.

In Formula (Z-4), m represents preferably an integer of 0 to 6 and more preferably an integer of 0 to 4.

In addition, the sum of m's is preferably an integer of 2 to 40, more preferably an integer of 2 to 16, and still more preferably an integer of 4 to 8.

In Formula (Z-5), n represents preferably an integer of 0 to 6 and more preferably an integer of 0 to 4.

In addition, the sum of n's is preferably an integer of 3 to 60, more preferably an integer of 3 to 24, and still more preferably an integer of 6 to 12.

In addition, it is preferable that, in $-((CH_2)_yCH_2O)-$ or $-((CH_2)_yCH(CH_3)O)-$ of Formula (Z-4) or (Z-5), a terminal thereof on an oxygen atom side is bonded to X.

Among these compounds represented by Formula (Z-4) and (Z-5), one kinds may be used alone, or two or more kinds may be used in combination. In particular, it is preferable that all of six X's in Formula (Z-5) represent an acryloyl group.

In addition, the total content of the compound represented by Formula (Z-4) or (Z-5) in the polymerizable compound is preferably 20 mass % or higher and more preferably 50 mass % or higher.

The compound represented by Formula (Z-4) or (Z-5) can be synthesized through well-known steps of the related art including: a step of bonding a ring-opened skeleton using a ring-opening addition reaction between pentaerythritol or dipentaerythritol and ethylene oxide or propylene oxide; and a step of causing, for example, (meth)acryloyl chloride to react with a terminal hydroxyl group of the ring-opened skeleton to introduce a (meth)acryloyl group to the terminal hydroxyl group. The respective steps are well-known in the art, and those skilled in the art can easily synthesize the compound represented by Formula (Z-4) or (Z-5).

Among the compounds represented by Formula (Z-4) and (Z-5), a pentaerythritol derivative and/or a dipentaerythritol derivative is more preferable.

Specific examples of the pentaerythritol derivative and/or the dipentaerythritol derivative include compounds represented by the following Formulae (a) to (f) (hereinafter, also referred to as "Exemplary Compounds (a) to (f)"). Among these, Exemplary Compound (a), (b), (e), or (f) is preferable.

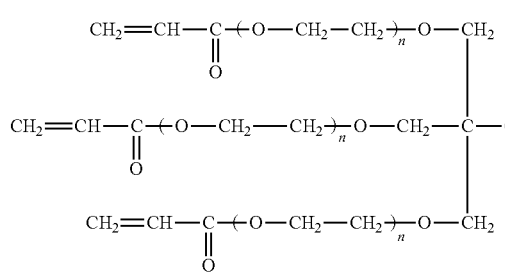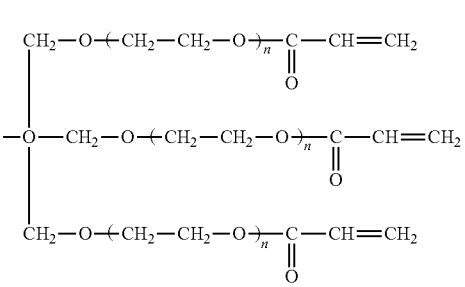

(a)

(The sum of n's is 6)

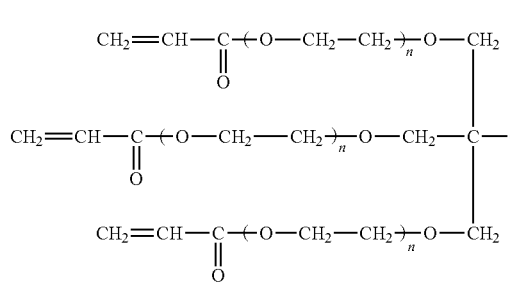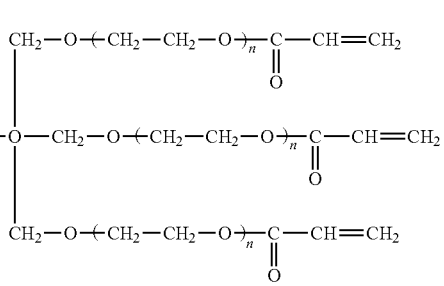

(b)

(The sum of n's is 12)

-continued

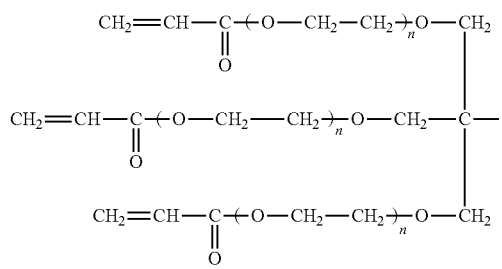
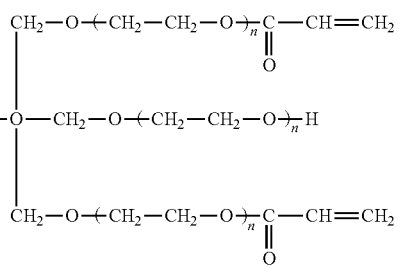

(c)

(The sum of n's is 12)

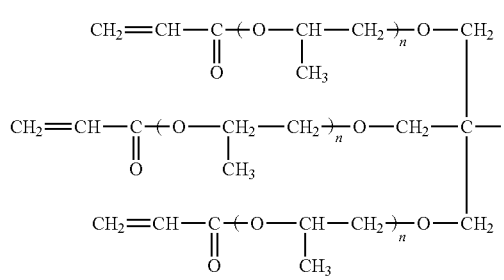
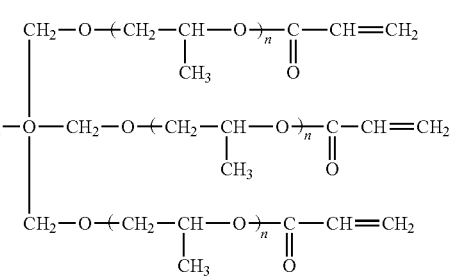

(d)

(The sum of n's is 6)

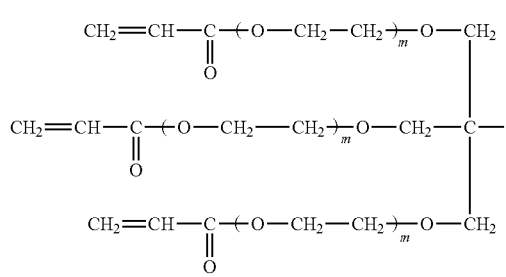

(e)

(The sum of m's is 4)

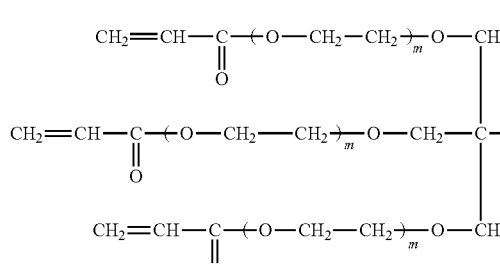

(f)

(The sum of m's is 12)

Examples of a commercially available product of the polymerizable compound represented by Formula (Z-4) or (Z-5) include SR-494 (manufactured by Sartomer) which is a tetrafunctional acrylate having four ethyleneoxy chains, DPCA-60 (manufactured by Nippon Kayaku Co., Ltd.) which is a hexafunctional acrylate having six pentyleneoxy chains, and TPA-330 (manufactured by Nippon Kayaku Co., Ltd.) which is a trifunctional acrylate having three isobutyleneoxy chains.

As the polymerizable compound, a urethane acrylate described in JP1973-41708B (JP-S48-41708B), JP1976-37193A (JP-S51-37193A), JP1990-32293B (JP-H2-32293B), or JP1990-16765B (JP-H2-16765B), or a urethane compound having a ethylene oxide skeleton described in JP1983-49860B (JP-S58-49860B), JP1981-17654B (JP-S56-17654B), JP1987-39417B (JP-S62-39417B), or JP1987-39418B (JP-S62-39418B) is also preferable. In addition, a curable composition having an excellent film speed can be obtained by using an addition-polymerizable compound having an amino structure or a sulfide structure in the molecules described in JP1988-277653A (JP-S63-277653A), JP1988-260909A (JP-S63-260909A), or JP1989-105238A (JP-H1-105238A).

Examples of a commercially available product of the polymerizable compound include URETHANE OLI-GOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

(Compound Having Epoxy Group)

In the present invention, as the curable compound, a compound having an epoxy group can also be used.

In a case where a pattern is formed using a dry etching method, a compound having an epoxy group is preferably used as the curable compound.

As the compound having an epoxy group, a compound having two or more epoxy groups in one molecule is preferable. By using the compound having two or more epoxy groups in one molecule, the effects of the present invention can be more effectively achieved. The number of epoxy groups in one molecule is preferably 2 to 10, more preferably 2 to 5, and still more preferably 3.

It is preferable that the compound having an epoxy group in the present invention has a structure in which two benzene rings are linked to each other through a hydrocarbon group. As the hydrocarbon group, an alkylene group having 1 to 6 carbon atoms is preferable.

In addition, it is preferable that the epoxy groups are linked to each other through a linking group. Examples of the linking group include an alkylene group, an arylene group, —O—, a structure represented by —NR'— (R' represents a hydrogen atom, an alkyl group which may have a substituent, or an aryl group which may have a substituent and preferably represents a hydrogen atom), and a group having at least one selected from —SO$_2$—, —CO—, —O—, and —S—.

In the compound having an epoxy group, an epoxy equivalent (=the molecular weight of the compound having an epoxy group/the number of epoxy groups) is preferably 500 g/eq or lower, more preferably 100 to 400 g/eq, and still more preferably 100 to 300 g/eq.

The compound having an epoxy group may be a low molecular weight compound (for example, molecule weight: 2000 or lower or 1000 or lower) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 3000 or lower, more preferably 2000 or lower, and still more preferably 1500 or lower.

As the compound having an epoxy group, compounds described in paragraphs "0034" to "0036" of JP2013-011869A, paragraphs "0147" to "0156" of JP2014-043556A, and paragraphs "0085" to "0092" of JP2014-089408A can also be used. The contents of which are incorporated herein by reference.

Examples of a commercially available product of the compound having an epoxy group include "EHPE3150" (manufactured by Daicel Corporation) and "EPICLON N660" (manufactured by DIC Corporation).

The content of the curable compound is preferably 0.1 to 40 mass % with respect to the total solid content of the composition. For example, the lower limit is preferably 0.5 mass % or higher and more preferably 1 mass % or higher. For example, the upper limit is more preferably 30 mass % or lower and still more preferably 20 mass % or lower. As the curable compound, one kind may be used alone, or two or more kinds may be used in combination. In a case where two or more curable compounds are used in combination, it is preferable that the total content of the curable compounds is in the above-described range.

<<<Polyfunctional Thiol Compound>>>

In order to promote a reaction of the polymerizable compound, the composition may include a polyfunctional thiol compound having two or more mercapto groups in a molecule. The polyfunctional thiol compound is preferably a secondary alkanethiol and more preferably a compound having a structure represented by the following Formula (T1).

Formula (T1)

(In Formula (T1), n represents an integer of 2 to 4, and L represents a divalent to tetravalent linking group.)

In Formula (T1), it is preferable that a linking group L is an aliphatic group having 2 to 12 carbon atoms, and it is more preferable that n represents 2 and L represents an alkylene group having 2 to 12 carbon atoms. Specific examples of the polyfunctional thiol compound include compounds represented by the following Structural Formulae (T2) to (T4). Among these, a compound represented by Structural Formula (T2) is preferable. Among these polyfunctional thiols compounds, one kind may be used alone, or two or more kinds may be used in combination.

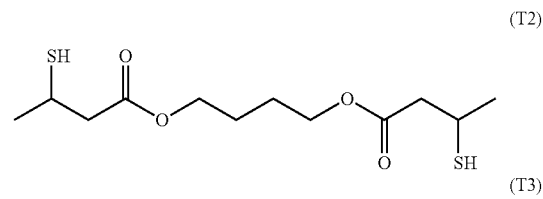

(T2)

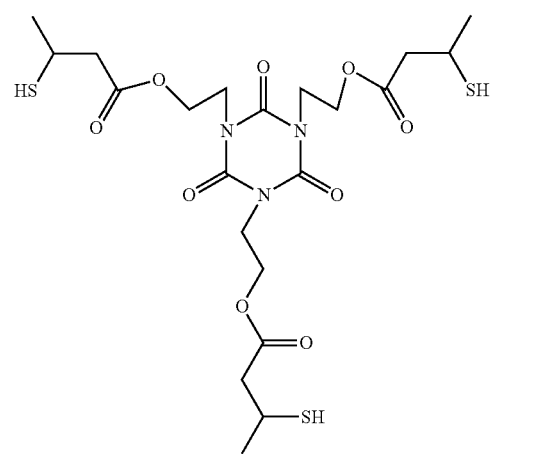

(T3)

(T4)

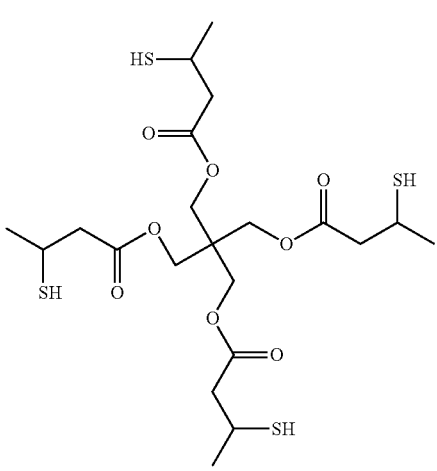

The content of the polyfunctional thiol compound is preferably 0.3 to 8.9 mass % and more preferably 0.8 to 6.4 mass % with respect to the total solid content of the composition. In addition, the polyfunctional thiol compound may be added in order to improve stability, odor, resolution, developability, adhesiveness, and the like.

<<<Photopolymerization Initiator>>>

It is preferable that the composition includes a photopolymerization initiator.

The photopolymerization initiator is not particularly limited as long as it has an ability to initiate the polymerization of the polymerizable compound, and can be selected from well-known photopolymerization initiators. For example, a photopolymerization initiator having photosensitivity to light rays in a range from the ultraviolet range to the visible range is preferable. In addition, the photopolymerization initiator may be an activator which causes an action with a photo-excited sensitizer to generate active radicals, or may be an initiator which initiates cation polymerization depending on the kinds of monomers.

In addition, it is preferable that the photopolymerization initiator at least one compound having a molar absorption coefficient of at least 50 in a range of about 300 nm to 800 nm (preferably 330 nm to 500 nm).

Examples of the photopolymerization initiator include: a halogenated hydrocarbon derivative (having, for example, a triazine skeleton or an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in Great German Patent No. 3337024, a compound described in J. Org. Chem.; 29, 1527 (1964) by F. C. Schaefer et al., a compound described in JP1987-58241A (JP-S62-58241A), a compound described in JP1993-281728A (JP-H5-281728A), a compound described in JP1993-34920A (JP-S5-34920A), and a compound described in U.S. Pat. No. 4,212,976A (for example, a compound having an oxadiazole skeleton).

In addition, from the viewpoint of exposure sensitivity, a compound selected from the group consisting of a trihalomethyltriazine compound, a benzyldimethylketanol compound, an α-hydroxy ketone compound, an α-amino ketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, and a halomethyl oxadiazole compound, a 3-aryl-substituted coumarin compound is preferable.

Among these, a trihalomethyltriazine compound, an α-amino ketone compound, an acylphosphine compound, a phosphine oxide compound, an oxime compound, a triarylimidazole dimer, an onium compound, a benzophenone compound, or an aminoacetophenone compound is more preferable, and at least one compound selected from the group consisting of a trihalomethyltriazine compound, an α-amino ketone compound, an oxime compound, a triarylimidazole dimer, and a benzophenone compound is still more preferable.

In particular, in a case where the film according to the present invention is used for a solid image pickup element, it is necessary to form a fine pattern in a sharp shape, and thus it is important to obtain excellent curing properties and perform development without a residue remaining in a non-exposed portion. From these viewpoint, it is more preferable that an oxime compound is used as the photopolymerization initiator. In particular, in a case where a fine pattern is formed in a solid image pickup element, a stepper is used for exposure for curing, and this exposure device may be damaged by halogen, and it is also necessary to reduce the addition amount of the photopolymerization initiator to be small. Therefore, in consideration of this point, it is more preferable that an oxime compound is used as the photopolymerization initiator for forming a fine pattern in a solid image pickup element or the like. In addition, by using the oxime compound, color transfer properties can be further improved.

Examples of the photopolymerization initiator can be found in paragraphs "0265" to "0268" of JP2013-29760A, the content of which is incorporated herein by reference.

As the photopolymerization initiator, a hydroxyacetophenone compound, an aminoacetophenone compound, or an acylphosphine compound can also be preferably used. More specifically, for example, an aminoacetophenone initiator described in JP1998-291969A (JP-H10-291969A) or an acylphosphine initiator described in JP4225898B can also be used.

As the hydroxyacetophenone initiator, for example, IRGACURE-184, DAROCUR-1173, IRGACURE-500, IRGACURE-2959, or IRAGACURE-127 (trade name, all of which are manufactured by BASF SE) can be used.

As the aminoacetophenone initiator, IRGACURE-907, IRGACURE-369, or IRGACURE-379EG (trade name, all of which are manufactured by BASF SE) which is a commercially available product can be used. As the aminoacetophenone initiator, a compound described in JP2009-191179A whose absorption wavelength is adjusted to match with that of a light source having a long wavelength of, for example, 365 nm or 405 nm can also be used.

As the acylphosphine initiator, IRGACURE-819, or DAROCUR-TPO (trade name, all of which are manufactured by BASF SE) which is a commercially available product can be used.

As the photopolymerization initiator, for example, an oxime compound is more preferable.

Specific examples of the oxime compound include a compound described in JP2001-233842A, a compound described in JP2000-80068A, and a compound described in JP2006-342166A.

Examples of the oxime compound which can be preferably used in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy) iminobutane-2-one, and 2-ethoxycarbonyloxyimino-1-phenylpropane-1-one.

In addition, examples of the oxime compound include a compound described in J.C.S. Perkin II (1979), pp. 1653-1660, J.C.S. Perkin II (1979), pp. 156-162 and Journal of Photopolymer Science and Technology (1995), pp. 202-232, or JP2000-66385A; and a compound described in JP2000-80068A, JP2004-534797A, or JP2006-342166A.

As a commercially available product of the oxime compound, IRGACURE-OXE01 (manufactured by BASF SE) and IRGACURE-OXE02 (manufactured by BASF SE) can also be preferably used. In addition, TR-PBG-304 (manufactured by Changzhou Tronly New Electronic Materials Co., Ltd.), and ADEKA ARKLS NCI-831 and ADEKA ARKLS NCI-930 (all of which are manufactured by ADEKA Corporation) can also be used.

In addition, in addition to the above-described oxime compounds, for example, a compound described in JP2009-519904A in which oxime is linked to a N-position of carbazole, a compound described in U.S. Pat. No. 7,626,957B in which a hetero substituent is introduced into the benzophenone site, a compound described in JP2010-15025A or US2009/292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having a maximal absorption at 405 nm and having excellent sensitivity to a light source of g-rays may be used.

Other preferable examples of the oxime compound can be found in paragraphs "0274" to "0275" of JP2013-29760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

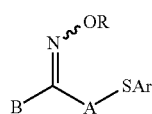

(OX-1)

In Formula (OX-1), R and B each independently represent a monovalent substituent, A represents a divalent organic group, and Ar represents an aryl group.

In Formula (OX-1), it is preferable that the monovalent substituent represented by R is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may have another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by B, an aryl group, a heterocyclic group, an arylcarbonyl group, or a heterocyclic carbonyl group is preferable.

These groups may have one or more substituents. Examples of the substituent are as described above.

In Formula (OX-1), as the divalent organic group represented by A, an alkylene group having 1 to 12 carbon atoms, a cycloalkylene group, or an alkynylene group is preferable. These groups may have one or more substituents. Examples of the substituent are as described above.

In the present invention, a compound represented by the following Formula (1) or (2) can also be used as the photopolymerization initiator.

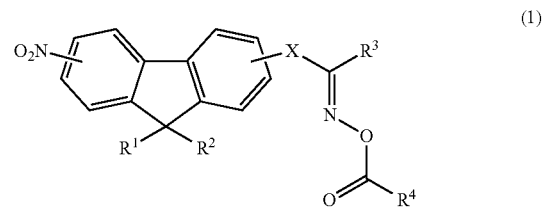

(1)

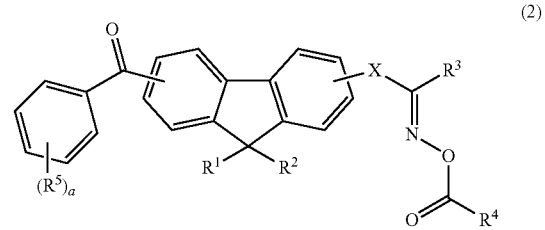

(2)

In Formula (1), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms; in a case where $R^1$ and $R^2$ represent a phenyl group, the phenyl groups may be bonded to each other to form a fluorene group; $R^3$ and $R^4$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms; and X represents a direct bond or a carbonyl group.

In Formula (2), $R^1$, $R^2$, $R^3$, and $R^4$ have the same definitions as those of $R^1$, $R^2$, $R^3$, and $R^4$ in Formula (1), $R^5$ represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, $R^6$ represents a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms, X represents a direct bond or a carbonyl group, and a represents an integer of 0 to 4.

In Formulae (1) and (2), it is preferable that $R^1$ and $R^2$ each independently represent a methyl group, an ethyl group, an n-propyl group, an i-propyl group, a cyclohexyl group, or a phenyl group. It is preferable that $R^3$ represents a methyl group, an ethyl group, a phenyl group, a tolyl group, or a xylyl group. It is preferable that $R^4$ represents an alkyl group having 1 to 6 carbon atoms or a phenyl group. It is preferable that $R^5$ represents a methyl group, an ethyl group, a phenyl group, a tolyl group, or a naphthyl group. It is preferable that X represents a direct bond.

Specific examples of the compounds represented by Formulae (1) and (2) include compounds described in paragraphs "0076" to "0079" of JP2014-137466A. The content is incorporated herein by reference.

The oxime compound preferably has a maximal absorption in a wavelength range of 350 nm to 500 nm, more preferably has an absorption wavelength in a wavelength range of 360 nm to 480 nm, and still more preferably has a high absorbance at 365 nm and 405 nm.

The molar absorption coefficient of the oxime compound at 365 nm or 405 nm is preferably 1000 to 300000, more preferably 2000 to 300000, and still more preferably 5000 to 200000 from the viewpoint of sensitivity.

The molar absorption coefficient of the compound can be measured using a well-known method. For example, the molar absorption coefficient of the compound can be measured using an ultraviolet-visible spectrophotometer (Cary-5 spectrophotometer, manufactured by Varian Medical Systems, Inc.) and an ethyl acetate solvent at a concentration of 0.01 g/L.

Hereinafter, specific examples of the oxime compound which are preferably used in the present invention are shown below, but the present invention is not limited thereto.

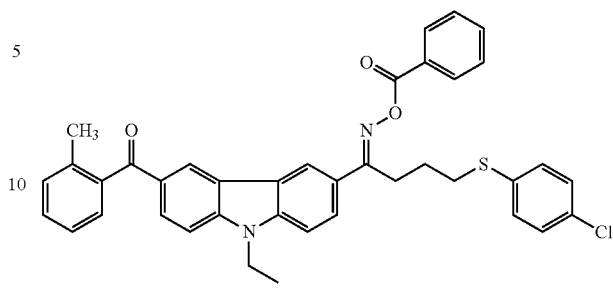

(C-4)

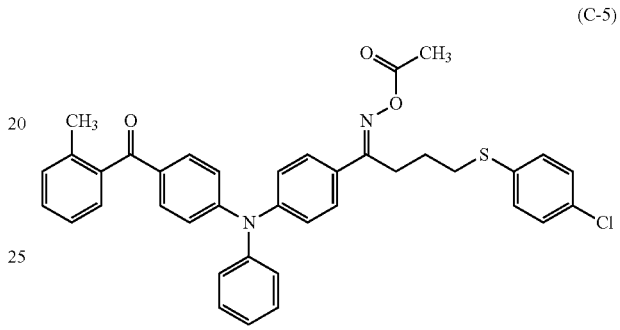

(C-5)

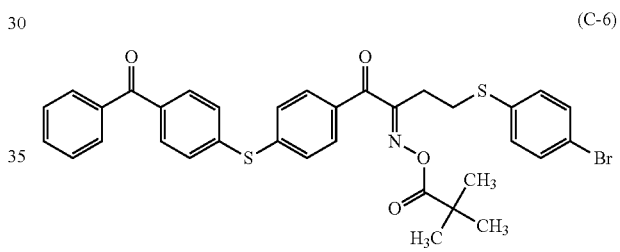

(C-6)

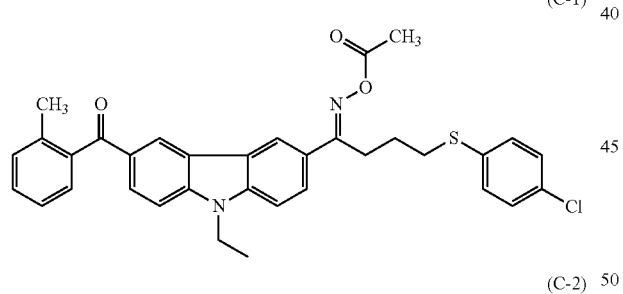

(C-1)

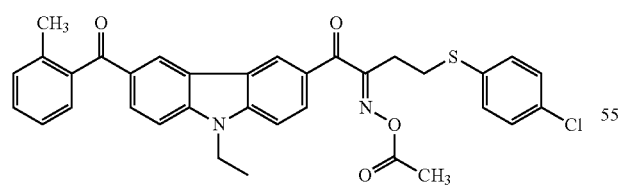

(C-2)

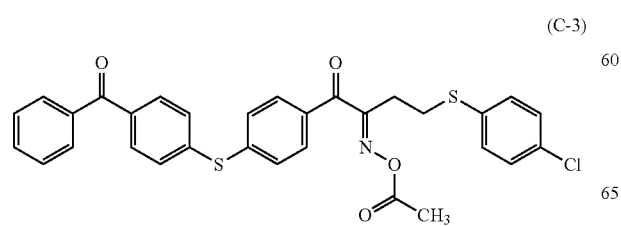

(C-3)

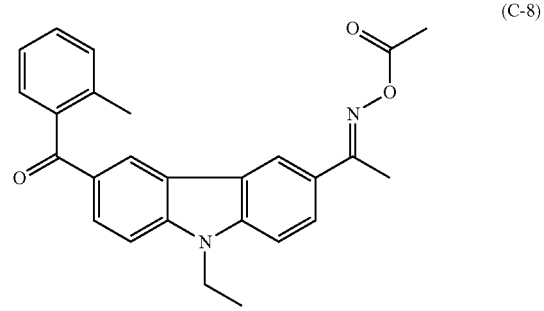

(C-7)

(C-8)

-continued

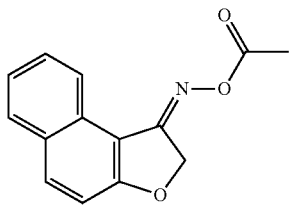
(C-9)

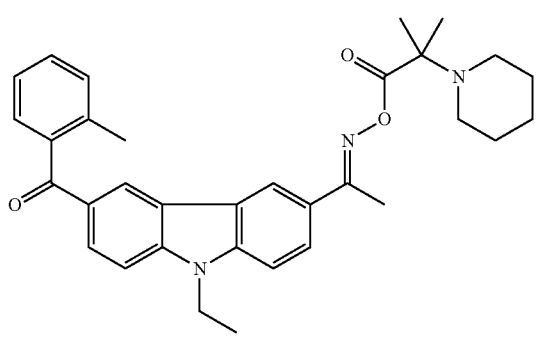
(C-10)

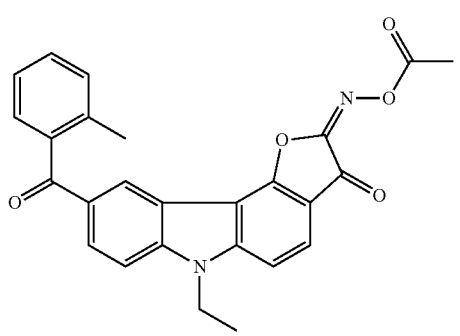
(C-11)

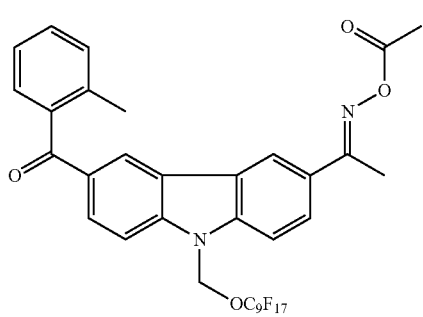
(C-12)

In the present invention, as the photopolymerization initiator, an oxime ester photopolymerization initiator containing a fluorine atom (hereinafter, also referred to as "fluorine-containing oxime ester photopolymerization initiator") can also be used. By using the fluorine-containing oxime ester photopolymerization initiator, the composition can be cured with a low exposure dose. Therefore, even in a case where the film according to the present invention is formed through, for example, a low-temperature process, the composition can be sufficiently cured with a low exposure dose. Therefore, during patterning, elution and the like of the visible light absorbing coloring material and the infrared absorber can be suppressed, and a film having excellent spectral characteristics can be obtained with a low exposure dose.

In the present invention, the fluorine-containing oxime ester photopolymerization initiator is preferably a compound having a maximal absorption in a wavelength range of 350 to 500 nm, more preferably a compound having an absorption wavelength in a wavelength range of 360 to 480 nm, and still more preferably a compound having a high absorbance of 365 nm.

The molar absorption coefficient of the fluorine-containing oxime ester photopolymerization initiator at 365 nm is preferably 1000 to 300000, more preferably 2000 to 300000, and still more preferably 5000 to 200000 from the viewpoint of sensitivity.

The molar absorption coefficient of the compound can be measured using a well-known method. For example, the molar absorption coefficient of the compound can be measured using an ultraviolet-visible spectrophotometer (Cary-5 spectrophotometer, manufactured by Varian Medical Systems, Inc.) and an ethyl acetate solvent at a concentration of 0.01 g/L.

It is preferable that the fluorine-containing oxime ester photopolymerization initiator includes a group containing a fluorine atom. As the group containing a fluorine atom, an alkyl group containing a fluorine atom (hereinafter, also referred to as "fluorine-containing alkyl group") and/or a group (hereinafter, also referred to as "fluorine-containing group") which contains an alkyl group containing a fluorine atom is preferable.

As the fluorine-containing group, at least one group selected from the group consisting of $-OR^{X11}$, $-SR^{X11}$, $-COR^{X11}$, $-COOR^{X11}$, $-OCOR^{X11}$, $-NR^{X11}R^{X12}$, $-NHCOR^{X11}$, $-CONR^{X11}R^{X12}$, $-NHCONR^{X11}R^{X12}$, $-NHCOOR^{X11}$, $-SO_2R^{X11}$, $-SO_2OR^{X11}$, and $-NHSO_2R^{X11}$ is preferable. $R^{X11}$ represents a fluorine-containing alkyl group, and $R^{X12}$ represents a hydrogen atom, an alkyl group, a fluorine-containing alkyl group, an aryl group, or a heterocyclic group. As the fluorine-containing group, $-OR^{X11}$ is more preferable.

As the group containing a fluorine atom, a fluorine-containing alkyl group and/or $-OR^{X11}$ is preferable.

It is preferable that the group containing a fluorine atom has a terminal structure represented by the following Formula (1) or (2). In the formula, * represents a bonded site.

$$*-CHF_2 \quad (1)$$

$$*-CF_3 \quad (2)$$

Regarding the fluorine-containing oxime ester photopolymerization initiator, the total number of fluorine atoms in the compound is preferably 3 or more and more preferably 4 to 10.

The number of carbon atoms in the alkyl group and the fluorine-containing alkyl group is preferably 1 to 20, more preferably 1 to 15, still more preferably 1 to 10, and even still more preferably 1 to 4. The alkyl group and the fluorine-containing alkyl group may be linear, branched, or cyclic and is preferably linear or branched.

The substitution ratio of the fluorine-containing alkyl group with fluorine atoms is preferably 40% to 100%, more preferably 50% to 100%, and still more preferably 60 to 100%. The substitution ratio with fluorine atoms denotes a ratio (%) of the number of hydrogen atoms substituted with fluorine atoms to the total number of hydrogen atoms in the alkyl group.

The number of carbon atoms in the aryl group is preferably 6 to 20, more preferably 6 to 15, and still more preferably 6 to 10. The aryl group may be a monocycle or a fused ring.

It is preferable that the heterocyclic group is a 5- or 6-membered ring. The heterocyclic group may be a monocycle or a fused ring. The number of rings composing the fused ring is preferably 2 to 8, more preferably 2 to 6, still more preferably 3 to 5, and even still more preferably 3 or 4. The number of carbon atoms constituting the heterocyclic group is preferably 3 to 40, more preferably 3 to 30, and still more preferably 3 to 20. The number of heteroatoms constituting the heterocyclic group is preferably 1 to 3. The heteroatoms constituting the heterocyclic group are preferably a nitrogen atom, an oxygen atom, or a sulfur atom and more preferably a nitrogen atom.

In the present invention, for example, a compound represented by the following Formula (1a) is used as the fluorine-containing oxime ester photopolymerization initiator.

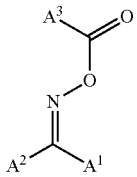

(1a)

In Formula (1a), $A^1$ and $A^2$ each independently represent an alkyl group, an acyl group, an aryl group, or a heterocyclic group, $A^3$ represents an alkyl group, an aryl group, or a heterocyclic group, and at least one of $A^1$ to $A^3$ includes a fluorine atom.

$A^1$ represents an alkyl group, an acyl group, an aryl group, or a heterocyclic group, preferably an aryl group or a heterocyclic group, and more preferably a heterocyclic group.

The number of carbon atoms in the alkyl group is preferably 1 to 20, more preferably 1 to 15, still more preferably 1 to 10, and even still more preferably 1 or 4. The alkyl group may be linear, branched, or cyclic and is preferably linear or branched.

The number of carbon atoms in the acyl group is preferably 2 to 20 and more preferably 2 to 15. Examples of the acyl group include an acetyl group and a benzoyl group.

The number of carbon atoms in the aryl group is preferably 6 to 20, more preferably 6 to 15, and still more preferably 6 to 10. The aryl group may be a monocycle or a fused ring.

It is preferable that the heterocyclic group is a 5- or 6-membered ring. The heterocyclic group may be a monocycle or a fused ring. The number of rings composing the fused ring is preferably 2 to 8, more preferably 2 to 6, still more preferably 3 to 5, and even still more preferably 3 or 4. The number of carbon atoms constituting the heterocyclic group is preferably 3 to 40, more preferably 3 to 30, and still more preferably 3 to 20. The number of heteroatoms constituting the heterocyclic group is preferably 1 to 3. The heteroatoms constituting the heterocyclic group are preferably a nitrogen atom, an oxygen atom, or a sulfur atom and more preferably a nitrogen atom.

The group represented by $A^1$ may have a substituent or may be unsubstituted. Examples of the substituent include an alkyl group, an aryl group, a heterocyclic group, a nitro group, a cyano group, a halogen atom, $-OR^{X1}$, $-SR^{X1}$, $-COR^{X1}$, $-COOR^{X1}$, $-OCOR^{X1}$, $-NR^{X1}R^{X2}$, $-NHCOR^{X1}$, $-CONR^{X1}R^{X2}$, $-NHCONR^{X1}R^{X2}$, $-NHCOOR^{X1}$, $-SO_2R^{X1}$, $-SO_2OR^{X1}$, and $-NHSO_2R^{X1}$. $R^{X1}$ and $R^{X2}$ each independently represent a hydrogen atom, an alkyl group, an aryl group, or a heterocyclic group.

Examples of the halogen atom include a fluorine atom, a chlorine atom, a bromine atom, and an iodine atom. In particular, a fluorine atom is preferable.

The number of carbon atoms in the alkyl group as the substituent and the alkyl group represented by $R^{X1}$ and $R^{X2}$ is preferably 1 to 20. The alkyl group may be linear, branched, or cyclic and is preferably linear or branched. At least a portion or all of the hydrogen atoms in the alkyl group may be substituted with halogen atoms (preferably fluorine atoms). In addition, at least a portion or all of the hydrogen atoms in the alkyl group may be substituted with the above-described substituent.

The number of carbon atoms in the aryl group as the substituent and the aryl group represented by $R^{X1}$ and $R^{X2}$ is preferably 6 to 20, more preferably 6 to 15, and still more preferably 6 to 10. The aryl group may be a monocycle or a fused ring. In addition, at least a portion or all of the hydrogen atoms in the aryl group may be substituted with the above-described substituent.

The heterocyclic group as the substituent and the heterocyclic group represented by $R^{X1}$ and $R^{X2}$ are preferably a 5- or 6-membered ring. The heterocyclic group may be a monocycle or a fused ring. The number of carbon atoms constituting the heterocyclic group is preferably 3 to 30, more preferably 3 to 18, and still more preferably 3 to 12. The number of heteroatoms constituting the heterocyclic group is preferably 1 to 3. It is preferable that the heteroatoms constituting the heterocyclic group are a nitrogen atom, an oxygen atom, or a sulfur atom. In addition, at least a portion or all of the hydrogen atoms in the heterocyclic group may be substituted with the above-described substituent.

$A^2$ represents an alkyl group, an acyl group, an aryl group, or a heterocyclic group, preferably an alkyl group or an aryl group, and more preferably an aryl group. The alkyl group, the acyl group, the aryl group, and the heterocyclic group have the same definitions as those described regarding $A^1$. These groups may be unsubstituted or may have a substituent. It is preferable that the groups have a substituent.

Examples of the substituent include the substituents described regarding $A^1$. As the substituent, an alkyl group, $-OR^{X1}$, or a halogen atom is preferable. $R^{X1}$ represents a hydrogen atom, an alkyl group, an aryl group, or a heterocyclic group and preferably an alkyl group. It is preferable that at least a portion or all of the hydrogen atoms in the alkyl group as the substituent and the alkyl group represented by $R^{X1}$ are substituted with fluorine atoms.

$A^3$ represents an alkyl group, an aryl group, or a heterocyclic group and preferably an alkyl group or an aryl group. These groups may be unsubstituted or may have a substituent. Examples of the substituent include the substituents described regarding $A^1$.

The fluorine-containing oxime ester photopolymerization initiator is preferably a compound represented by the following Formula (1).

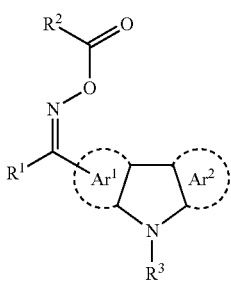

(1)

In Formula (1), $Ar^1$ and $Ar^2$ each independently represent an aromatic hydrocarbon ring which may have a substituent, $R^1$ represents an aryl group which has a group containing a fluorine atom, and $R^2$ and $R^3$ each independently represent an alkyl group or an aryl group.

In Formula (1), $Ar^1$ and $Ar^2$ each independently represent an aromatic hydrocarbon ring which may have a substituent.

The aromatic hydrocarbon ring may be a monocycle or a fused ring. The number of carbon atoms constituting the aromatic hydrocarbon ring is preferably 6 to 20, more preferably 6 to 15, and still more preferably 6 to 10. As the aromatic hydrocarbon ring, a benzene ring or a naphthalene ring is preferable. In particular, it is preferable that at least one of $Ar^1$ or $Ar^2$ represents a benzene ring, and it is more preferable that $Ar^1$ represents a benzene ring. $Ar^1$ represents preferably a benzene ring or a naphthalene ring, and more preferably a naphthalene ring.

Examples of the substituent which may be included in $Ar^1$ and $Ar^2$ include the substituents described regarding $A^1$.

It is preferable that the $Ar^1$ is unsubstituted. Ar1 may be unsubstituted or may have a substituent. As the substituent, —$COR^{X1}$ is preferable. $R^{X1}$ represents preferably an alkyl group, an aryl group, or a heterocyclic group, and more preferably an aryl group. The aryl group may have a substituent or may be unsubstituted. Examples of the substituent include an alkyl group having 1 to 10 carbon atoms.

$R^1$ represents an aryl group which has a group containing a fluorine atom.

The number of carbon atoms in the aryl group is preferably 6 to 20, more preferably 6 to 15, and still more preferably 6 to 10. The aryl group may be a monocycle or a fused ring.

As the group containing a fluorine atom, an alkyl group containing a fluorine atom (fluorine-containing alkyl group) and/or a group (fluorine-containing group) which contains an alkyl group containing a fluorine atom is preferable.

As the fluorine-containing group, at least one group selected from the group consisting of —$OR^{X11}$, —$SR^{X11}$, —$COR^{X11}$, —$COOR^{X11}$, —$OCOR^{X11}$, —$NR^{X11}R^{X12}$, —$NHCOR^{X11}$, —$CONR^{X11}R^{X12}$, —$NHCONR^{X11}R^{X12}$, —$NHCOOR^{X11}$, —$SO_2R^{X11}$, —$SO_2OR^{X11}$, and —$NHSO_2R^{X11}$ is preferable, and —$OR^{X11}$ is more preferable. $R^{X11}$ represents a fluorine-containing alkyl group, and $R^{X12}$ represents a hydrogen atom, an alkyl group, a fluorine-containing alkyl group, an aryl group, or a heterocyclic group.

As the group containing a fluorine atom, a fluorine-containing alkyl group and/or —$OR^{X11}$ is preferable.

The number of carbon atoms in the fluorine-containing alkyl group is preferably 1 to 20, more preferably 1 to 15, still more preferably 1 to 10, and even still more preferably 1 or 4. The fluorine-containing alkyl group may be linear, branched, or cyclic and is preferably linear or branched.

The substitution ratio of the fluorine-containing alkyl group with fluorine atoms is preferably 40% to 100%, more preferably 50% to 100%, and still more preferably 60 to 100%.

The alkyl group, the aryl group, and the heterocyclic group represented by $R^{X12}$ have the same definitions as those described regarding the alkyl group, the aryl group, and the heterocyclic group represented by $R^{X1}$ and $R^{X2}$ of $A^1$.

$R^2$ represents an alkyl group or an aryl group and preferably an alkyl group. The alkyl group and the aryl group may have a substituent or may be unsubstituted. Examples of the substituent include the substituents described regarding $A^1$.

The number of carbon atoms in the alkyl group is preferably 1 to 20, more preferably 1 to 15, still more preferably 1 to 10, and even still more preferably 1 or 4. The alkyl group may be linear, branched, or cyclic and is preferably linear or branched.

The number of carbon atoms in the aryl group is preferably 6 to 20, more preferably 6 to 15, and still more preferably 6 to 10. The aryl group may be a monocycle or a fused ring.

$R^3$ represents an alkyl group or an aryl group and preferably an alkyl group. The alkyl group and the aryl group may have a substituent or may be unsubstituted. Examples of the substituent include the substituents described regarding $A^1$.

The number of carbon atoms in the alkyl group is preferably 1 to 20, more preferably 1 to 15, and still more preferably 1 to 10. The alkyl group may be linear, branched, or cyclic and is preferably linear or branched.

The number of carbon atoms in the aryl group is preferably 6 to 20, more preferably 6 to 15, and still more preferably 6 to 10. The aryl group may be a monocycle or a fused ring.

Specific examples of the compound represented by Formula (1) include the following compounds.

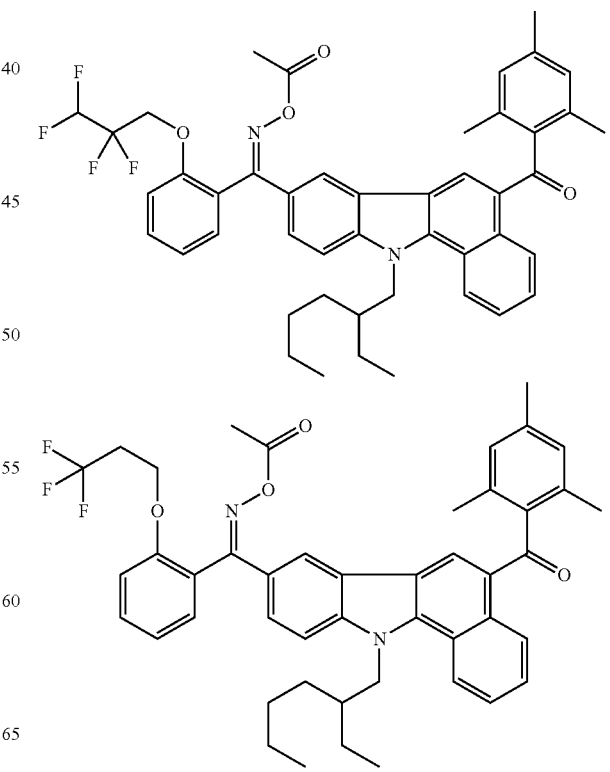

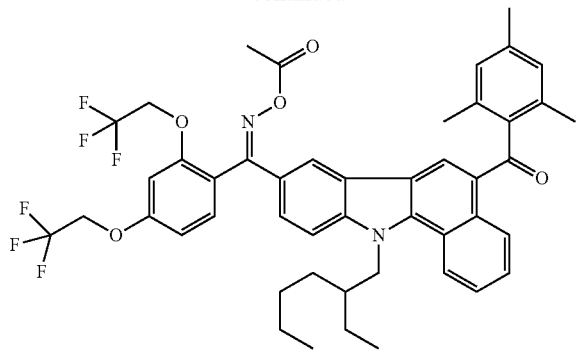

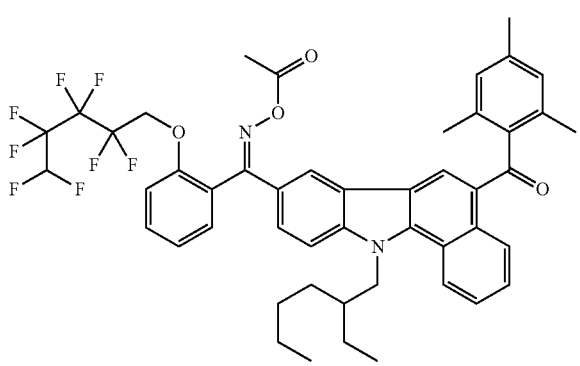

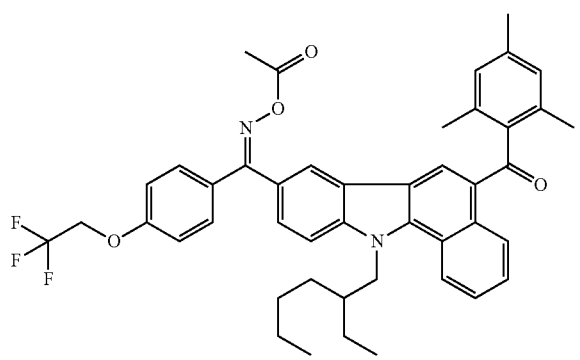

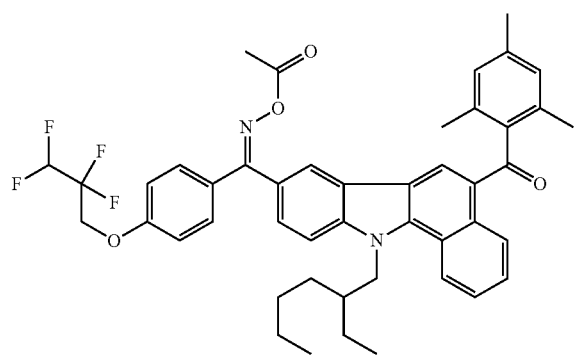 [SMILES: CCCCC(CC)Cn1c2ccc(/C(=N\OC(C)=O)c3ccc(OCC(F)(F)C(F)F)cc3)cc2c2cc(C(=O)c3c(C)cc(C)cc3C)c3ccccc3c21]

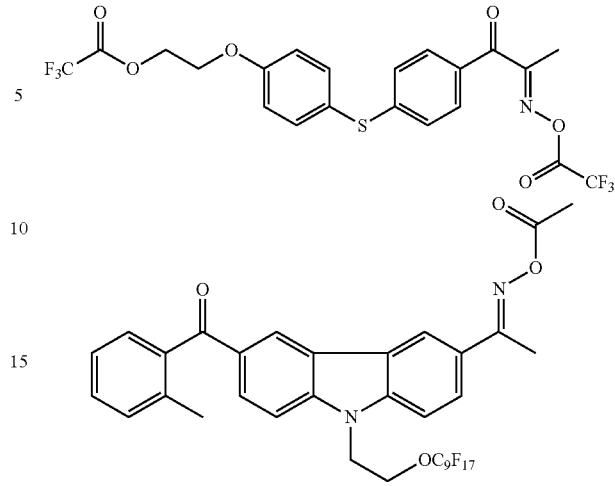

In the present invention, for example, the following compounds can be used as the fluorine-containing oxime ester photopolymerization initiator. In addition, for example, a compound described in JP2010-262028A or a compound (C-3) described in JP2013-164471A can be used. The content is incorporated herein by reference.

The content of the photopolymerization initiator is preferably 0.1 to 50 mass %, more preferably 0.5 to 30 mass %, and still more preferably 1 to 20 mass % with respect to the total solid content of the composition. In the above-described range, excellent sensitivity and pattern formability can be obtained. The composition according to the present invention may include one photopolymerization initiator or two or more photopolymerization initiators. In a case where the composition includes two or more photopolymerization initiators, it is preferable that the total content of the two or more photopolymerization initiators is in the above-described range.

The content of the fluorine-containing oxime ester photopolymerization initiator is preferably 0.1 to 50 mass %, more preferably 0.5 to 30 mass %, and still more preferably 1 to 20 mass % with respect to the total solid content of the composition. By adjusting the content of the fluorine-containing oxime ester photopolymerization initiator to be in the above-described range, a pattern having excellent adhesiveness can be obtained. The composition according to the present invention may include one fluorine-containing oxime ester photopolymerization initiator or two or more fluorine-containing oxime ester photopolymerization initiators. In a case where the composition includes two or more fluorine-containing oxime ester photopolymerization initiators, it is preferable that the total content of the two or more fluorine-containing oxime ester photopolymerization initiators is in the above-described range.

The content of the fluorine-containing oxime ester photopolymerization initiator is preferably 10 to 100 mass %, more preferably 20 to 100 mass %, and still more preferably 50 to 100 mass % with respect to the total mass of the photopolymerization initiator.

<<<Organic Solvent>>>

The composition may include an organic solvent. Basically, the organic solvent is not particularly limited as long as it satisfies the solubility of each component and the coating properties of the composition. However, it is preferable that the organic solvent is selected in consideration of the coating properties and safety of the composition.

Preferable examples of the organic solvent are as follows: an ester, for example, ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, an alkyl oxyacetate (for example, methyl oxyacetate, ethyl oxyacetate, or butyl oxyacetate (for example, methyl methoxyacetate, ethyl methoxyacetate, butyl methoxyacetate, methyl ethoxyacetate, or ethyl ethoxyacetate)), a 3-oxypropionic acid alkyl ester (for example, 3-methyl oxypropionate or 3-ethyl oxypropionate (for example, methyl 3-methoxypropionate, ethyl 3-methoxypropionate, methyl 3-ethoxypropionate, or ethyl 3-ethoxypropionate)), a 2-oxypropionic acid alkyl ester (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methylpropionate or ethyl 2-oxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate or ethyl 2-oxobutanoate;

an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, or propylene glycol monopropyl ether acetate;

a ketone, for example, methyl ethyl ketone, cyclohexanone, cyclopentanone, 2-heptanone, or 3-heptanone; and an aromatic hydrocarbon, for example, toluene or xylene.

Among these organic solvents, one kind may be used alone, or two or more kinds may be used in combination.

In a case where two or more organic solvents are used in combination, in particular, a mixed solution is preferable, the mixed solution including two or more organic solvents selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the present invention, as the organic solvent, an organic solvent containing 0.8 mmol/L or lower of a peroxide is preferable, and an organic solvent containing no peroxide is more preferable.

The amount of the organic solvent included in the composition is preferably 10 to 90 mass %, more preferably 20 to 80 mass %, and still more preferably 25 to 75 mass % with respect to the total mass of the composition.

<<<Polymerization Inhibitor>>>

The composition may include a polymerization inhibitor in order to prevent unnecessary thermal polymerization of the polymerizable compound during the manufacturing or storage of the composition.

Examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine cerium (III) salt. Among these, p-methoxyphenol is preferable.

The addition amount of the polymerization inhibitor is preferably 0.01 to 5 mass % with respect to the mass of the composition.

<<<Substrate Adhesive>>>

The composition may include a substrate adhesive.

As the substrate adhesive, a silane coupling agent, a titanate coupling agent, or an aluminum coupling agent can be preferably used.

Examples of the silane coupling agent include γ-methacryloxypropyl trimethoxy silane, γ-methacryloxypropyl triethoxy silane, γ-acryloxypropyl trimethoxy silane, γ-acryloxypropyl triethoxy silane, γ-mercaptopropyl trimethoxy silane, γ-aminopropyl triethoxy silane, and phenyl trimethoxy silane. Among these, γ-methacryloxypropyl trimethoxy silane is preferable as the substrate adhesive.

In addition, as the silane coupling agent, a silane coupling agent Y (hereinafter, also simply referred to as "silane coupling agent Y") having at least a silicon atom, a nitrogen atom, and a curable functional group in a molecule and having a hydrolyzable group bonded to a silicon atom can also be used.

The hydrolyzable group refers to a substituent directly linked to a silicon atom and capable of forming a siloxane bond due to a hydrolysis reaction or a condensation reaction. Examples of the hydrolyzable group include a halogen atom, an alkoxy group, an acyloxy group, and an alkenyloxy group. In a case where the hydrolyzable group has carbon atoms, the number of carbon atoms is preferably 6 or less and more preferably 4 or less. In particular, an alkoxy group having 4 or less carbon atoms or an alkenyloxy group having 4 or less carbon atoms is preferable.

The silane coupling agent Y is not particularly limited as long as it has at least one silicon atom in a molecule thereof, and the silicon atom can be bonded to the following atoms and substituents. These atoms and substituents may be the same as or different from each other. Examples of the atoms and substituents bonded to the silicon atom include a hydrogen atom, a halogen atom, a hydroxyl group, an alkyl group having 1 to 20 carbon atoms, an alkenyl group, an alkynyl group, an aryl group, an amino group which can be substituted with an alkyl group and/or an aryl group, a silyl group, an alkoxy group having 1 to 20 carbon atoms, and an aryloxy group. These substituents may be further substituted with a silyl group, an alkenyl group, an alkynyl group, an aryl group, an alkoxy group, an aryloxy group, a thioalkoxy group, an amino group which can be substituted with an alkyl group and/or an aryl group, a halogen atom, a sulfonamide group, an alkoxycarbonyl group, an amide group, a urea group, an ammonium group, an alkylammonium group, a carboxyl group or a salt thereof, or a sulfo group or a salt thereof.

At least one hydrolyzable group is bonded to the silicon atom. The definition of the hydrolyzable group is as described above.

The silane coupling agent Y may include a group represented by the following Formula (Z).

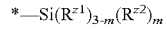   Formula (Z)

$R^{z1}$ represents an alkyl group, $R^{z2}$ represents a hydrolyzable group, and m represents an integer of 1 to 3. The number of carbon atoms in the alkyl group represented by $R^{z1}$ is preferably 1 to 5 and more preferably 1 to 3. The definition of the hydrolyzable group represented by $R^{z2}$ is as described above.

The silane coupling agent Y includes at least one nitrogen atom in a molecule thereof. It is preferable that the nitrogen atom is present in the form of a secondary amino group or a tertiary amino group, that is, it is preferable that the nitrogen atom has at least one organic group as a substituent. Regarding the structure of the amino group, the amino group may be present in a molecule in the form of a partial structure of a nitrogen-containing heterocycle, or may be present as an substituted amino group such as aniline. Here, examples of the organic group include an alkyl group, an alkenyl group, an alkynyl group, an aryl group, and a combination thereof. These organic groups may further have a substituent, and examples of the substituent which can be introduced include a silyl group, an alkenyl group, an alkynyl group, an aryl group, an alkoxy group, an aryloxy group, a thioalkoxy group, an amino group, a halogen atom, a sulfonamide group, an alkoxycarbonyl group, a carbonyloxy group, an amide group, a urea group, an alkyleneoxy group, an ammonium group, an alkylammonium group, a carboxyl group or a salt thereof, and a sulfo group.

In addition, it is preferable that the nitrogen atom is bonded to a curable functional group through an arbitrary organic linking group. Preferable examples of the organic linking group include the above-described substituents which can be introduced into the nitrogen atom and the organic group bonded to the nitrogen atom.

The curable functional group included in the silane coupling agent Y is preferably one or more groups selected from the group consisting of a (meth)acryloyloxy group, an epoxy group, an oxetanyl group, an isocyanate group, a hydroxyl group, an amino group, a carboxyl group, a thiol group, an alkoxysilyl group, a methylol group, a vinyl group, a (meth)acrylamide group, a styryl group, and a maleimide group, more preferably one or more groups selected from the group consisting of a (meth)acryloyloxy group, an epoxy group, and an oxetanyl group, and still more preferably one or more groups selected from the group consisting of a (meth)acryloyloxy group, an epoxy group, and an oxetanyl group.

The silane coupling agent Y is not particularly limited as long as it has at least one curable functional group in a molecule thereof. However, the silane coupling agent Y may have two or more curable functional groups. From the viewpoints of sensitivity and stability, the number of curable functional groups in a molecule is preferably 2 to 20, more preferably 4 to 15, and most preferably 6 to 10.

Examples of the silane coupling agent Y include a compound represented by the following Formula (Y).

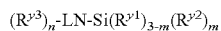

$R^{y1}$ represents an alkyl group, $R^{y2}$ represents a hydrolyzable group, and $R^{y3}$ represents a curable functional group. LN represents a (n+1) valent linking group having a nitrogen atom. m represents an integer of 1 to 3, and n represents an integer of 1 or more.

$R^{y1}$, $R^{y2}$, $R^{y3}$, and m in Formula (Y) have the same definitions and the same preferable ranges as those of $R^{z1}$, $R^{z2}$, $R^{z3}$, and m in Formula (W).

n in Formula (Y) represents an integer of 1 or more. The upper limit is, for example, preferably 20 or less, more preferably 15 or less, and still more preferably 10 or less. The lower limit is, for example, preferably 2 or more, more preferably 4 or more, and still more preferably 6 or more. In addition, n may represent 1.

LN in Formula (Y) represents a group having a nitrogen atom.

Examples of the group having a nitrogen atom include at least one group selected from groups represented by the following Formula (LN-1) to (LN-4), and a group of a combination of at least one group selected from groups represented by the following Formula (LN-1) to (LN-4), —CO—, —CO$_2$—, —O—, —S—, and —SO$_2$—. The alkylene group may be linear or branched. The alkylene group and the arylene group may have a substituent or may be unsubstituted. Examples of the substituent include a halogen atom and a hydroxyl group.

In the formula, * represents a bonded site.

Specific examples of the silane coupling agent Y include the following compounds. In the formula, Et represents an ethyl group. Other examples of the silane coupling agent Y include a compound described in paragraphs "0018" to "0036" of JP2009-288703A, the content of which is incorporated herein by reference.

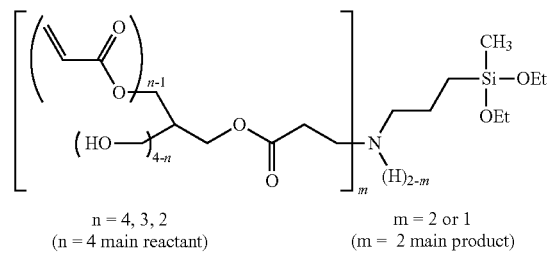

n = 4, 3, 2
(n = 4 main reactant)

m = 2 or 1
(m = 2 main product)

The content of the substrate adhesive is preferably 0.1 to 30 mass %, more preferably 0.5 to 20 mass %, and still more preferably 1 to 10 mass % with respect to the total solid content of the composition.

<<<Surfactant>>>

The composition may include various surfactants from the viewpoint of further improving coating properties. As the surfactants, various surfactants such as a fluorine surfactant, a nonionic surfactant, a cationic surfactant, an anionic surfactant, or a silicone surfactant can be used.

By the composition including a fluorine surfactant, liquid characteristics (for example, fluidity) of a coating solution prepared from the composition are further improved, and the uniformity in coating thickness and liquid saving properties can be further improved.

That is, in a case where a film is formed using a coating solution prepared using the composition including a fluorine surfactant, the interfacial tension between a coated surface and the coating solution decreases, the wettability on the coated surface is improved, and the coating properties on the coated surface are improved. Therefore, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Examples of the fluorine surfactant include: MEGAFACE F171, F172, F173, F176, F177, F141, F142, F143, F144, R30, F437, F475, F479, F482, F554, F780, and RS-72-K (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and PF636, PF656, PF6320, PF6520, and PF7002 (all of which are manufactured by OMNOVA Solutions Inc.). As the fluorine surfactant, a block polymer can also be used, and specific examples thereof include a compound described in JP2011-89090A.

In addition, for example, the following compound can also be used as the fluorine surfactant used in the present invention.

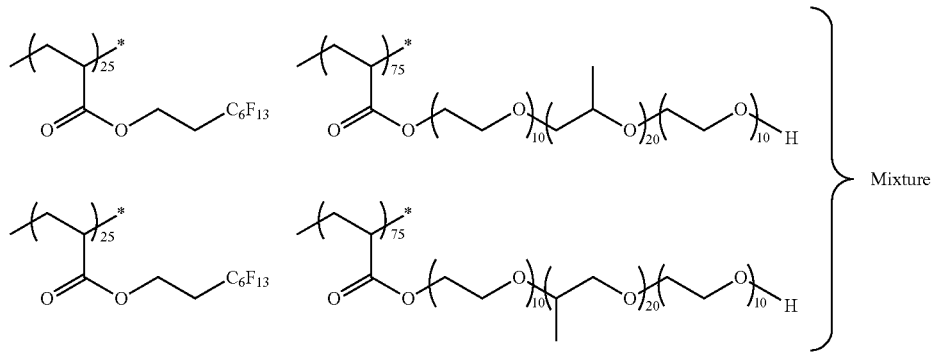

The weight-average molecular weight of the compound is, for example, 14000.

Specific examples of the nonionic surfactant include glycerol, trimethylolpropane, trimethylolethane, an ethoxylate and a propoxylate thereof (for example, glycerol propoxylate or glycerin propoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (PLURONIC L10, L31, L61, L62, 10R5, 17R2, and 25R2 and TETRONIC 304, 701, 704, 901, 904, and 150R1 (all of which are manufactured by BASF SE); and SOLSPERSE 20000 (manufactured by Lubrication Technology Inc.). In addition, NCW-101, NCW-1001, or NCW-1002 (manufactured by Wako Pure Chemical Industries, Ltd.) can also be used.

Specific examples of the cationic surfactant include a phthalocyanine derivative (trade name: EFKA-745, manufactured by Morishita Co., Ltd.), an organosiloxane polymer KP-341 (manufactured by Shin-Etsu Chemical Co., Ltd.), a (meth)acrylic acid (co)polymer POLYFLOW No. 75, No. 90, or No. 95 (manufactured by Kyoeisha Chemical Co., Ltd.), and W001 (manufactured by Yusho Co., Ltd.).

Specific examples of the anionic surfactant include W004, W005, and W017 (manufactured by Yusho Co., Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP-341, KF6001, and KF6002 (all of which are manufactured by Shin-Etsu Chemical Co., Ltd.); and BYK307, BYK323, and BYK330 (all of which are manufactured by BYK-Chemie Japan K.K.).

Among these surfactants, one kind may be used alone, or two or more kinds may be used in combination.

The addition amount of the surfactant is preferably 0.001 to 2.0 mass % and more preferably 0.005 to 1.0 mass % with respect to the total mass of the composition.

<<<Other Components>>>

The composition optionally includes: a chain transfer agent such as N,N-dialkylamino benzoic acid alkyl ester or 2-mercapto-benzothiazole; a thermal polymerization initiator such as an azo compound or a peroxide compound; an ultraviolet absorber such as a thermal polymerization component or alkoxy benzophenone; a plasticizer such as dioctyl phthalate; a developability improving agent such as a low molecular weight organic carboxylic acid; and other various additives such as a filler, an antioxidant, or an aggregation inhibitor.

In addition, in order to increase the degree of cure of a film during heating after development, a thermal curing agent can be added. Examples of the thermal curing agent include a thermal polymerization initiator such as an azo compound or a peroxide, a novolac resin, a resol resin, an epoxy compound, and a styrene compound.

Depending on materials used and the like, the composition may include a metal element. From the viewpoint of, for example, suppressing the generation of defects, the content of a Group 2 element (for example, calcium or magnesium) in the composition is controlled to be preferably 50 ppm or lower and more preferably 0.01 to 10 ppm. In addition, the total amount of inorganic metal salts in the composition is controlled to be preferably 100 ppm or lower and more preferably 0.5 to 50 ppm.

(Method of Preparing Composition)

The composition can be prepared by mixing the above-described components with each other.

During the preparation of the composition, the respective components may be mixed with each other collectively, or may be mixed with each other sequentially after dissolved and dispersed in a solvent. In addition, during mixing, the order of addition or working conditions are not particularly limited. For example, all the components may be dissolved or dispersed in a solvent at the same time to prepare the composition. Optionally, two or more solutions or dispersions may be appropriately prepared using the respective components, and the solutions or dispersions may be mixed with each other during use (during application) to prepare the composition.

In a case where a pigment is used as the visible light absorbing coloring material and/or the infrared absorber, it is preferable that the composition is prepared using a method including: preparing a pigment dispersion by dispersing the pigment and optionally other components such as a resin, an organic solvent, or a pigment derivative; and mixing the obtained pigment dispersion with other components of the composition.

The pigment dispersion may be prepared by dispersing the infrared absorber and the visible light absorbing coloring material separately or by dispersing (co-dispersing) the infrared absorber and the visible light absorbing coloring material together. In particular, in a case where a pyrrolopyrrole compound (preferably a pyrrolopyrrole compound represented by Formula (1)) is used as the infrared absorber, it is preferable that the pyrrolopyrrole compound and a chromatic colorant are co-dispersed. According to this embodiment, the dispersion stability of the pyrrolopyrrole compound can be improved.

During the preparation of the composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (having a high density and an ultrahigh molecular weight) such as polyethylene or polypropylene (PP). Among these materials, polypropylene (including high-density polypropylene) is preferable.

The pore size of the filter is suitably about 0.01 to 7.0 μm and is preferably about 0.01 to 3.0 μm and more preferably about 0.05 to 0.5 μm. In the above-described range, fine foreign matter, which inhibits a fine and smooth composition in the next step, can be reliably removed.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd. (former Mykrolis Corporation), or Kits Microfilter Corporation.

A second filter may be formed of the same material as that of the first filter.

For example, the filtering using the first filter may be performed only on the dispersion, and the filtering using the second filter may be performed on a mixture of the dispersion and other components.

<<<Composition for Forming Film Having Spectral Characteristics as Multi-Layer Film>>>

In a case where the film according to the present invention satisfies the spectral characteristics as a multi-layer film including the first spectrally selective layer 201 and the second spectrally selective layer 202, the first spectrally selective layer 201 can be formed using a composition (also referred to as "first composition") that includes the visible light absorbing coloring material. In addition, the second spectrally selective layer 202 can be formed using a composition (hereinafter, also referred to as "second composition") that includes the infrared absorber having a maximal absorption in a wavelength range of 750 to 950 nm.

<<<First Composition>>>

The first composition includes the visible light absorbing coloring material. Examples of the visible light absorbing coloring material include a chromatic colorant and a black colorant. A preferable range of the visible light absorbing coloring material is the same as that described regarding the first spectrally selective layer.

The content of the visible light absorbing coloring material is preferably 10 to 80 mass %, more preferably 20 to 80 mass %, and still more preferably 30 to 70 mass % with respect to the total solid content of the composition. The first composition may include one visible light absorbing coloring material or two or more visible light absorbing coloring materials. In a case where the composition includes two or more visible light absorbing coloring materials, it is preferable that the total content of the two or more visible light absorbing coloring materials is in the above-described range.

In a case where the first composition includes a red colorant, a yellow colorant, a blue colorant, and a violet colorant as the chromatic colorants, it is preferable that a ratio of the mass of the red colorant is 0.1 to 0.6, a ratio of the mass of the yellow colorant is 0.1 to 0.4, a ratio of the mass of the blue colorant is 0.1 to 0.6, and a ratio of the mass of the violet colorant is 0.01 to 0.3 with respect to the total mass of the chromatic colorants. It is more preferable that a ratio of the mass of the red colorant is 0.2 to 0.5, a ratio of the mass of the yellow colorant is 0.1 to 0.3, a ratio of the mass of the blue colorant is 0.2 to 0.5, and a ratio of the mass of the violet colorant is 0.05 to 0.25 with respect to the total mass of the chromatic colorants.

In a case where the composition includes a red colorant, a yellow colorant, and a blue colorant as the chromatic colorants, it is preferable that a ratio of the mass of the red colorant is 0.2 to 0.7, a ratio of the mass of the yellow colorant is 0.1 to 0.4, and a ratio of the mass of the blue colorant is 0.1 to 0.6 with respect to the total mass of the chromatic colorants. It is more preferable that a ratio of the mass of the red colorant is 0.3 to 0.6, a ratio of the mass of the yellow colorant is 0.1 to 0.3, and a ratio of the mass of the blue colorant is 0.2 to 0.5 with respect to the total mass of the chromatic colorants.

In a case where the composition includes a yellow colorant, a blue colorant, and a violet colorant as the chromatic colorants, it is preferable that a ratio of the mass of the yellow colorant is 0.1 to 0.4, a ratio of the mass of the blue colorant is 0.1 to 0.6, and a ratio of the mass of the violet colorant is 0.2 to 0.7 with respect to the total mass of the chromatic colorants. It is more preferable that a ratio of the mass of the yellow colorant is 0.1 to 0.3, a ratio of the mass of the blue colorant is 0.2 to 0.5, and a ratio of the mass of the violet colorant is 0.3 to 0.6 with respect to the total mass of the chromatic colorants.

In addition, in a case where the first spectrally selective layer satisfies the spectral characteristics using a combination of two or more sublayers as shown in FIG. 2, the first spectrally selective layer can be formed using two compositions (first compositions) that include different chromatic colorants.

For example, the first composition may include a resin (a dispersant or an alkali-soluble resin), a pigment derivative, a curable compound, a polyfunctional thiol compound, a photopolymerization initiator, an organic solvent, a polymerization inhibitor, a substrate adhesive, and a surfactant. Regarding the details of the components, for example, the materials described in "Composition for Forming Film having Spectral Characteristics as Single-Layer Film", and preferable ranges and contents are also the same.

The first composition can be prepared by mixing the above-described components with each other.

During the preparation of the composition, the respective components may be mixed with each other collectively, or may be mixed with each other sequentially after dissolved and dispersed in a solvent. In addition, during mixing, the order of addition or working conditions are not particularly limited. For example, all the components may be dissolved or dispersed in a solvent at the same time to prepare the composition. Optionally, two or more solutions or dispersions may be appropriately prepared using the respective components, and the solutions or dispersions may be mixed with each other during use (during application) to prepare the composition. Regarding the method of preparing the composition, the same method as that described in "Composition for Forming Film having Spectral Characteristics as Single-Layer Film" can be performed.

(Preferable Aspect of First Composition)

In the present invention, it is preferable that the first composition is a composition in which a ratio A/B of a minimum value A of an absorbance in a wavelength range of 450 to 650 nm to a maximum value B of an absorbance in a wavelength range of 1000 to 1300 nm is 4.5 or higher. By using the composition, the first spectrally selective layer satisfying the spectral characteristics can be formed as the single layer as shown in FIG. 1.

The absorbance conditions of the first composition may be satisfied using any means. For example, by adjusting the kind and content of the visible light absorbing coloring material in the composition, the absorbance conditions can be suitably satisfied.

For example, in a case where the first composition includes chromatic colorants as the visible light absorbing coloring material, the absorbance conditions can be achieved under the following conditions.

In a case where the first composition includes a red colorant, a yellow colorant, a blue colorant, and a violet colorant as the chromatic colorants, it is preferable that a ratio of the mass of the red colorant is 0.1 to 0.6, a ratio of the mass of the yellow colorant is 0.1 to 0.4, a ratio of the mass of the blue colorant is 0.1 to 0.6, and a ratio of the mass of the violet colorant is 0.01 to 0.3 with respect to the total mass of the chromatic colorants, and it is more preferable that a ratio of the mass of the red colorant is 0.2 to 0.5, a ratio of the mass of the yellow colorant is 0.1 to 0.3, a ratio of the mass of the blue colorant is 0.2 to 0.5, and a ratio of the mass of the violet colorant is 0.05 to 0.25 with respect to the total mass of the chromatic colorants. As a result, the absorbance conditions can be achieved.

In a case where the first composition includes a red colorant, a yellow colorant, and a blue colorant as the chromatic colorants, it is preferable that a ratio of the mass of the red colorant is 0.2 to 0.7, a ratio of the mass of the yellow colorant is 0.1 to 0.4, and a ratio of the mass of the blue colorant is 0.1 to 0.6 with respect to the total mass of the chromatic colorants, and it is more preferable that a ratio of the mass of the red colorant is 0.3 to 0.6, a ratio of the mass of the yellow colorant is 0.1 to 0.3, and a ratio of the mass of the blue colorant is 0.2 to 0.5 with respect to the total mass of the chromatic colorants. As a result, the absorbance conditions can be achieved.

In a case where the first composition includes a yellow colorant, a blue colorant, and a violet colorant as the chromatic colorants, it is preferable that a ratio of the mass of the yellow colorant is 0.1 to 0.4, a ratio of the mass of the blue colorant is 0.1 to 0.6, and a ratio of the mass of the violet colorant is 0.2 to 0.7 with respect to the total mass of the chromatic colorants, and it is more preferable that a ratio of the mass of the yellow colorant is 0.1 to 0.3, a ratio of the mass of the blue colorant is 0.2 to 0.5, and a ratio of the mass of the violet colorant is 0.3 to 0.6 with respect to the total mass of the chromatic colorants. As a result, the absorbance conditions can be achieved.

<<<Second Composition>>>

The second composition includes the infrared absorber. Examples of the infrared absorber include the infrared absorbers described regarding the second spectrally selective layer, and a pyrrolopyrrole compound is preferable. A preferable range of the pyrrolopyrrole compound is the same as the above-described range.

The content of the infrared absorber is preferably 20 to 70 mass %, more preferably 25 to 65 mass %, and still more preferably 30 to 60 mass % with respect to the total solid content of the composition. The second composition for forming the second spectrally selective layer may include one infrared absorber or two or more infrared absorber. In a case where the second composition includes two or more infrared absorber, it is preferable that the total content of the two or more infrared absorber is in the above-described range.

The second composition may include a chromatic colorant. Examples of the chromatic colorant include the chromatic colorants described regarding the first spectrally selective layer. As the chromatic colorant, a pigment or a dye may be used. A pigment is preferable. As the pigment, various well-known inorganic pigments or organic pigments of the related art can be used, and organic pigments are preferable. By the second composition including an organic pigment, the dispersibility of the infrared absorber (preferably a pyrrolopyrrole compound and more preferably the pyrrolopyrrole compound represented by Formula (1)) can be improved. In particular, in a case where the composition is prepared by co-dispersing the infrared absorber and the organic pigment, the dispersibility of the infrared absorber can be improved. In addition, it is preferable that the chromatic colorant is at least one selected from a red pigment and a blue pigment because the thixotropy of the composition can be suppressed to be low.

The content of the chromatic colorant is preferably 5 to 300 parts by mass and more preferably 10 to 200 parts by mass with respect to 100 parts by mass of the infrared absorber.

The second composition may include one chromatic colorant or two or more chromatic colorants. In a case where the second composition includes two or more chromatic colorants, it is preferable that the total content of the two or more chromatic colorants is in the above-described range.

For example, the second composition may include a resin (a dispersant or an alkali-soluble resin), a pigment derivative, a curable compound, a polyfunctional thiol compound, a photopolymerization initiator, an organic solvent, a polymerization inhibitor, a substrate adhesive, and a surfactant. Regarding the details of the components, for example, the materials described in "Composition for Forming Film having Spectral Characteristics as Single-Layer Film", and preferable ranges and contents are also the same.

The second composition can be prepared by mixing the above-described components with each other.

During the preparation of the composition, the respective components may be mixed with each other collectively, or may be mixed with each other sequentially after dissolved and dispersed in a solvent. In addition, during mixing, the order of addition or working conditions are not particularly limited. For example, all the components may be dissolved or dispersed in a solvent at the same time to prepare the composition. Optionally, two or more solutions or dispersions may be appropriately prepared using the respective components, and the solutions or dispersions may be mixed with each other during use (during application) to prepare the composition. Regarding the method of preparing the composition, the same method as that described in "Composition for Forming Film having Spectral Characteristics as Single-Layer Film" can be performed.

<Film Forming Method>

(Method of Forming Single-Layer Film)

In a case where the film according to the present invention has the spectral characteristics as a single-layer film, the film can be manufactured using a composition that includes a visible light absorbing coloring material, an infrared absorber, and a resin and in which a ratio A/B of a minimum value A of an absorbance in a wavelength range of 400 to 830 nm to a maximum value B of an absorbance in a wavelength range of 1000 to 1300 nm is 4.5 or higher.

(Method of Forming Multi-Layer Film)

In a case where the film according to the present invention is a film including the first spectrally selective layer and the second spectrally selective layer, a film forming method according to the present invention includes:

forming a first spectrally selective layer in which a maximum value of a light transmittance in the thickness direction in a wavelength range of 450 to 650 nm is 20% or lower and in which a minimum value of a light transmittance in the thickness direction in a wavelength range of 1000 to 1300 nm is 70% or higher; and forming a second spectrally selective layer in which a light transmittance of the second spectrally selective layer in the thickness direction at a wavelength of 835 nm is 20% or lower and in which a minimum value of a light transmittance of the second spectrally selective layer in the thickness direction in a wavelength range of 1000 to 1300 nm is 70% or higher.

The first spectrally selective layer can be formed using the first composition. In addition, the second spectrally selective layer can be formed using the second composition.

It is preferable that the film forming method according to the present invention further includes a step of forming a pattern.

In addition, in a case where the film according to the present invention is a multi-layer film, a patterning on the first spectrally selective layer and a patterning on the second spectrally selective layer may be separately performed. In addition, a patterning on a laminate of the first spectrally selective layer and the second spectrally selective layer may be performed (that is, pattern formation on the first spectrally selective layer and pattern formation on the second spectrally selective layer may be simultaneously performed).

The case where the patterning on the first spectrally selective layer and the patterning on the second spectrally selective layer are separately performed denotes the following aspect. A pattern is formed on either the first spectrally selective layer or the second spectrally selective layer. Next, the other spectrally selective layer is formed on the spectrally selective layer on which the pattern is formed. Next, a pattern is formed on the spectrally selective layer on which a pattern is not formed.

In addition, in a case where the first spectrally selective layer satisfies the spectral characteristics using a combination of two or more sublayers as shown in FIG. 2, the patterning may be performed on each sublayer. Alternatively, after laminating a plurality of sublayers, the patterning may be simultaneously performed on the sublayers.

In a case where the patterning is separately performed on the sublayers, a cured pattern can be performed on each of the sublayers. Therefore, there is an effect that a mutually mixed region between the sublayers is small.

In addition, in a case where the patterning is simultaneously performed on the sublayers, patterns can be formed all at once. Therefore, there is an effect that the number of steps can be reduced.

A patterning included in the film forming method may be performed by photolithography or dry etching.

In a case where the patterning by photolithography is adopted, dry etching is not necessary, and an effect that the number of steps can be reduced can be obtained.

In a case where the patterning by dry etching is adopted, photolithography is not necessary. Therefore, an effect that the concentration of the coloring material in the composition can increase can be obtained.

In a case where the patterning on the first spectrally selective layer and the patterning on the second spectrally selective layer are separately performed, the patterning may be performed by only the photolithography method or only the dry etching. In addition, after the patterning on one spectrally selective layer by the use of the photolithography method, the pattern formation may be performed on the other spectrally selective layer by the use of the dry etching method. In a case where the patterning is performed using a combination of the dry etching method and the photolithography method, it is preferable that a pattern is formed on a first layer using the dry etching method and a pattern is formed on a second or subsequent layer using the photolithography method.

It is preferable that the patterning is performed at a temperature of 150° C. or lower (preferably 120° C. or lower, more preferably 100° C. or lower, and still more preferably 90° C. or lower). The patterning at 150° C. or lower denotes that each step of the patterning is performed at a temperature of 150° C. or lower.

It is preferable that the patterning by the photolithography method includes: a step of forming a composition layer on a support using each composition; a step of exposing the composition layer in a pattern shape; and a step of forming a pattern by removing a non-exposed portion by development. Optionally, the pattern formation further includes: a step (pre-baking step) of baking the composition layer; and a step (post-baking step) of baking the developed pattern.

In addition, It is preferable that the pattern formation using the dry etching method includes: a step of forming a composition layer on a support using each composition and curing the cured composition layer; a step of forming a photoresist layer on the cured composition layer; a step of obtaining a resist pattern by patterning the photoresist layer by exposure and development; and a step of forming a pattern by dry-etching the cured composition layer by using the resist pattern as an etching mask.

Hereinafter, the details will be described.

<<Step of Forming Composition Layer>>

In the step of forming a composition layer, a composition layer is formed on a support using each of the compositions.

As the support, for example, a substrate for a solid image pickup element obtained by providing a solid image pickup element (light-receiving element) such as CCD or CMOS on a substrate (for example, a silicon substrate) can be used.

The pattern according to the present invention may be formed on a solid image pickup element-formed surface (front surface) of the substrate for a solid image pickup element, or may be formed on a solid image pickup element non-formed surface (back surface) thereof.

Optionally, an undercoat layer may be provided on the support to improve adhesion with a layer above the support, to prevent diffusion of materials, or to make a surface of the substrate flat.

As a method of applying the composition to the support, various methods such as slit coating, an ink jet method, spin coating, cast coating, roll coating, or screen printing can be used.

The composition layer formed on the support may be dried (pre-baked). In a case where a pattern is formed through a low-temperature process, pre-baking is not necessarily performed.

In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. By setting the pre-baking temperature to be 150° C. or lower, the characteristics can be effectively maintained, for example, even in a case where a photoelectric conversion film of an image sensor is formed of an organic material.

The pre-baking time is preferably 10 to 300 seconds, more preferably 40 to 250 seconds, and still more preferably 80 to 220 seconds. Drying can be performed using a hot plate, an oven, or the like.

In a case where the pattern formation is simultaneously performed on a plurality of layers, it is preferable that a composition for forming each of the layers is applied to the composition layer to form another composition layer.

(Case where Pattern is Formed Using Photolithography Method)

<<Exposure Step>>

Next, the composition layer is exposed in a pattern shape (exposure step). For example, the composition layer is exposed in a pattern shape using an exposure device such as a stepper through a mask having a predetermined mask pattern, thereby exposing a pattern. As a result, an exposed portion can be cured.

As radiation (light) used during the exposure, ultraviolet rays such as g-rays or i-rays are preferably used (i-rays are more preferably used). For example, the irradiation dose (exposure dose) is preferably 30 to 5000 $J/cm^2$. The upper limit is preferably 3000 $J/cm^2$ or lower, more preferably 2000 $J/cm^2$ or lower, and still more preferably 1500 $J/cm^2$ or lower. The lower limit is preferably 50 $mJ/cm^2$ or higher and more preferably 80 $mJ/cm^2$ or higher.

The thickness of the cured film is preferably 1.0 μm or less, more preferably 0.1 to 0.9 μm, and still more preferably 0.2 to 0.8 μm. By setting the thickness to be 1.0 μm or less, high resolution and high adhesiveness are likely to be obtained.

<<Development Step>>

Next, a pattern is formed by removing a non-exposed portion by development. The non-exposed portion can be removed by development using a developer. As a result, a non-exposed portion of the composition layer in the exposure step is eluted into the developer, and only the photo-cured portion remains.

As the developer, an organic alkali developer which does not cause damages to a solid image pickup element as a substrate, a circuit or the like is desired.

For example, the temperature of the developer is preferably 20° C. to 30° C. The developing time is preferably 20 to 180 seconds. In addition, in order to further improve residue removing properties, a step of shaking the developer off per 60 seconds and supplying a new developer may be repeated multiple times.

Examples of an alkaline agent used in the developer include: an organic alkaline compound such as ammonia water, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, or 1,8-diazabicyclo-[5,4,0]-7-undecene. As the developer, an alkaline aqueous solution is preferably used in which the above alkaline agent is diluted with pure water such that a concentration thereof is 0.001 to 10 mass % and preferably 0.01 to 1 mass %.

In addition, an inorganic alkali may be used as the developer. Preferable examples of the inorganic alkali include sodium hydroxide, potassium hydroxide, sodium carbonate, sodium bicarbonate, sodium silicate, and sodium metasilicate.

In addition, a surfactant may be used as the developer. Examples of the surfactant include the surfactants described above regarding the coloring composition. Among these, a nonionic surfactant is preferable.

In a case where a developer including the alkaline aqueous solution is used, in general, it is preferable that the film is rinsed with pure water after development.

After the development, it is preferable that the film is dried and then heated (post-baking). In a case where the pattern formation is separately performed on the first spectrally selective layer and the second spectrally selective layer, the pattern formation can be performed by sequentially repeating the steps for each of the layers.

Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and even still more preferably 90° C. or lower. The lower limit is, for example, 50° C. or higher.

The film after the development is post-baked continuously or batchwise using heating means such as a hot plate, a convection oven (hot air circulation dryer), a high-frequency heater under the above-described conditions.

In addition, in a case where a pattern is formed through a low-temperature process, post-baking is not necessarily performed.

(Case where Pattern is Formed Using Dry Etching Method)

The patterning by the dry etching can be performed by curing the composition layer formed on the support to form a cured composition layer, and then etching the cured composition layer with etching gas by using a patterned photoresist layer as a mask.

Specifically, it is preferable that a positive type or negative type radiation sensitive composition is applied to the cured composition layer and is dried such that a photoresist layer is formed. It is preferable that pre-baking is further performed in order to form the photoresist layer. In particular, in a preferable embodiment, as a process of forming the photoresist, baking after exposure or baking after development (post-baking) is performed.

As the photoresist layer, a positive type radiation sensitive composition, which is reactive with radiation including ultraviolet rays (g-rays, h-rays, i-rays), far ultraviolet rays such as excimer laser, electron beams, ion beams, and X-rays, is preferably used. Among the radiations, g-rays, h-rays, or i-rays are preferable, and i-rays are more preferable.

Specifically, as the positive type radiation sensitive composition, a composition including a quinonediazide compound and an alkali-soluble resin is preferable. The positive type radiation sensitive composition including a quinonediazide compound and an alkali-soluble resin uses a configuration in which a quinonediazide group is decomposed into a carboxyl group by irradiation of light having a wavelength of 500 nm or shorter such that the state of the composition is converted from alkali-insoluble to alkali-soluble. The positive type photoresist has significantly high resolution and thus is used to prepare an integrated circuit such as an integrated circuit (IC) or a large scale integration (LSI). Examples of the quinonediazide compound include a naphthoquinonediazide compound. Examples of a commercially available product of the quinonediazide compound include "FHi622BC" (manufactured by Fujifilm Electronic Materials Co., Ltd.).

The thickness of the photoresist layer is preferably 0.1 to 3 μm, more preferably 0.2 to 2.5 μm, and still more preferably 0.3 to 2 μm. As a method of applying the positive type radiation sensitive composition, the above-described methods of applying the composition is preferable.

Next, by exposing and developing the photoresist layer, a resist pattern (patterned photoresist layer) including a group of resist through-holes is formed. The formation of the resist pattern is not particularly limited and can be appropriately optimized and performed using a well-known photolithography technique of the related art. By providing the group of resist through-holes in the photoresist layer by exposure and development, a resist pattern used as an etching mask in the next etching is provided on the cured composition layer.

The exposure of the photoresist layer can be performed by exposing the positive type or negative type radiation sensitive composition with g-rays, h-rays, i-rays, or the like (preferably i-rays) through a predetermined mask pattern. By performing development using a developer after exposure, a photoresist is removed from a region where a pattern is desired to be formed.

As the developer, any developer can be used as long as it has no effect on a cured composition layer including a colorant and an exposed portion of a positive resist and a non-cured portion of a negative resist are soluble therein. For example, a combination of various solvents or an alkaline aqueous solution can be used. It is preferable that the alkaline aqueous solution is prepared by dissolving an alkaline compound such that the concentration thereof is 0.001 to 10 mass % and preferably 0.01 to 5 mass %. Examples of the alkaline compound include sodium hydroxide, potassium hydroxide, sodium carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, and 1,8-diazabicyclo-[5,4,0]-7-undecene. In a case where an alkaline aqueous solution is used, in general, a rinsing treatment using water is performed after development.

Next, patterning is performed by dry-etching the colored layer using the resist pattern as an etching mask so as to form a group of through-holes in the cured composition layer.

From the viewpoint of forming a pattern cross-section in a substantially rectangular shape or the viewpoint of further reducing damages to the support, it is preferable that dry etching is performed according the following embodiment.

In the preferable embodiment, first etching, second etching, and over etching is performed. In the first etching, etching is performed using a mixed gas of fluorine gas and oxygen gas ($O_2$) up to a region (depth) where the support is not exposed. In the second etching, after the first etching, etching is performed using a mixed gas of nitrogen gas ($N_2$) and oxygen gas ($O_2$) preferably up to a region (depth) where the support is exposed. In the over etching, etching is performed after the support is exposed. Hereinafter, a specific method of dry etching, the first etching, the second etching, and the over etching will be described.

The dry etching is performed after obtaining etching conditions in advance using the following method.

(1) An etching rate (nm/min) in the first etching, and an etching rate (nm/min) in the second etching are calculated, respectively.

(2) A time required to perform etching up to a desired thickness in the first etching, and a time required to perform etching up to a desired thickness in the second etching are calculated, respectively.

(3) The first etching is performed for the etching time calculated in (2).

(4) The second etching is performed for the etching time calculated in (2). Alternatively, an etching time may be determined based on a detected end point, and the second etching may be performed for the determined etching time.

(5) An over etching time is calculated in consideration of the total etching time of (3) and (4), and the over etching is performed for the calculated over etching time.

From the viewpoint of processing an organic material, which is a film to be etched, in a rectangular shape, it is preferable that a mixed gas used in the first etching step includes fluorine gas and oxygen gas ($O_2$). In addition, by performing etching up to a region where the support is not exposed in the first etching step, damages to the support can be avoided. In addition, after etching is performed using a mixed gas of fluorine gas and oxygen gas up to a region where the support is not exposed in the first etching step, in second etching step and the over etching step, it is preferable that etching is performed using a mixed gas of nitrogen gas and oxygen gas from the viewpoint of avoiding damages to the support.

It is important to determine a ratio between the etching amount in the first etching step and the etching amount in the second etching step such that the rectangularity obtained by etching in the first etching step does not deteriorate. A latter ratio in the total etching amount (the sum of the etching amount in the first etching step and the etching amount in the second etching step) is preferably higher than 0% and 50% or lower and more preferably 10% to 20%. The etching amount refers to a value which is calculated from a difference between the thickness of a film to be etched before etching and the thickness of the film remaining after etching.

In addition, it is preferable that the etching includes over etching. It is preferable that the over etching is performed after setting an over etching ratio. In addition, it is preferable that the over etching ratio is calculated based on a first etching time. The over etching ratio can be arbitrarily set and is preferably 30% or lower, more preferably 5 to 25%, and still more preferably 10 to 15% with respect to the total etching time of the etching process from the viewpoints of obtaining etching resistance of a photoresist and maintaining rectangularity of an etched pattern.

Next, the resist pattern (that is, the etching mask) remaining after etching is removed. It is preferable that the removal of the resist pattern includes: a step of applying a peeling solution or a solvent to the resist pattern such that the resist pattern can be peeled; and a step of removing the resist pattern using rinse water.

Examples of the step applying a peeling solution or a solvent to the resist pattern such that the resist pattern can be peeled include a step of applying a peeling solution or a solvent to at least the resist pattern and holding the peeling solution and the solvent for a predetermined time to perform paddle development. The time for which the peeling solution or the solvent is held is not particularly limited and is preferably several tens of seconds to several minutes.

In addition, examples of the step of removing the resist pattern using rinse water include a step of spraying rinse water to the resist pattern through a spray type or shower type spray nozzle to remove the resist pattern. As the rinse water, pure water is preferably used.

In addition, examples of the spray nozzle include: a spray nozzle in which a spraying range includes the entire region of the support; and a movable spray nozzle in which a movable range includes the entire region of the support. In a case where the spray nozzle is movable, the nozzle moves twice or more in a region from the center of the support to end portions of the support to spray rinse water during the step of removing the resist pattern. As a result, the resist pattern can be more effectively removed.

In general, the peeling solution may further include an organic solvent or an inorganic solvent. Examples of the organic solvent include 1) a hydrocarbon compound, 2) a halogenated hydrocarbon compound, 3) an alcohol compound, 4) an ether or acetal compound, 5) a ketone or aldehyde compound, 6) an ester compound, 7) a polyhydric alcohol compound, 8) a carboxylic acid or acid anhydride compound, 9) a phenol compound, 10) a nitrogen-containing compound, 11) a sulfur-containing compound, and 12) a fluorine-containing compound. It is preferable that the peeling solution includes a nitrogen-containing compound, and it is more preferable that the peeling solution includes an acyclic nitrogen-containing compound and a cyclic nitrogen-containing compound.

It is preferable that the acyclic nitrogen-containing compound is an acyclic nitrogen-containing compound having a hydroxyl group. Specific examples of the acyclic nitrogen-containing compound having a hydroxyl group include monoisopropanolamine, diisopropanolamine, triisopropanolamine, N-ethylethanolamine, N,N-dibutylethanolamine, N-butylethanolamine, monoethanolamine, diethanolamine, and triethanolamine. Among these, monoethanolamine, diethanolamine, or triethanolamine is preferable, and monoethanolamine ($H_2NCH_2CH_2OH$) is more preferable. In addition, examples of the cyclic nitrogen-containing compound include isoquinoline, imidazole, N-ethylmorpholine, ε-caprolactam, quinoline, 1,3-dimethyl-2-imidazolidinone, α-picoline, β-picoline, γ-picoline, 2-picoline, 3-picoline, 4-picoline, piperazine, piperidine, pyrazine, pyridine, pyrrolidine, N-methyl-2-pyrrolidone, N-phenylmorpholine, 2,4-lutidine, and 2,6-lutidine. Among these, N-methyl-2-pyrrolidone or N-ethylmorpholine is preferable, and N-methyl-2-pyrrolidone (NMP) is more preferable.

It is preferable that the peeling solution includes an acyclic nitrogen-containing compound and a cyclic nitrogen-containing compound. It is more preferable that the peeling solution includes, as an acyclic nitrogen-containing compound, at least one selected from the group consisting of monoethanolamine, diethanolamine, and triethanolamine and includes, as a cyclic nitrogen-containing compound, at least one cyclic nitrogen-containing compound selected from N-methyl-2-pyrrolidone and N-ethylmorpholine. It is still more preferable that the peeling solution includes monoethanolamine and N-methyl-2-pyrrolidone.

When the peeling solution is removed, the resist pattern formed on the pattern only has to be removed. Even in a case where a deposit as an etching product is attached to a side wall of the pattern, it is not necessary to completely remove the deposit. The deposit refers to an etching product which is attached and deposited to a side wall of the cured composition layer.

In the peeling solution, the content of the acyclic nitrogen-containing compound is preferably 9 parts by mass to 11 parts by mass with respect to 100 parts by mass of the peeling solution, and the content of the cyclic nitrogen-containing compound is preferably 65 parts by mass to 70 parts by mass with respect to 100 parts by mass of the peeling solution. In addition, it is preferable that the peeling solution is obtained by diluting a mixture of the acyclic nitrogen-containing compound and the cyclic nitrogen-containing compound with pure water.

In addition to the above-described steps, the film forming method according to the present invention optionally includes a well-known step in a method of manufacturing a color filter for a solid image pickup element.

In addition, in order efficiently clean contaminants and the like, which are formed by clogging of a nozzle or a pipe of a discharge portion of an application device, and attachment, precipitation, and drying of the composition in an application device, it is preferable that the solvent relating to the composition according to the present invention is used as a cleaning solution. In addition, a cleaning solution described in JP1995-128867A (JP-H7-128867A), JP1995-146562A (JP-H7-146562A), JP1996-278637A (JP-H8-278637A), JP2000-273370A, JP2006-85140A, JP2006-291191A, JP2007-2101A, JP2007-2102A, or JP2007-281523A can be preferably used.

Among these, alkylene glycol monoalkyl ether carboxylate, or alkylene glycol monoalkyl ether is preferable.

Among these solvents, one kind may be used alone, or two or more kinds may be used in combination. In a case where a mixture of two or more solvents is used, it is preferable that a solvent having a hydroxyl group is mixed with a solvent having no hydroxyl group with each other. A mass ratio of the solvent having a hydroxyl group to the solvent having no hydroxyl group is 1/99 to 99/1, preferably 10/90 to 90/10, and more preferably 20/80 to 80/20. A mixed solvent obtained by mixing propylene glycol monomethyl ether acetate (PGMEA) and propylene glycol monomethyl ether (PGME) with each other at a ratio of 60/40 is more preferable. In order to improve permeability of the cleaning solution into contaminants, the surfactant relating to the composition according to the present invention may be added to the cleaning solution.

<Kit>

Next, a kit according to the present invention will be described.

A kit according to the present invention is A kit for forming a film in which a maximum value of a light transmittance of the film in a thickness direction in a wavelength range of 450 to 650 nm is 20% or lower, a light transmittance of the film in the thickness direction at a wavelength of 835 nm is 20% or lower, and a minimum value of a light transmittance of the film in the thickness direction in a wavelength range of 1000 to 1300 nm is 70% or higher, the kit including:

a first composition in which a ratio A/B of a minimum value A of an absorbance in a wavelength range of 450 to 650 nm to a maximum value B of an absorbance in a wavelength range of 1000 to 1300 nm is 4.5 or higher; and a second composition that includes an infrared absorber having a maximal absorption in a wavelength range of 750 to 950 nm.

The first composition in the kit according to the present invention has the same definition and the same preferable range as the first composition which can form the first spectrally selective layer in the film according to the present invention.

The second composition in the kit according to the present invention has the same definition and the same preferable range as the second composition which can form the second spectrally selective layer in the film according to the present invention.

<Solid Image Pickup Element>

A solid image pickup element according to the present invention includes the film according to the present invention. The solid image pickup element according to the present invention is configured to include the film according to the present invention. The configuration of the solid image pickup element is not particularly limited as long as the solid image pickup element functions. For example, the following configuration can be adopted.

The solid image pickup element includes plural photodiodes and transfer electrodes on the support, the photodiodes constituting a light receiving area of the solid image pickup element (for example, a charge coupled device (CCD) image sensor or a complementary metal-oxide semiconductor (CMOS) image sensor), and the transfer electrode being formed of polysilicon or the like. In the solid image pickup element, a light shielding film formed of tungsten or the like which has openings through only light receiving sections of the photodiodes is provided on the photodiodes and the transfer electrodes, a device protection film formed of silicon nitride or the like is formed on the light shielding film so as to cover the entire surface of the light shielding film and the light receiving sections of the photodiodes, and the film according to the present invention is formed on the device protection film.

Further, a configuration in which light collecting means (for example, a microlens; hereinafter, the same shall be applied) is provided above the device protection film and below the film according to the present invention (on a side thereof close the support), or a configuration in which light collecting means is provided on the film according to the present invention may be adopted.

<Infrared Sensor>

An infrared sensor according to the present invention includes the film according to the present invention. The configuration of the infrared sensor according to the present invention is not particularly limited as long as it includes the film according to the present invention and functions as an infrared sensor.

Hereinafter, an embodiment of the infrared sensor according to the present invention will be described using FIG. 3.

Figure 3:
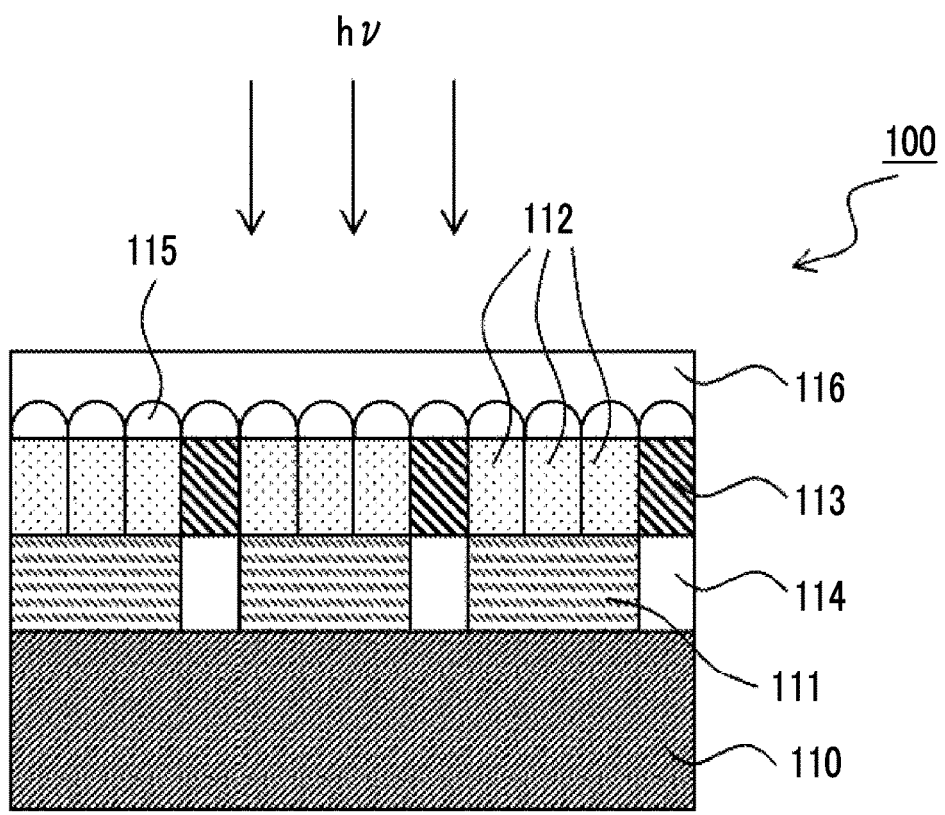
FIG. 3 is a schematic cross-sectional view showing a configuration of an embodiment of an infrared sensor according to the present invention.

In an infrared sensor 100 shown in FIG. 3, reference numeral 110 represents a solid image pickup element.

In an imaging region provided on the solid image pickup element 110, infrared absorbing filters 111 and color filters 112 are provided.

It is preferable that the infrared absorbing filters 111 are configured to allow transmission of light in the visible region (for example light having a wavelength of 400 to 700 nm) and to shield light in the infrared region (for example, light having a wavelength of 800 to 1300 nm, preferably light having a wavelength of 900 to 1300 nm, and more preferably light having a wavelength of 900 to 1000 nm).

In the color filters 112, pixels which allow transmission of light having a specific wavelength in the visible region and absorbs the light. For example, pixels of red (R), green (G), and blue (B) are formed in the color filters 112.

Regions 114 where the infrared absorbing filters 111 are not formed are provided between infrared transmitting filters 113 and the solid image pickup element 110. In the regions 114, resin layers (for example, transparent resin layers) capable of allowing transmission of light having a wavelength which has passed through the infrared transmitting filters 113 are disposed.

The infrared transmitting filters 113 have visible ray shielding properties, allow transmission of infrared light having a specific wavelength, and are formed of the film according to the present invention having the spectral characteristics.

Microlenses 115 are disposed on an incidence light hv side of the color filters 112 and the infrared transmitting filters 113. A planarizing layer 116 is formed so as to cover the microlenses 115.

In the embodiment shown in FIG. 3, the resin layers are disposed in the regions 114. However, the infrared transmitting filters 113 may be formed in the regions 114. That is, the infrared transmitting filters 113 may be formed on the solid image pickup element 110.

In addition, in the embodiment shown in FIG. 3, the thickness of the color filters 112 is the same as the thickness of the infrared transmitting filters 113. However, the thickness of the color filters 112 may be different from the thickness of the infrared transmitting filters 113.

In addition, in the embodiment shown in FIG. 3, the color filters 112 are provided on the incidence light hv side compared to the infrared absorbing filters 111. The lamination order of the infrared absorbing filters 111 and the color filters 112 may be reversed, and the infrared absorbing filters 111 may be provided on the incidence light hv side compared to the color filters 112.

In addition, in the embodiment shown in FIG. 3, the infrared absorbing filters 111 and the color filters 112 are laminated adjacent to each other. However, the infrared absorbing filters 111 and the color filters 112 are not necessarily provided adjacent to each other, and another layer may be provided therebetween.

In addition, in the embodiment shown in FIG. 3, the infrared transmitting filter 113 may be configured as a single-layer film or as a multi-layer film including two or more layers. That is, the infrared transmitting filter 113 may be a film including the first spectrally selective layer and the second spectrally selective layer according to the present invention. In addition, the first spectrally selective layer may include two or more sublayers.

According to this infrared sensor, image information can be acquired at the same time. Therefore, the infrared sensor can be used for motion sensing in a case where a motion detecting target is recognized. Further, since distance information can be acquired, for example, an image including 3D information can be obtained.

Next, an imaging device will be described as an example to which the infrared sensor according to the present invention is applied. Examples of the imaging device include a camera module.

Figure 4:
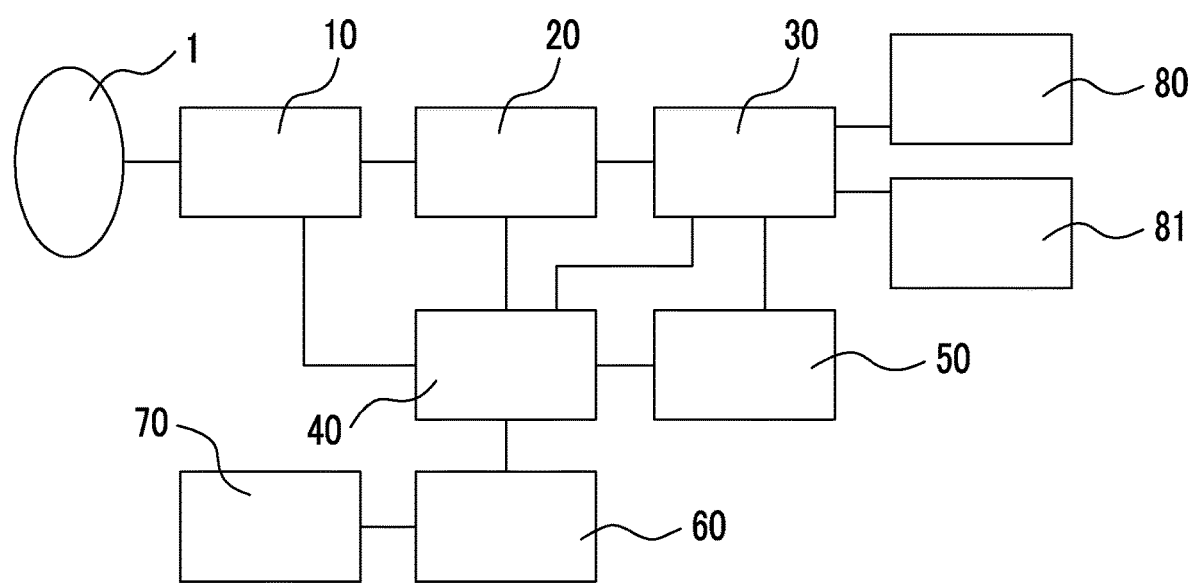
FIG. 4 is a functional block diagram showing an imaging device to which the infrared sensor according to the present invention is applied.

FIG. 4 is a functional block diagram showing the imaging device. The imaging device includes a lens optical system 1, a solid image pickup element 10, a signal processing unit 20, a signal switching unit 30, a control unit 40, a signal storage unit 50, a light emission control unit 60, an infrared light emitting diode (LED) 70 of a light emitting element which emits infrared rays, and image output units 80 and 81. As the solid image pickup element 10, the above-described infrared sensor 100 can be used. In addition, a part or all of other components of the imaging device excluding the solid image pickup element 10 and the lens optical system 1 may be formed on the same semiconductor substrate. The respective configurations of the imaging device can be found in paragraphs "0032" to "0036" of JP2011-233983A, the content of which is incorporated herein by reference.

EXAMPLES

Hereinafter, the present invention will be described in more detail using examples. However, the present invention is not limited to the following examples as long as it does not depart from the scope of the present invention. Unless specified otherwise, "part(s)" and "%" represent "part(s) by mass" and "mass %".

[Preparation of Pigment Dispersions 1-1 to 1-3, R-1, and R-2]

The respective components were mixed and dispersed to obtain a composition shown in Table 1 below using a beads mill (a high-pressure dispersing machine with a pressure reducing mechanism, NANO-3000-10 (manufactured by Nippon BEE Chemical Co., Ltd.)) in which zirconia beads having a diameter of 0.3 mm were used. This way, pigment dispersions 1-1 to 1-3, R-1, and R-2 were prepared. In addition, the pigment dispersion 1-1 was prepared by mixing and dispersing the components until an average particle size (secondary particles) of an infrared absorber was as shown in Table 1. Table 1 shows the amount (unit: part(s) by mass) of the corresponding component.

The volume average particle size of a pigment in each of the pigment dispersions was measured using MICROTRAC UPA 150 (manufactured by Nikkiso Co., Ltd.). The measurement results are shown in Table 1.

[Preparation of Pigment Dispersions 2-1 to 2-4]

The respective components were mixed and dispersed for 3 hours to obtain a composition shown in Table 1 below using a beads mill (a high-pressure dispersing machine with a pressure reducing mechanism, NANO-3000-10 (manufactured by Nippon BEE Chemical Co., Ltd.)) in which zirconia beads having a diameter of 0.3 mm were used. This way, pigment dispersions 2-1 to 2-4 were prepared. Table 1 shows the amount (unit: part(s) by mass) of the corresponding component.

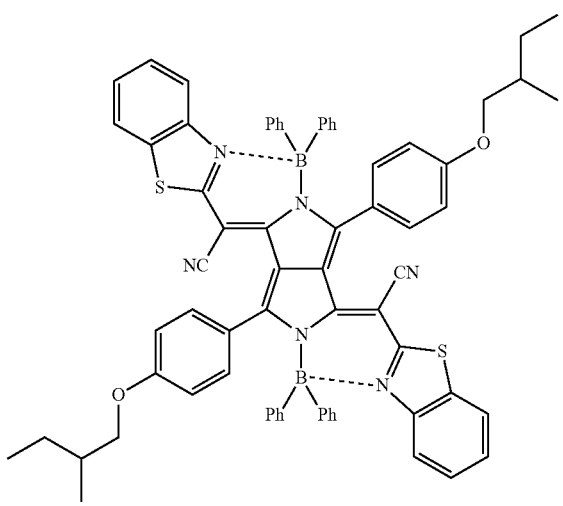

Infrared Absorber 1: IRA842 (trade name, a naphthalocyanine compound, manufactured by Exiton, Inc.)
Infrared Absorber 2: FD-25 (trade name, manufactured by Yamada Chemical Co., Ltd.)
Carbon Black: Pigment Black 7 (trade name)
Titanium Black: (manufactured by Mitsubishi Materials Corporation)
PR254: Pigment Red 254
PB15:6: Pigment Blue 15:6
PY139: Pigment Yellow 139
PV23: Pigment Violet 23

TABLE 1

| | Infrared Absorber | | Chromatic Colorant | Others | Resin | Organic Solvent |
|---|---|---|---|---|---|---|
| | Kind | Average Particle Size (nm) | | | | |
| Pigment Dispersion 1-1 | Pyrrolopyrrole Pigment 1 (13.5) | 75 | | | Resin 1 (4.0) | PGMEA (82.5) |
| Pigment Dispersion 1-2 | Infrared Absorber 1 (13.5) | — | | | Resin 1 (4.0) | PGMEA (82.5) |
| Pigment Dispersion 1-3 | Infrared Absorber 2 (13.5) | — | | | Resin 1 (4.0) | PGMEA (82.5) |
| Pigment Dispersion 2-1 | | — | PR254 (13.5) | | Resin 2 (2.0) Resin 5 (2.0) | PGMEA (82.5) |
| Pigment Dispersion 2-2 | | — | PB15:6 (13.5) | | Resin 3 (4.0) | PGMEA (82.5) |
| Pigment Dispersion 2-3 | | — | PY139 (14.8) | | Resin 1 (3.0) Resin 5 (2.2) | PGMEA (80.0) |
| Pigment Dispersion 2-4 | | — | PV23 (14.8) | | Resin 1 (3.0) Resin 5 (2.2) | PGMEA (80.0) |
| Pigment Dispersion R-1 | | — | | Carbon Black (20.0) | Resin 1 (3.3) | PGMEA (76.7) |
| Pigment Dispersion R-2 | | — | | Titanium Black (23.3) | Resin 1 (2.3) | PGMEA (74.4) |

In the table, an abbreviation of each component is as follows.

Pyrrolopyrrole Pigment 1: a compound having the following structure (which was synthesized using a method described in JP2009-263614A) (an infrared absorber having a maximal absorption in a wavelength range of 750 to 950 nm)

Resin 1: BYK-111 (trade name; manufactured by BYK)
Resin 2: a resin (Mw: 7950) having the following structure

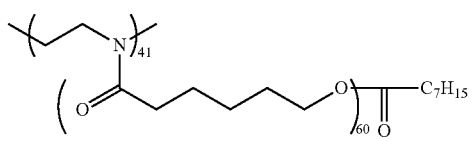

-continued

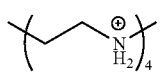
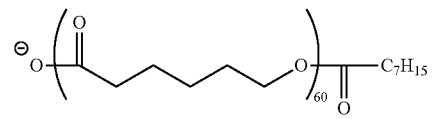
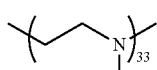

Resin 3: a resin (Mw: 30000) having the following structure

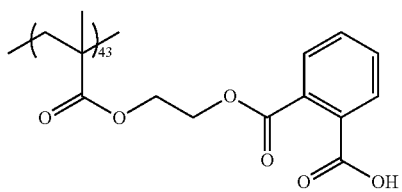

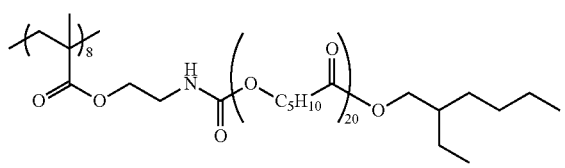

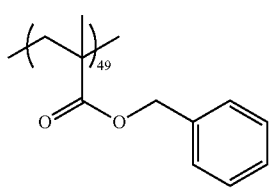

Resin 4: a resin (Mw: 24000) having the following structure

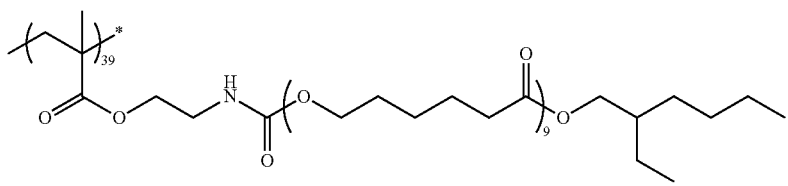

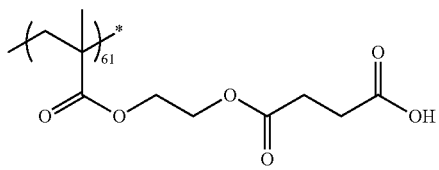

Resin 5: a resin (Mw: 12000) having the following structure

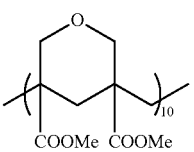
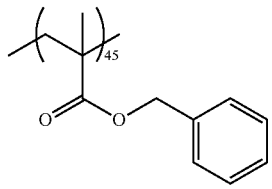

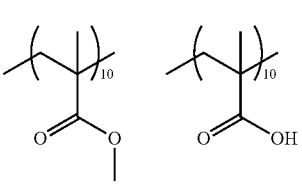

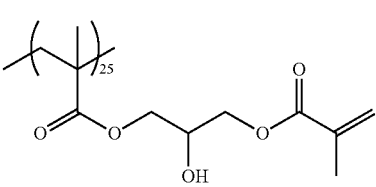

PGMEA: propylene glycol methyl ether acetate

[Preparation of Pigment Dispersion 3-1]

10 parts by mass of the pyrrolopyrrole pigment 1 having undergone a salt milling process, 3.0 parts by mass of a pigment derivative 1, 7.8 parts by mass of the resin 2, 109 parts by mass of PGMEA, and 520 parts by mass of zirconia beads having a diameter of 0.5 mm were dispersed using a paint shaker for 30 minutes and then were filtered through DFA4201NXEY (a 0.45 μm nylon filter, manufactured by Pall Corporation) to separate the beads by filtration. As a result, a pigment dispersion 3-1 was prepared.

Pigment Derivative 1: a compound having the following structure

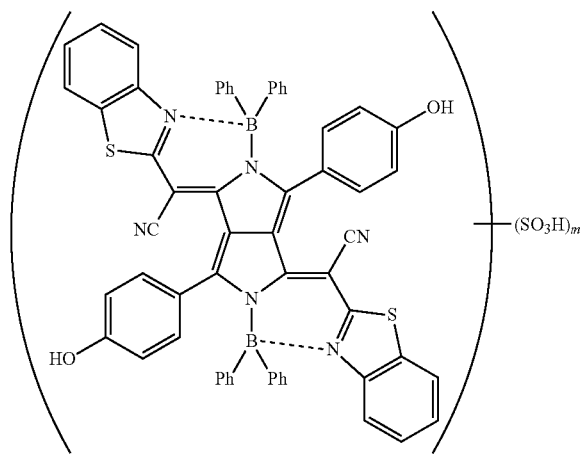

[Preparation of Pigment Dispersion 3-2]

A pigment dispersion 3-2 was prepared using the same preparation method as in the pigment dispersion 3-1, except that: 10 parts by mass of oxotitanyl phthalocyanine was used instead of the pyrrolopyrrole pigment 1; and a pigment derivative 2 was used instead of the pigment derivative 1.

Pigment Derivative 2: a compound having the following structure

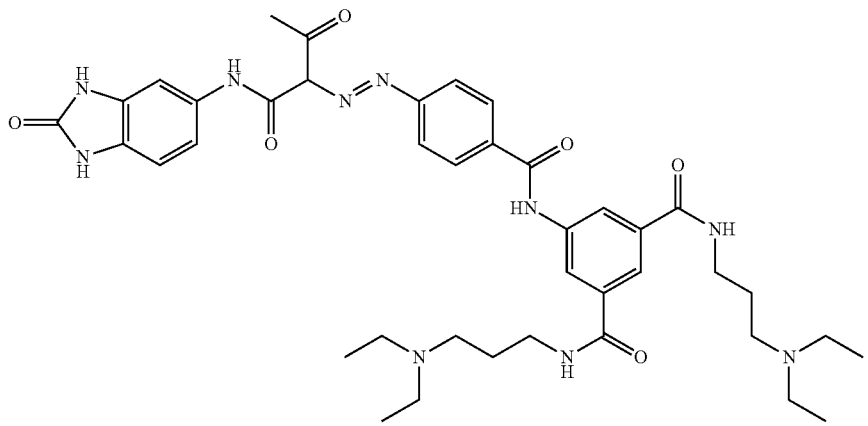 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

[Preparation of Pigment Dispersion 3-3]

A pigment dispersion 3-3 was prepared using the same preparation method as in the pigment dispersion 3-2, except that 10 parts by mass of oxovanadyl naphthalocyanine was used instead of oxotitanyl phthalocyanine.

[Preparation of Pigment Dispersion 3-4]

A pigment dispersion 3-4 was prepared using the same preparation method as in the pigment dispersion 3-2, except that 10 parts by mass of FD-25 (manufactured by Yamada Chemical Co., Ltd.) was used instead of oxotitanyl phthalocyanine.

[Pigment Dispersion 4-1]

The respective components were mixed and dispersed for 3 hours to obtain a composition shown below using a beads mill (a high-pressure dispersing machine with a pressure reducing mechanism, NANO-3000-10 (manufactured by Nippon BEE Chemical Co., Ltd.)) in which zirconia beads having a diameter of 0.3 mm were used. This way, a pigment dispersion 4-1 was prepared.

Mixed pigment including a red pigment (C.I. Pigment Red 254) and a yellow pigment (C.I. Pigment Yellow 139): 11.8 parts Resin 1 (BYK-111, manufactured by BYK): 9.1 parts Propylene glycol monomethyl ether acetate: 79.1 mass %

[Pigment Dispersion 4-2]

The respective components were mixed and dispersed for 3 hours to obtain a composition shown below using a beads mill (a high-pressure dispersing machine with a pressure reducing mechanism, NANO-3000-10 (manufactured by Nippon BEE Chemical Co., Ltd.)) in which zirconia beads having a diameter of 0.3 mm were used. This way, a pigment dispersion 4-2 was prepared.

Mixed pigment including a blue pigment (C.I. Pigment Blue 15:6) and a violet pigment (C.I. Pigment Violet 23) 12.6 parts Resin 1 (BYK-111, manufactured by BYK): 2.0 parts Resin 7: 3.3 parts Cyclohexanone: 31.2 parts Propylene glycol monomethyl ether acetate: 50.9 parts Resin 7: a resin having the following structure (A ratio in a repeating unit is a molar ratio; Mw=14000)

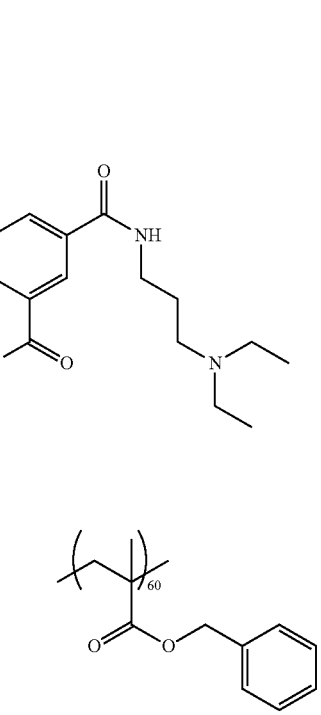

[Pigment Dispersion 5-1]

7.66 parts of C.I. Pigment Red 254, 3.44 parts of C.I. Pigment Yellow 139, 2.46 parts of a resin (dispersant, BYK-161, (manufactured by BYK)), 4.94 parts of a resin (ACRYCURE RD-F8 (manufactured by Nippon Shokubai Co., Ltd.)), and 81.50 parts of propylene glycol methyl ether acetate were mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the prepared pigment dispersion was further dispersed under a pressure of 2000 kg/cm$^3$ at a flow rate of 500 g/min. This dispersing treatment was repeated 10 times. As a result, a pigment dispersion 5-1 was obtained.

(Pigment Dispersion 6-1)

8.48 parts of C.I. Pigment Blue 15:6, 3.81 parts of C.I. Pigment Violet 23, 2.65 parts of a resin (dispersant, BYK-161, (manufactured by BYK)), 2.65 parts of a resin (ACRYCURE RD-F8 (manufactured by Nippon Shokubai Co., Ltd.)), and 82.41 parts of propylene glycol methyl ether acetate were mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the prepared pigment dispersion was further dispersed under a pressure of 2000 kg/cm$^3$ at a flow rate of 500 g/min. This dispersing treatment was repeated 10 times. As a result, a pigment dispersion 6-1 was obtained.

[Preparation of Composition]

Components shown in Table 2 were mixed with each other at a ratio shown in Table 2 below to prepare compositions 1 to 15. The table shows the amount (unit: part(s) by mass) of the corresponding component.

TABLE 2

|  | Comp. 1 | Comp. 2 | Comp. 3 | Comp. 4 | Comp. 5 | Comp. 6 | Comp. 7 | Comp. 8 |
|---|---|---|---|---|---|---|---|---|
| Pigment Dispersion 1-1 | 22.67 | | | | | | | |
| Pigment Dispersion 1-2 | | 22.67 | | | | | | |
| Pigment Dispersion 1-3 | | | 22.67 | | | | | |
| Pigment Dispersion 2-1 | 11.33 | 11.33 | 11.33 | | | | | |
| Pigment Dispersion 2-2 | 22.67 | 22.67 | 22.67 | | | | | |
| Pigment Dispersion 2-3 | 10.34 | 10.34 | 10.34 | | | | | |
| Pigment Dispersion 2-4 | 6.89 | 6.89 | 6.89 | | | | | |
| Pigment Dispersion 3-1 | | | | | | 60 | | |
| Pigment Dispersion 3-2 | | | | | | | 60 | |
| Pigment Dispersion 3-3 | | | | | | | | 60 |
| Pigment Dispersion 3-4 | | | | | | | | |
| Pigment Dispersion 4-1 | | | | | | | | |
| Pigment Dispersion 4-2 | | | | | | | | |
| Pigment Dispersion 5-1 | | | | | | | | |
| Pigment Dispersion 6-1 | | | | | | | | |
| Pigment Dispersion R-1 | | | | | | | | |
| Pigment Dispersion R-2 | | | | | | | | |
| Pyrrolopyrrole Dye 1 | | | | 3.29 | 3.29 | | | |
| Polymerizable Compound 1 | 1.37 | 1.37 | 1.37 | | | | | |
| Polymerizable Compound 2 | | | | 2.38 | 2.38 | 6 | 6 | 6 |
| Polymerizable Compound 3 | | | | | | | | |
| Polymerizable Compound 4 | | | | | | | | |
| Resin 10 | 3.52 | 3.52 | 3.52 | 12.5 | 12.5 | | | |
| Resin 11 | | | | | | 4.45 | 4.45 | 4.45 |
| Resin 12 | | | | | | | | |
| Resin 13 | | | | | | | | |
| Photopolymerization Initiator 1 | 0.86 | 0.86 | 0.86 | 2.61 | | 1.99 | 1.99 | 1.99 |
| Photopolymerization Initiator 2 | | | | | 2.61 | | | |
| Photopolymerization Initiator 3 | | | | | | | | |

TABLE 2-continued

| | | | | | | | | |
|---|---|---|---|---|---|---|---|---|
| Surfactant 1 | 0.42 | 0.42 | 0.42 | | | 4.17 | 4.17 | 4.17 |
| Surfactant 2 | | | | 9.09 | 9.09 | | | |
| Polymerization Inhibitor 1 | 0.001 | 0.001 | 0.001 | 0.001 | 0.001 | 0.003 | 0.003 | 0.003 |
| Substrate Adhesive | | | | | | | | |
| Organic Solvent 1 | 19.93 | 19.93 | 19.93 | 70.14 | 70.14 | 23.39 | 23.39 | 23.39 |

| | Comp. 9 | Comp. 10 | Comp. 11 | Comp. 12 | Comp. 13 | Comp. 14 | Comp. 15 |
|---|---|---|---|---|---|---|---|
| Pigment Dispersion 1-1 | | | | | | | |
| Pigment Dispersion 1-2 | | | | | | | |
| Pigment Dispersion 1-3 | | | | | | | |
| Pigment Dispersion 2-1 | | | | | | | |
| Pigment Dispersion 2-2 | | | | | | | |
| Pigment Dispersion 2-3 | | | | | | | |
| Pigment Dispersion 2-4 | | | | | | | |
| Pigment Dispersion 3-1 | | | | | | | |
| Pigment Dispersion 3-2 | | | | | | | |
| Pigment Dispersion 3-3 | | | | | | | |
| Pigment Dispersion 3-4 | 60 | | | | | | |
| Pigment Dispersion 4-1 | | 46.5 | 46.5 | | | | |
| Pigment Dispersion 4-2 | | 37.1 | 37.1 | | | | |
| Pigment Dispersion 5-1 | | | | 69.44 | | | |
| Pigment Dispersion 6-1 | | | | | 69.44 | | |
| Pigment Dispersion R-1 | | | | | | 17 | |
| Pigment Dispersion R-2 | | | | | | | 14.59 |
| Pyrrolopyrrole Dye 1 | | | | | | | |
| Polymerizable Compound 1 | | | | | | 2.74 | 2.74 |
| Polymerizable Compound 2 | 6 | | | | | | |
| Polymerizable Compound 3 | | 1.8 | 1.8 | | | | |
| Polymerizable Compound 4 | | | | 1.15 | 1.15 | | |
| Resin 10 | | | | | | 21.46 | 22.02 |
| Resin 11 | 4.45 | | | | | | |
| Resin 12 | | 1.1 | 1.1 | | | | |
| Resin 13 | | | | 2.53 | 2.53 | | |
| Photopolymerization Initiator 1 | 1.99 | | | 0.61 | 0.61 | 1.71 | 1.71 |
| Photopolymerization Initiator 2 | | | 0.9 | | | | |
| Photopolymerization Initiator 3 | | 0.9 | | | | | |
| Surfactant 1 | 4.17 | 4.2 | 4.2 | 4.2 | 4.2 | 0.42 | 0.42 |
| Surfactant 2 | | | | | | | |
| Polymerization Inhibitor 1 | 0.003 | 0.001 | 0.001 | 0.001 | 0.001 | 0.001 | 0.001 |
| Substrate Adhesive | | 0.6 | 0.6 | | | | |
| Organic Solvent 1 | 23.39 | 7.8 | 7.8 | 22.11 | 22.11 | 56.67 | 58.52 |

In the table, an abbreviation of each component is as follows.

Pyrrolopyrrole Dye 1: the following structure (which was synthesized using a method described in JP2009-263614A) (an infrared absorber having a maximal absorption in a wavelength range of 750 to 950 nm)

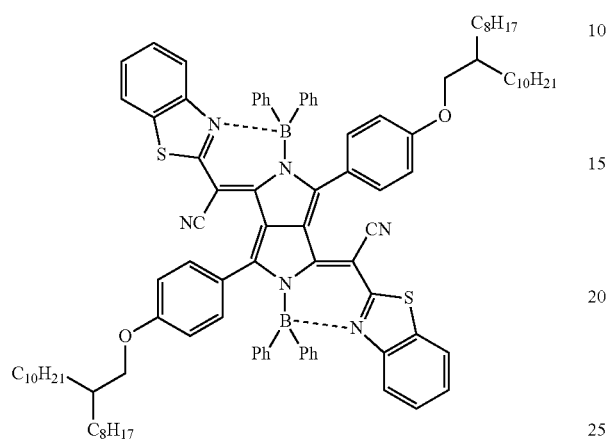

Polymerizable Compound 1: M-305 (including 55 to 63 mass % of triacrylate; manufactured by Toagosei Co., Ltd.)

Polymerizable Compound 2: KAYARAD DPHA (manufactured by Nippon Kayaku Co., Ltd.)

Polymerizable Compound 3: a mixture of compounds having the following structures (a mixture in which a molar ratio between a left compound and a right compound is 7:3)

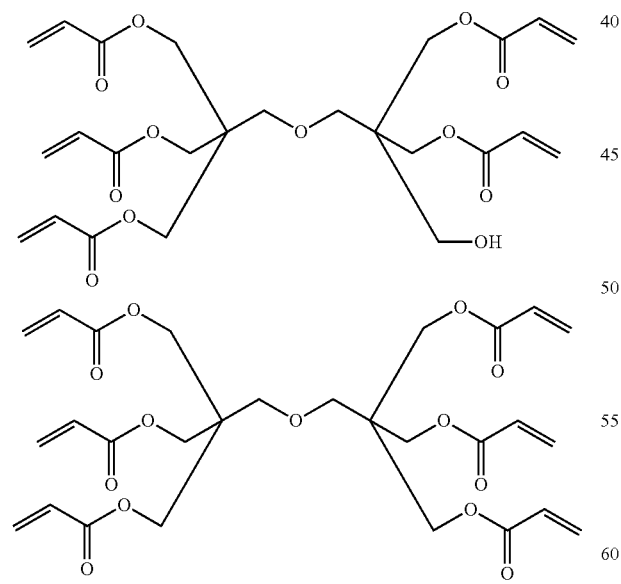

Polymerizable Compound 4: KAYARAD DPCA-20 (manufactured by Nippon Kayaku Co., Ltd.)

Resin 10: a resin (Mw: 40000) having the following structure

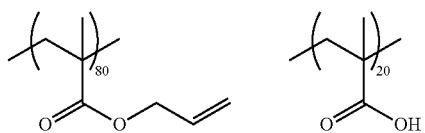

Resin 11: CYCLOMER P(ACA)230AA (manufactured by Daicel Corporation)

Resin 12: a resin having the following structure (A ratio in a repeating unit is a molar ratio; Mw=11000)

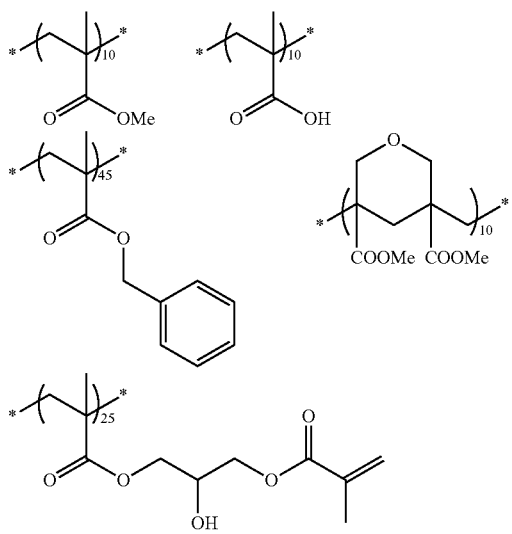

Resin 13: a resin having the following structure (Mw=12000, PGMEA 30% solution)

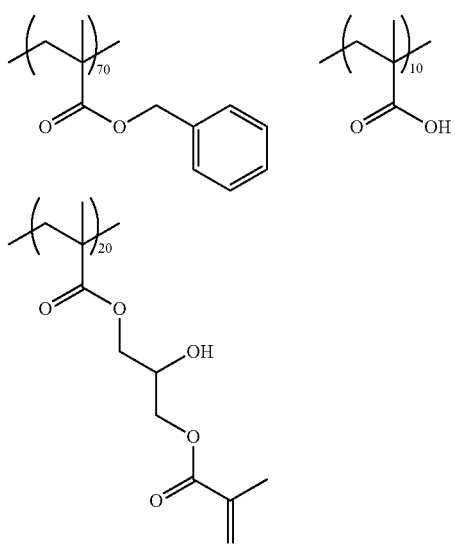

Photopolymerization Initiator 1: IRGACURE-OXE 01 (manufactured by BASF SE)

Photopolymerization Initiator 2: a compound having the following structure (an oxime ester photopolymerization initiator containing a fluorine atom)

Photopolymerization Initiator 3: a compound having the following structure

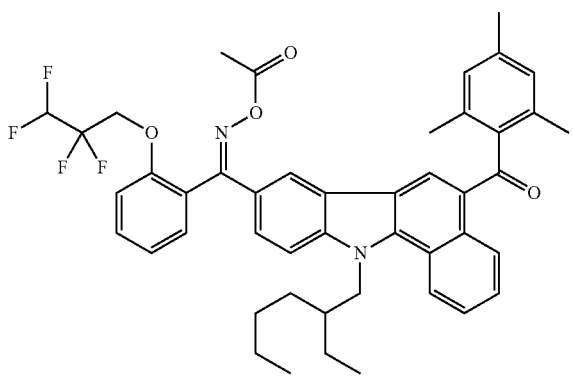 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

Substrate Adhesive: a compound having the following structure

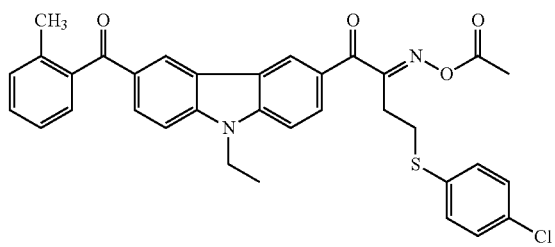 [SMILES: CCn1c2ccc(C(=O)/C(CCSc3ccc(Cl)cc3)=N/OC(C)=O)cc2c2cc(C(=O)c3ccccc3C)ccc21]

Surfactant 1: the following mixture (Mw: 14000, 2.5% PGMEA solution)

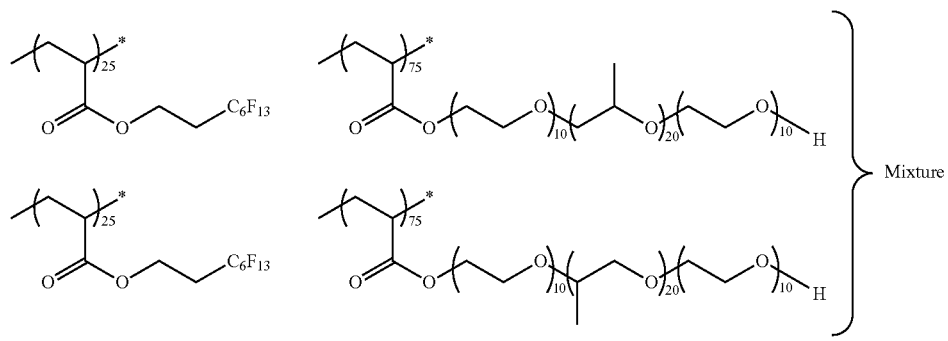

Surfactant 2: MEGAFACE RS-72-K (manufactured by DIC Corporation, 30% PGMEA solution)

Polymerization Inhibitor 1: p-methoxyphenol

Organic Solvent 1: PGMEA

[Measurement 1 of Absorbance]

Each of the compositions 1 to 3 was applied to a glass substrate using a spin coating method such that the thickness after post-baking was 1.0 µm, and was dried using a hot plate at 100° C. for 120 seconds. Further, the dried glass substrate was heated (post-baked) using a hot plate at 200° C. for 300 seconds to obtain a substrate including a film.

In the substrate including a film, a minimum value A of the absorbance in a wavelength range of 400 to 830 nm, and a maximum value B of the absorbance in a wavelength range of 1000 to 1300 nm were measured using an ultraviolet-visible-near infrared spectrophotometer U-4100 (manufactured by Hitachi High-Technologies Corporation).

TABLE 3

|  | Minimum Absorbance A: 400 to 830 nm | Maximum Absorbance B: 1000 to 1300 nm | Absorption Ratio A/B |
|---|---|---|---|
| Composition 1 | 2.10 | 0.04 | 57.9 |
| Composition 2 | 0.76 | 0.09 | 8.3 |
| Composition 3 | 0.74 | 0.14 | 5.2 |

[Measurement 2 of Absorbance]

Each of the compositions 10 to 11 was applied to a glass substrate using a spin coating method such that the thickness after post-baking was 1.0 µm, and was dried using a hot plate at 100° C. for 120 seconds. Further, the dried glass substrate was heated (post-baked) using a hot plate at 200° C. for 300 seconds to obtain a substrate including a film.

In the substrate including a film, a minimum value A of the absorbance in a wavelength range of 450 to 650 nm, and a maximum value B of the absorbance in a wavelength range of 1000 to 1300 nm were measured using an ultraviolet-visible-near infrared spectrophotometer U-4100 (manufactured by Hitachi High-Technologies Corporation).

TABLE 4

|  | Minimum Absorbance A: 450 to 650 nm | Maximum Absorbance B: 1000 to 1300 nm | Absorption Ratio A/B |
|---|---|---|---|
| Composition 10 | 1.13 | 0.03 | 41.0 |
| Composition 11 | 1.13 | 0.03 | 41.0 |

Test Example 1

Film Formation

Examples 1 to 3 and Comparative Examples 1 to 4

Each of the compositions 1 to 4, 10, 14, and 15 was applied to a silicon wafer using a spin coating method such that the thickness of a dried film was 3.0 µm, and was heated (pre-baked) using a hot plate at 100° C. for 120 seconds.

Next, using an i-ray stepper exposure device FPA-3000 i5+ (manufactured by Canon Corporation), the film was exposed at an optimum exposure dose through a photomask on which a square pixel pattern having a size of 5×5 µm was formed. The optimum exposure dose was determined based on an exposure dose at which the square pixel pattern is resolved while increasing the intensity from 50 to 750 mJ/cm$^2$ at an interval of 50 mJ/cm$^2$.

Next, the silicon wafer on which the exposed film was formed was placed on a horizontal rotary table of a spin-shower developing machine (DW-30, manufactured by Chemitronics Co., Ltd.) and underwent paddle development at 23° C. for 60 seconds using CD-2060 (developer, manufactured by Fujifilm Electronic Materials Co., Ltd.) to form a colored pattern on the silicon wafer.

The silicon wafer on which the colored pattern was formed was rinsed with pure water and was dried by spraying.

Further, after spray drying, the silicon wafer was heated (post-baked) using a hot plate at 200° C. for 300 seconds. This way, films according to Examples 1 to 3 and Comparative Examples 1 to 4 were formed.

Examples 4 to 8

A composition for forming a second spectrally selective layer shown in Table 5 (composition described in "Second Spectrally Selective Layer" of Table 5) was applied to a silicon wafer using a spin coating method such that the thickness of the formed film was 1.5 µm, and then was heated using a hot plate at 100° C. for 2 minutes. Next, the entire surface of the silicon wafer was exposed using an i-ray stepper exposure device FPA-3000 i5+(manufactured by Canon Corporation) at 1000 mJ/cm$^2$. The exposed silicon wafer was heated using a hot plate at 220° C. for 5 minutes to obtain a second spectrally selective layer. After forming a 5 µm dot pattern on the second spectrally selective layer using a dry etching method, a composition for forming a first spectrally selective layer (composition 10) shown in Table 5 was applied to the second spectrally selective layer using a spin coating method such that the thickness of the formed film was 1.5 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, the silicon wafer was exposed through a mask having a 5 µm dot pattern at 1000 mJ/cm$^2$ such that the dot pattern overlapped the dot pattern of the second spectrally selective layer. Next, paddle development was performed at 23° C. for 60 seconds using a tetramethylammonium hydroxide (TMAH) 0.3% aqueous solution. Next, the silicon wafer was rinsed by spin showering, was washed with pure water, and was heated using a hot plate at 220° C. for 5 minutes. As a result, films according to Examples 4 to 8 were formed.

Examples 9 and 10

A composition for forming a second spectrally selective layer shown in Table 5 (composition described in "Second Spectrally Selective Layer" of Table 5) was applied to a silicon wafer using a spin coating method such that the thickness of the formed film was 1.5 µm. Next, the silicon wafer was heated using a hot plate at 100° C. for 2 minutes. Next, the entire surface of the silicon wafer was exposed using an i-ray stepper exposure device FPA-3000 i5+ (manufactured by Canon Corporation) at 1000 mJ/cm$^2$. The exposed silicon wafer was heated using a hot plate at 220° C. for 5 minutes to obtain a second spectrally selective layer. After forming a 5 µm dot pattern on the second spectrally selective layer using a dry etching method, a composition for forming a first spectrally selective layer (composition 12) was applied to the second spectrally selective layer using a spin coating method such that the thickness of the formed film was 0.7 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, the obtained silicon wafer was exposed through a mask having a 5 µm dot pattern at 1000 mJ/cm$^2$ such that the dot pattern overlapped the dot pattern of the second spectrally selective layer. Next, paddle development was performed at 23° C. for 60 seconds using a tetramethylammonium hydroxide (TMAH) 0.3% aqueous solution. Next, the silicon wafer was rinsed by spin showering, was washed with pure water, and was heated using a hot plate at 220° C. for 5 minutes. As a result, the dot pattern of the cured film obtained from the composition 12 was laminated on the dot pattern of the second spectrally selective layer.

Next, a composition 13 was applied to the cured film of the composition 12 using a spin coating method such that the thickness of the formed film was 0.7 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, the heated silicon wafer was exposed through a mask having a 5 µm dot pattern at 1000 mJ/cm$^2$ such that the dot pattern was laminated on the dot pattern of the second spectrally selective layer. Next, paddle development was performed at 23° C. for 60 seconds using a tetramethylammonium hydroxide (TMAH) 0.3% aqueous solution. Next, the silicon wafer was rinsed by spin showering, was washed with pure water, and was heated using a hot plate at 220° C. for 5 minutes. As a result, films according to Examples 9 and 10 were formed.

[Spectral Characteristics]

Regarding each of the obtained films, spectral characteristics were evaluated by measuring a light transmittance in a wavelength range of 300 to 1300 nm using a ultraviolet-visible-near infrared spectrophotometer U-4100. In the table, a maximum light transmittance in a wavelength range of 450 to 650 nm (1000 to 1300 nm) is shown as "Maximum Value in Wavelength Range of 450 to 650 nm (1000 to 1300 nm)", and a light transmittance at a wavelength of 835 nm is shown as "Transmittance at Wavelength of 835 nm".

[Spectral Identification]

Each of the obtained films as an infrared absorbing filter was incorporated into a solid image pickup element using a well-known method. The obtained solid image pickup element was irradiated with light emitted from a near infrared LED light source having an emission wavelength of 940 nm in a low-illuminance environment (0.001 Lux) to acquire images. Next, the image performances (spectral identification) were compared to each other for evaluation. Evaluation standards are as described below.

<Evaluation Standards>

3: Satisfactory (an object was able to be clearly recognized on the image)

2: Less satisfactory (an object was able to be recognized on the image)

1: Unsatisfactory (an object was not able to be recognized on the image)

TABLE 5

|  | First Spectrally Selective Layer | Second Spectrally Selective Layer | Spectral Characteristics | | | |
|---|---|---|---|---|---|---|
|  |  |  | Maximum Value in Wavelength Range of 450 to 650 nm | Transmittance at Wavelength of 835 nm | Maximum Value in Wavelength Range of 1000 to 1300 nm | Spectral Identification |
| Example 1 | Composition 1 | | ≤20% | ≤20% | ≥70% | 3 |
| Example 2 | Composition 2 | | ≤20% | ≤20% | ≥70% | 3 |
| Example 3 | Composition 3 | | ≤20% | ≤20% | ≥70% | 3 |
| Example 4 | Composition 10 | Composition 4 | ≤20% | ≤20% | ≥70% | 3 |
| Example 5 | Composition 10 | Composition 6 | ≤20% | ≤20% | ≥70% | 3 |
| Example 6 | Composition 10 | Composition 7 | ≤20% | ≤20% | ≥70% | 3 |
| Example 7 | Composition 10 | Composition 8 | ≤20% | ≤20% | ≥70% | 3 |
| Example 8 | Composition 10 | Composition 9 | ≤20% | ≤20% | ≥70% | 3 |
| Example 9 | Composition 12 | Composition 13 | Composition 4 | ≤20% | ≤20% | ≥70% | 3 |
| Example 10 | Composition 12 | Composition 13 | Composition 6 | ≤20% | ≤20% | ≥70% | 3 |
| Comparative Example 1 | Composition 10 | | ≤20% | >20% | ≥70% | 1 |
| Comparative Example 2 | Composition 4 | | >20% | ≤20% | ≥70% | 1 |
| Comparative Example 3 | Composition 14 | | ≤20% | ≤20% | <70% | 1 |
| Comparative Example 4 | Composition 15 | | ≤20% | ≤20% | <70% | 1 |

In all the Examples, in a state where noise generated from visible light was small, the transmission of near infrared rays having an emission wavelength of 940 nm was allowed, and the spectral identification was satisfactory. On the other hand, in the Comparative Examples, noise generated from visible light was large, and the spectral identification was unsatisfactory.

In Examples 4 to 10, even in a case where the order of formation of the first spectrally selective layer and the second spectrally selective layer was reversed, a film having the same spectral characteristics as each of the films according to the Examples was able to be formed.

Example 11

A composition 4 was applied to a silicon wafer using a spin coating method such that the thickness of the formed film was 1.5 μm. Next, the silicon wafer was heated using a hot plate at 100° C. for 2 minutes. Next, the entire surface of the silicon wafer was exposed using an i-ray stepper exposure device FPA-3000 i5+ (manufactured by Canon Corporation) at 1000 mJ/cm². The exposed silicon wafer was heated using a hot plate at 220° C. for 5 minutes to obtain a cured film (second spectrally selective layer) of the composition 4. Next, a composition 10 was applied to the second spectrally selective layer using a spin coating method such that the thickness of the formed film was 1.5 μm. Next, the silicon wafer was heated using a hot plate at 100° C. for 2 minutes. Next, the entire surface of the silicon wafer was exposed using an i-ray stepper exposure device FPA-3000 i5+ (manufactured by Canon Corporation) at 1000 mJ/cm². The exposed silicon wafer was heated using a hot plate at 220° C. for 5 minutes to form a cured film (first spectrally selective layer) of the composition 10 on the second spectrally selective layer. Next, a 5 μm dot pattern was formed using a dry etching method, and a film was formed. This film had the same spectral characteristics as that of Example 4. In addition, in a case where the spectral identification was evaluated using this film, the same evaluation as that of Example 4 was obtained.

Test Example 2

Film Formation

Example 101

A composition for forming a second spectrally selective layer (composition 4) shown in Table 6 was applied to a silicon wafer using a spin coating method such that the thickness of the formed film was 1.5 μm. Next, the silicon wafer was heated using a hot plate at 60° C. for 10 minutes. Next, the entire surface of the silicon wafer was exposed using an i-ray stepper exposure device FPA-3000 i5+ (manufactured by Canon Corporation) at 3000 mJ/cm² to obtain a second spectrally selective layer. After forming a 5 μm dot pattern on the second spectrally selective layer using a dry etching method, a composition for forming a first spectrally selective layer (composition 10) shown in Table 6 was applied to the second spectrally selective layer using a spin coating method such that the thickness of the formed film was 1.5 μm. Next, the silicon wafer was heated using a hot plate at 100° C. for 2 minutes. Next, using an i-ray stepper exposure device FPA-3000 i5+ (manufactured by Canon Corporation) at 1000 mJ/cm², the silicon wafer was exposed through a mask having a 5 μm dot pattern at 3000 mJ/cm² such that the dot pattern was laminated on the dot pattern of the second spectrally selective layer. Next, paddle development was performed at 23° C. for 60 seconds using a tetramethylammonium hydroxide (TMAH) 0.3% aqueous solution. Next, the silicon wafer was rinsed by spin showering and was washed with pure water. As a result, a film according to Example 101 was formed.

Examples 102 to 105

Films were formed using the same method as in Example 101, except that the composition for each of the spectrally selective layers and the exposure dose for forming the pattern were changed as shown in Table 6.

Using the same method as in Test Example 1, the spectral characteristics and spectral identification of the obtained films were evaluated.

TABLE 6

| | First Spectrally Selective Layer | Second Spectrally Selective Layer | Exposure Dose during Pattern Formation | | Spectral Characteristics | | | |
|---|---|---|---|---|---|---|---|---|
| | | | First Spectrally Selective Layer | Second Spectrally Selective Layer | Maximum Value in Wavelength Range of 450 to 830 nm | Transmittance at Wavelength of 835 nm | Maximum Value in Wavelength Range of 1000 to 1300 nm | Spectral Identification |
| Example 101 | Composition 10 | Composition 4 | 3000 mJ/cm² | 3000 mJ/cm² | ≤20% | ≤20% | ≥70% | 3 |
| Example 102 | Composition 10 | Composition 5 | 3000 mJ/cm² | 3000 mJ/cm² | ≤20% | ≤20% | ≥70% | 3 |
| Example 103 | Composition 10 | Composition 5 | 3000 mJ/cm² | 1000 mJ/cm² | ≤20% | ≤20% | ≥70% | 3 |
| Example 104 | Composition 11 | Composition 4 | 1000 mJ/cm² | 3000 mJ/cm² | ≤20% | ≤20% | ≥70% | 3 |
| Example 105 | Composition 11 | Composition 5 | 1000 mJ/cm² | 1000 mJ/cm² | ≤20% | ≤20% | ≥70% | 3 |

It was found from the above results that, in all the Examples, in a state where noise generated from visible light was small, the transmission of near infrared rays having an emission wavelength of 940 nm was allowed, and the spectral identification was satisfactory. In particular, by using the oxime ester photopolymerization initiator containing a fluorine atom as the photopolymerization initiator, the composition was able to be cured even at a low exposure dose in the pattern forming step. Therefore, elution and the like of the visible light absorbing coloring material and the infrared absorber can be suppressed in the pattern forming step, and excellent spectral identification performance can be obtained.

EXPLANATION OF REFERENCES

1: lens optical system
10: solid image pickup element
20: signal processing unit
30: signal switching unit
40: control unit
50: signal storage unit
60: light emission control unit
70: infrared LED
80, 81: image output unit
100: infrared sensor
110: solid image pickup element
111: infrared absorbing filter
112: color filter
113: infrared transmitting filter
114: region
115: microlens
116: planarizing layer
hv: incidence light
201: first spectrally selective layer
201a: sublayer a of first spectrally selective layer
201b: sublayer b of first spectrally selective layer
202: second spectrally selective layer
d: thickness direction of film

What is claimed is:

1. A film comprising a first spectrally selective layer and a second spectrally selective layer,
wherein the first spectrally selective layer and the second spectrally selective layer are directly contacted with each other in the thickness direction of the film, and
wherein a maximum value of a light transmittance of the film in a thickness direction in a wavelength range of 450 to 650 nm is 20% or lower,
a light transmittance of the film in the thickness direction at a wavelength of 835 nm is 20% or lower, and
a minimum value of a light transmittance of the film in the thickness direction in a wavelength range of 1000 to 1300 nm is 70% or higher, and
wherein a maximum value of a light transmittance of the first spectrally selective layer in the thickness direction in a wavelength range of 450 to 650 nm is 20% or lower,
a minimum value of a light transmittance of the first spectrally selective layer in the thickness direction in a wavelength range of 1000 to 1300 nm is 70% or higher,
the second spectrally selective layer includes an infrared absorber having a maximal absorption in a wavelength range of 750 to 950 nm and a resin,
a light transmittance of the second spectrally selective layer in the thickness direction at a wavelength of 835 nm is 20% or lower, and
a minimum value of a light transmittance of the second spectrally selective layer in the thickness direction in a wavelength range of 1000 to 1300 nm is 70% or higher.

2. The film according to claim 1,
wherein the first spectrally selective layer includes a visible light absorbing coloring material.

3. The film according to claim 2,
wherein the visible light absorbing coloring material includes two or more chromatic colorants.

4. The film according to claim 2,
wherein the visible light absorbing coloring material includes a black colorant.

5. The film according to claim 1,
wherein the first spectrally selective layer includes two or more sublayers.

6. The film according to claim 5,
wherein each of the sublayers includes one or more chromatic colorants, and
the first spectrally selective layer includes two or more chromatic colorants as a whole.

7. The film according to claim 5,
wherein at least one of the sublayers includes a black colorant.

8. The film according to claim 1,
wherein the second spectrally selective layer includes a pyrrolopyrrole compound.

9. The film according to claim 8,
wherein the pyrrolopyrrole compound is represented by the following Formula (1),

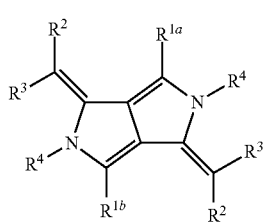

(1)

in Formula (1), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, $-BR^{4A}R^{4B}$, or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a hydrogen atom or a substituent.

10. The film according to claim 1, which is an infrared transmitting filter.

11. A film forming method for forming the film according to claim 1, comprising:
forming a first spectrally selective layer in which a maximum value of a light transmittance in the thickness direction in a wavelength range of 450 to 650 nm is 20% or lower and in which a minimum value of a light transmittance in the thickness direction in a wavelength range of 1000 to 1300 nm is 70% or higher; and
forming a second spectrally selective layer in which a light transmittance in the thickness direction at a wavelength of 835 nm is 20% or lower and in which a minimum value of a light transmittance in the thickness direction in a wavelength range of 1000 to 1300 nm is 70% or higher,
wherein the second spectrally selective layer includes an infrared absorber having a maximal absorption in a wavelength range of 750 to 950 nm.

12. The film forming method according to claim 11, further comprising a patterning,
wherein a patterning on the first spectrally selective layer and a patterning on the second spectrally selective layer are separately performed, or
a patterning on a laminate of the first spectrally selective layer and the second spectrally selective layer is performed.

13. The film forming method according to claim 12,
wherein the patterning is performed using at least one selected from the group consisting of a pattern forming method using photolithography and a pattern forming method using dry etching.

14. The film forming method according to claim 12,
wherein the patterning is performed at a temperature of 150° C. or lower.

15. A solid image pickup element comprising the film according to claim 1.

16. An infrared sensor comprising the film according to claim 1.

17. A solid image pickup element comprising
the film according to claim 1, and
a color filter.

18. A solid image pickup element comprising
the film according to claim 1,
a color filter, and
a microlens disposed on an incidence light side of the film.

19. A solid image pickup element comprising
the film according to claim 1,
a color filter,
a microlens disposed on an incidence light side of the film, and
a planarizing layer.

20. A solid image pickup element comprising
the film according to claim 1, and
a color filter disposed on an incidence light side of the film.

21. The film according to claim 1,
wherein the thickness of the first spectrally selective layer is 0.2 to 5 μm, and
the thickness of the second spectrally selective layer is 0.2 to 5 μm.

22. A kit for forming a film including a first spectrally selective layer and a second spectrally selective layer,
in which the first spectrally selective layer and the second spectrally selective layer are directly contacted with each other in the thickness direction of the film,
a maximum value of a light transmittance of the film in a thickness direction in a wavelength range of 450 to 650 nm is 20% or lower,
a light transmittance of the film in the thickness direction at a wavelength of 835 nm is 20% or lower,
a minimum value of a light transmittance of the film in the thickness direction in a wavelength range of 1000 to 1300 nm is 70% or higher,
a maximum value of a light transmittance of the first spectrally selective layer in the thickness direction in a wavelength range of 450 to 650 nm is 20% or lower,
a minimum value of a light transmittance of the first spectrally selective layer in the thickness direction in a wavelength range of 1000 to 1300 nm is 70% or higher,
the second spectrally selective layer includes an infrared absorber having a maximal absorption in a wavelength range of 750 to 950 nm and a resin,
a light transmittance of the second spectrally selective layer in the thickness direction at a wavelength of 835 nm is 20% or lower, and
a minimum value of a light transmittance of the second spectrally selective layer in the thickness direction in a wavelength range of 1000 to 1300 nm is 70% or higher,
the kit comprising:
a first composition for forming the first spectrally selective layer in which a ratio AB of a minimum value A of an absorbance in a wavelength range of 450 to 650 nm to a maximum value B of an absorbance in a wavelength range of 1000 to 1300 nm is 4.5 or higher; and
a second composition for forming the second spectrally selective layer that includes an infrared absorber having a maximal absorption in a wavelength range of 750 to 950 nm.

23. The kit according to claim 22,
wherein the first composition and the second composition include a polymerizable compound and a photopolymerization initiator.

24. A solid image pickup element comprising,
a color filter, and
a film including a first spectrally selective layer and a second spectrally selective layer wherein the first spectrally selective layer and the second spectrally selective layer are directly contacted with each other in the thickness direction of the film,
wherein a maximum value of a light transmittance of the film in a thickness direction in a wavelength range of 450 to 650 nm is 20% or lower,
a light transmittance of the film in the thickness direction at a wavelength of 835 nm is 20% or lower, and
a minimum value of a light transmittance of the film in the thickness direction in a wavelength range of 1000 to 1300 nm is 70% or higher,
wherein a maximum value of a light transmittance of the first spectrally selective layer in the thickness direction in a wavelength range of 450 to 650 nm is 20% or lower,
a minimum value of a light transmittance of the first spectrally selective layer in the thickness direction in a wavelength range of 1000 to 1300 nm is 70% or higher,
the second spectrally selective layer includes an infrared absorber having a maximal absorption in a wavelength range of 750 to 950 nm and a resin,
a light transmittance of the second spectrally selective layer in the thickness direction at a wavelength of 835 nm is 20% or lower, and
a minimum value of a light transmittance of the second spectrally selective layer in the thickness direction in a wavelength range of 1000 to 1300 nm is 70% or higher.

25. The solid image pickup element according to claim 24, further comprising a microlens disposed on an incidence light side of the film.

26. The solid image pickup element according to claim 24, further comprising,
a microlens disposed on an incidence light side of the film, and
a planarizing layer.

27. The solid image pickup element according to claim 24,
wherein the color filter is disposed on an incidence light side of the film.

* * * * *